(12) United States Patent
Yumoto et al.

(10) Patent No.: US 10,566,144 B2
(45) Date of Patent: Feb. 18, 2020

(54) SOLAR CELL, MANUFACTURING METHOD THEREFOR, SEMICONDUCTOR DEVICE, AND MANUFACTURING METHOD THEREFOR

(71) Applicants: ASAHI KASEI KABUSHIKI KAISHA, Tokyo (JP); TOHOKU UNIVERSITY, Miyagi (JP)

(72) Inventors: Toru Yumoto, Tokyo (JP); Toshiyuki Hirano, Tokyo (JP); Takahiro Sawamura, Tokyo (JP); Akira Watanabe, Miyagi (JP)

(73) Assignees: Asahi Kasei Kabushiki Kaisha, Tokyo (JP); Tohoku University, Miyagi (JP)

( * ) Notice: Subject to any disclaimer, the term of this patent is extended or adjusted under 35 U.S.C. 154(b) by 0 days.

(21) Appl. No.: 16/121,269

(22) Filed: Sep. 4, 2018

(65) Prior Publication Data

US 2018/0374652 A1 Dec. 27, 2018

Related U.S. Application Data

(62) Division of application No. 15/022,317, filed as application No. PCT/JP2014/004787 on Sep. 17, 2014, now Pat. No. 10,109,429.

(30) Foreign Application Priority Data

Oct. 4, 2013 (JP) .................................. 2013-209183
Jan. 22, 2014 (JP) .................................. 2014-009304

(Continued)

(51) Int. Cl.
*H01G 9/20* (2006.01)
*H01L 51/42* (2006.01)
(Continued)

(52) U.S. Cl.
CPC ......... *H01G 9/2031* (2013.01); *H01G 9/0029* (2013.01); *H01G 9/204* (2013.01);
(Continued)

(58) Field of Classification Search
CPC ...... H01G 9/20; H01G 9/2018; H01G 9/2031; H01G 9/2036; H01G 9/204; H01G 9/2045;
(Continued)

(56) References Cited

U.S. PATENT DOCUMENTS 5,288,338 A 2/1994 Morikawa
8,957,305 B2 2/2015 Maruyama
(Continued)

FOREIGN PATENT DOCUMENTS

CN 102742070 A 10/2012
EP 2 876 668 A1 5/2015
(Continued)

OTHER PUBLICATIONS

Otsubo et al. (JP2012216832(A), English machine translation (Year: 2012).*

(Continued)

*Primary Examiner* — Susan D Leong
(74) *Attorney, Agent, or Firm* — Morgan, Lewis & Bockius LLP

(57) ABSTRACT

Provided are a solar cell that can be manufactured by non-vacuum process and can have more excellent photoelectric conversion efficiency and a manufacturing method therefor as well as such a semiconductor device and a manufacturing method therefor. A solar cell, includes at least a first semiconductor layer and a second semiconductor layer. The first semiconductor layer includes metal oxide particles of 1 nm or more and 500 nm or less in average particle size and a compound having relative permittivity of 2 or more and 1,000 or less. For instance, the content of the organic compound in the first semiconductor layer is 10 mass % or more and 90 mass % or less.

20 Claims, 16 Drawing Sheets

(30) Foreign Application Priority Data

Jan. 22, 2014 (JP) .................................. 2014-009314
Jun. 9, 2014 (JP) .................................. 2014-118563

(51) Int. Cl.
*H01L 31/18* (2006.01)
*H01G 9/00* (2006.01)

(52) U.S. Cl.
CPC ....... *H01G 9/2045* (2013.01); *H01L 51/4226* (2013.01); *H01L 51/4233* (2013.01); *Y02E 10/542* (2013.01); *Y02E 10/549* (2013.01); *Y02P 70/521* (2015.11)

(58) Field of Classification Search
CPC ............. H01L 51/4226; H01L 51/4233; H01L 51/422; H01L 51/5048; H01L 51/5072
See application file for complete search history.

(56) References Cited

U.S. PATENT DOCUMENTS

| | | | |
|---|---|---|---|
| 8,962,982 | B2 | 2/2015 | Sekiguchi et al. |
| 2002/0066478 | A1* | 6/2002 | Hayashi .............. H01L 31/0236 136/244 |
| 2002/0139975 | A1 | 10/2002 | Lewis et al. |
| 2002/0157702 | A1 | 10/2002 | Cordaro |
| 2007/0011863 | A1 | 1/2007 | Yoshikawa |
| 2008/0092946 | A1* | 4/2008 | Munteanu .............. H01L 31/032 136/252 |
| 2011/0030792 | A1 | 2/2011 | Miguez et al. |
| 2011/0101352 | A1 | 5/2011 | Hosono et al. |
| 2011/0180784 | A1* | 7/2011 | Shukla ................ H01L 51/0053 257/40 |
| 2012/0019125 | A1 | 1/2012 | Shirata |
| 2012/0090678 | A1 | 4/2012 | Sekiguchi et al. |
| 2012/0125414 | A1 | 5/2012 | Kamezaki et al. |
| 2012/0298176 | A1 | 11/2012 | Miura et al. |
| 2013/0038267 | A1 | 2/2013 | Jiang et al. |
| 2013/0061923 | A1* | 3/2013 | Muroyama .......... H01G 9/2031 136/258 |
| 2013/0206235 | A1 | 8/2013 | Maruyama |
| 2015/0034159 | A1 | 2/2015 | Avasthi et al. |
| 2015/0200312 | A1 | 7/2015 | Watanabe et al. |

FOREIGN PATENT DOCUMENTS

| | | |
|---|---|---|
| JP | 4-226084 A | 8/1992 |
| JP | 11-335121 A | 12/1999 |
| JP | 2001-185743 A | 7/2001 |
| JP | 2002-075473 A | 3/2002 |
| JP | 2002-100759 A | 4/2002 |
| JP | 2003-272722 A | 9/2003 |
| JP | 2004-103518 A | 4/2004 |
| JP | 2005-302509 A | 10/2005 |
| JP | 2005-353289 A | 12/2005 |
| JP | 2007-103828 A | 4/2007 |
| JP | 2007-214542 A | 8/2007 |
| JP | 2009-206313 A | 9/2009 |
| JP | 2011-086770 A | 4/2011 |
| JP | 2011517839 A | 6/2011 |
| JP | 2012-129203 A | 7/2012 |
| JP | 2012-182370 A | 9/2012 |
| JP | 2012-216832 A | 11/2012 |
| JP | 2012-243695 A | 12/2012 |
| JP | 2012-248635 A | 12/2012 |
| JP | 2013-054883 A | 3/2013 |
| JP | 2013-191273 A | 9/2013 |
| WO | 2005/088726 A1 | 9/2005 |
| WO | 2009-157175 A | 12/2009 |
| WO | 2010-098463 A1 | 9/2010 |
| WO | 2012-057325 A1 | 5/2012 |
| WO | 2012/060280 A1 | 5/2012 |
| WO | 2013/138635 A1 | 9/2013 |
| WO | 2014/014057 A1 | 1/2014 |

OTHER PUBLICATIONS

International Preliminary Report on Patentability dated Apr. 14, 2016, for International Patent Application No. PCT/JP2014/004787.
Avasthi et al., Hole-blocking titanium-oxide/silicon heterojunction and its application to photovoltaics, Applied Physics Letters, 102, 203901 (2013).
International Search Report dated Dec. 2, 2014, for corresponding International application No. PCT/JP2014/004787.
Notice of Reasons for Cancellation dated Oct. 24, 2018 for Japanese Patent No. 6183760 with partial English translation.
Notification of Sending of Argument dated Oct. 24, 2018 for Japanese Patent No. 6183760 with partial English translation.
Three Bond Technical News 65 Sealing Agent for Dye-Sensitized Solar Cell, Three Bond Co., Ltd., issued Jul. 1, 2005 with partial English translation.
Notice of Reasons for Cancellation dated May 7, 2018 for the Japanese Patent No. 6183760 and English translation.
Notification of Sending of Patent Opposition dated Mar. 30, 2018 with English translation.
Notice of Opposition filed on Feb. 22, 2018 against JP Patent No. 6183760 corresponding to U.S. Appl. No. 15/022,317 with partial English translation.
Plaintiff's Exhibit No. 2: Edited by Teruzou Asahara "Solvent Handbook" Kodansha Scientific Ltd. (Issued Jan. 20, 1996) the cover, pp. 642, 648 to 649 and the colophon with partial English translation.
Plaintiff's Exhibit No. 3: "wikipedia relative permittivity, dielectri constant" (Output date: Feb. 5, 2018) with partial English translation.
Plaintiff's Exhibit No. 4: Pages 72 to 73 of "Conductivity of various liquids" (Guiding principles for Electrostatis Society (1988) Ministry of Labor, Industrial Safety Institute) (Output date: Feb. 5, 2018) with partial English translation.
Plaintiff's Exhibit No. 5: Pages 47 to 55 of "Regarding non-sized titanium oxide" Japan Titanium Dioxide Industry Association (Nov. 27, 2008) (Output date: Feb. 5, 2018) with partial English translation.
Plaintiff's Exhibit No. 6: Pages 47 to 53 of Journal of the Ceramic Society of Japan 107[1]47-53 (1999) with partial English translation.
Supplementary European Search Report dated Sep. 13, 2016, for the corresponding European Patent Application No. 14850188.5.

\* cited by examiner

} TITANIUM OXIDE PARTICLES + DIELECTRIC LAYER

} TITANIUM OXIDE PARTICLES + DIELECTRIC LAYER (a)

(b)

COMP. EX.8 (TITANIUM OXIDE ONLY)

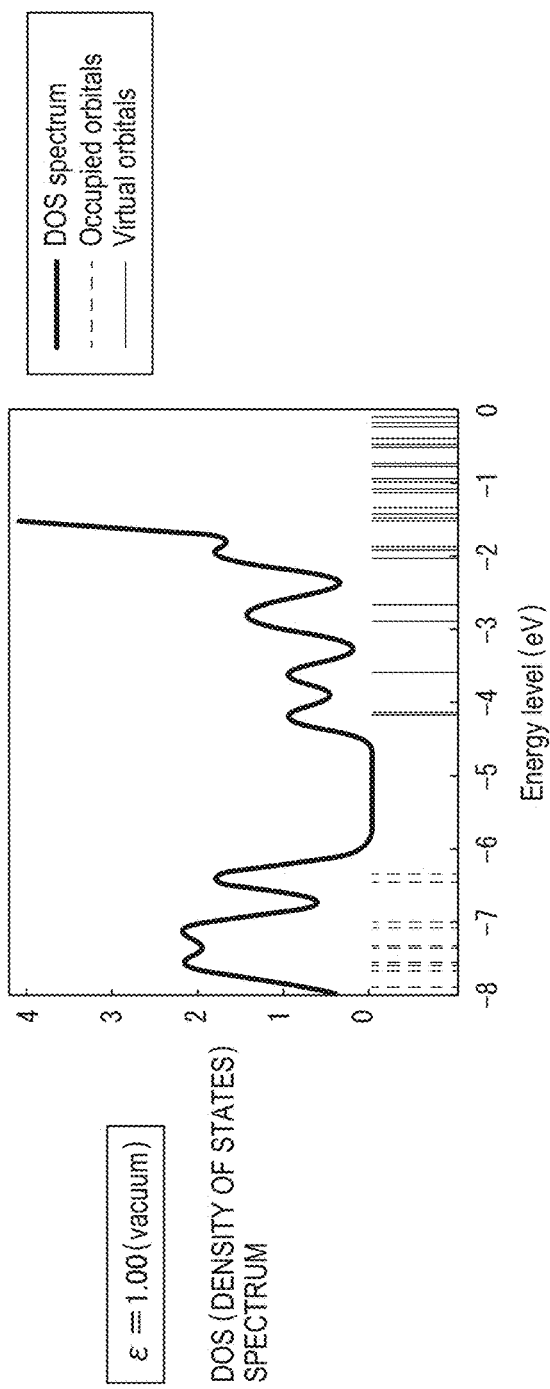
F I G. 23A
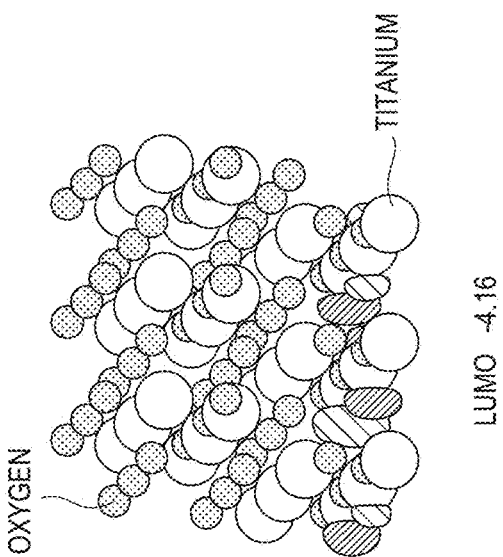
F I G. 23C
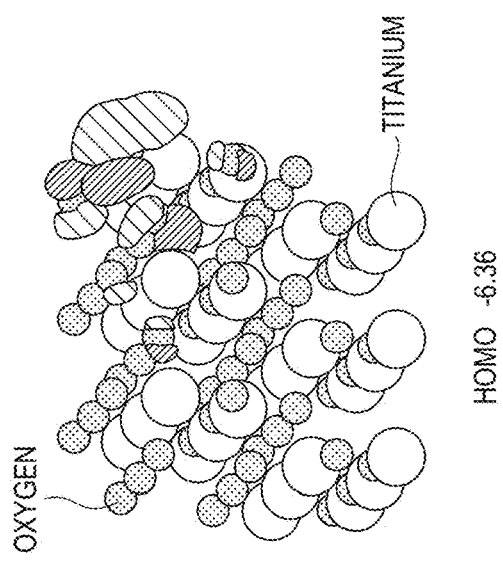
F I G. 23B

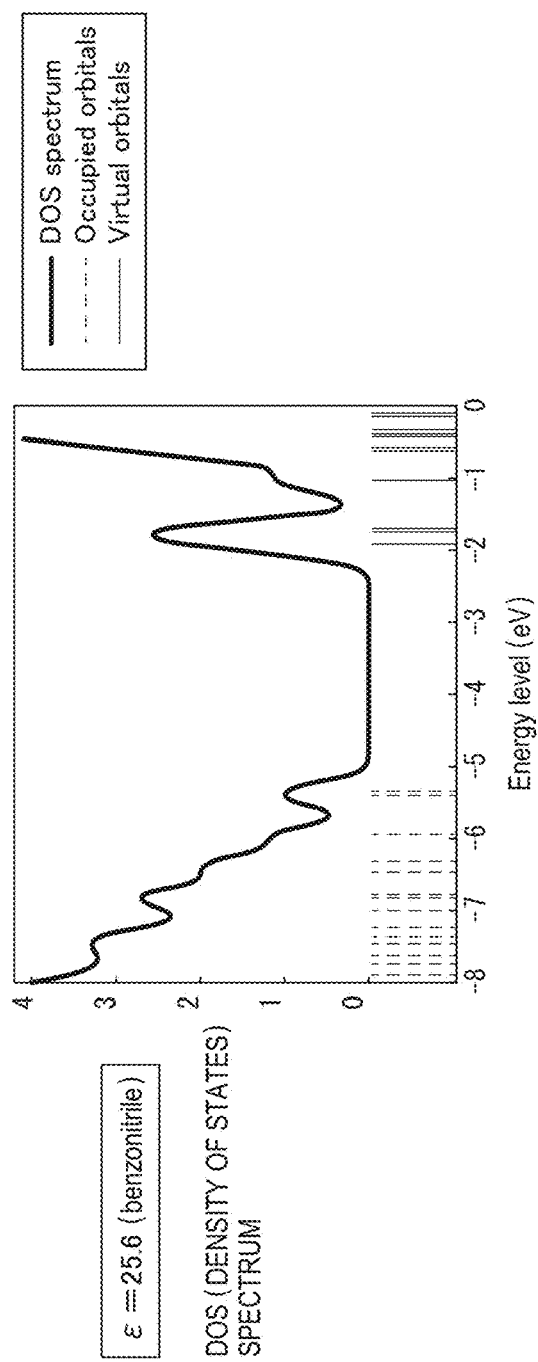
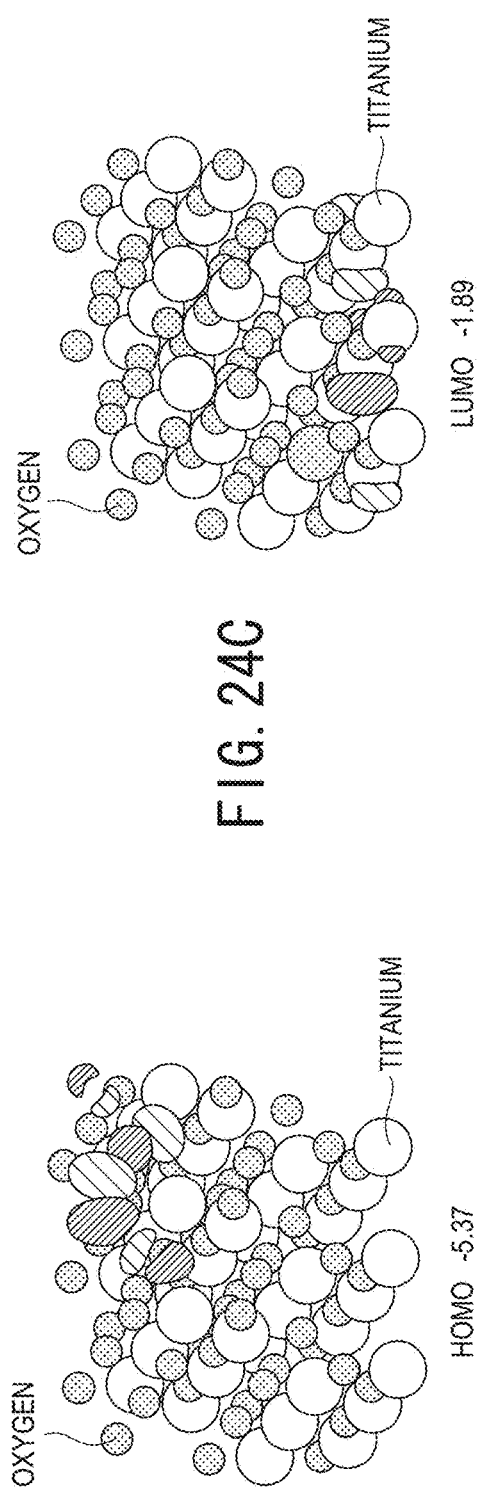
FIG. 24A
FIG. 24B
FIG. 24C

|  | Si | Si+DIELECTRIC |
|---|---|---|
| Si DEFECT AMOUNT | 1 | 0.86 |

| | TiO$_2$ | TiO$_2$+DIELECTRIC |
|---|---|---|
| Ti$^{3+}$/a.u. | 1 | 0.35 |
| O·/a.u. | 1 | 0.34 |

1) SILICON / TITANIUM OXIDE

2) SILICON / TITANIUM OXIDE + DIELECTRIC

SOLAR CELL, MANUFACTURING METHOD THEREFOR, SEMICONDUCTOR DEVICE, AND MANUFACTURING METHOD THEREFOR

This application is a divisional of U.S. application Ser. No. 15/022,317, filed Mar. 16, 2016, which claims priority of Japanese PCT Application No. PCT/JP2014/004787, filed on Sep. 17, 2014, which claims priority of Japanese Patent Application No. 2014-118563, filed on Jun. 9, 2014, Japanese Patent Application No. 2014-009314, filed on Jan. 22, 2014, Japanese Patent Application No. 2014-009304, filed on Jan. 22, 2014 and Japanese Patent Application No. 2013-209183, filed on Oct. 4, 2013, the disclosure of which is hereby incorporated by reference herein in its entirety.

TECHNICAL FIELD

The present invention relates to solar cells, a manufacturing method therefor, semiconductor devices, and a manufacturing method therefor.

BACKGROUND ART

Along with recent development of thin and light display devices, such as an organic electroluminescence (organic EL) device, development for a material as a semiconductor device having higher mobility of carriers (hereinafter referred to as mobility) has been demanded. Metal oxides having high mobility, such as indium, gallium, and zinc oxides, have been developed (Patent Literature 1).

Current semiconductor devices are typically made of silicon, and the process therefor requires expensive vacuum apparatuses and high-temperature process. Such semiconductor devices currently are manufactured through photolithography including a plurality of manufacturing steps, and so the manufacturing cost is high unfortunately. Then, study on another process of non-vacuum system, such as coating, also has been conducted actively to form a layer of inorganic semiconductor particles having high mobility. Study on still another process at lower temperatures also has been conducted actively to achieve the process temperature, at which a general-purpose resin substrate can be processed.

In the field of solar cells, a hetero-junction solar cell including a layer made of metal oxide on a silicon substrate is known as an existing technique. As a method for manufacturing solar cells, vacuum process, such as plasma CVD, sputter, or sputtering is used. For instance, Patent Literature 2 discloses a solar cell including a metal oxide film containing indium formed by sputtering as a semiconductor layer. On the contrary, study on non-vacuum process also has been conducted actively. Since coating as non-vacuum process to form a layer made of metal oxide particles on a silicon substrate has excellent workability and can reduce cost easily, such a method is developed actively.

Study on process at lower temperatures has been conducted actively in the field of solar cells as well to achieve the process temperature, at which a general-purpose resin substrate can be processed.

CITATION LIST

Patent Literature

PTL 1: WO 2005/088726
PTL 2: JP 2011-86770 A

SUMMARY OF INVENTION

Technical Problem

In the case of inorganic semiconductor, a thin film thereof has to be formed at a high temperature of about 300° C. or higher. Such a film of inorganic semiconductor therefore has to be formed on a substrate, such as a glass substrate or a silicon crystal wafer, and it is very difficult to apply the process to a resin substrate having desired impact resistance and flexibility. In the case of a solar cell as described in Patent Literature 2, the manufacturing cost is high unfortunately because the process includes sputtering as vacuum process. On the contrary, although non-vacuum process such as coating is a relatively low-cost method, a solar cell produced by such non-vacuum process still does not have sufficient photoelectric conversion efficiency.

Then the present invention aims to provide a solar cell that can be manufactured by non-vacuum process and can have more excellent photoelectric conversion efficiency, and a manufacturing method therefor. The present invention aims to provide a semiconductor device that can be manufactured by non-vacuum process and can have higher mobility, and a manufacturing method therefor.

Solution to Problem

As a result of a keen study to solve the above problems, the present inventors accomplished the present invention.

A solar cell according to one aspect of the present invention includes at least a first semiconductor layer and a second semiconductor layer, wherein the first semiconductor layer includes metal oxide particles of 1 nm or more and 500 nm or less in average particle size and a compound having relative permittivity of 2 or more.

A solar cell according to another aspect of the present invention includes at least a first semiconductor layer and a second semiconductor layer, wherein the first semiconductor layer includes metal oxide particles of 1 nm or more and 500 nm or less in average particle size and an organic compound having relative permittivity of 2 or more and 1,000 or less, and content of the organic compound in the first semiconductor layer is 10 mass % or more and 90 mass % or less.

A solar cell according to still another aspect of the present invention includes at least a first semiconductor layer and a second semiconductor layer, wherein the first semiconductor layer includes metal oxide particles of 1 nm or more and 500 nm or less in average particle size and an organic compound having relative permittivity of 10 or more and 200 or less, and content of the organic compound in the first semiconductor layer is 20 mass % or more and 70 mass % or less.

A solar cell according to a further aspect of the present invention includes: a first semiconductor layer including anatase-type or rutile-type titanium oxide particles; a second semiconductor layer including silicon; and a junction interface layer that is located between the first semiconductor layer and the second semiconductor layer, wherein the junction interface layer includes a compound having relative permittivity of 2 or more, and a half width is 0.2 degrees or more and 5.0 degrees or less, the half width being obtained from a diffraction peak that appears at a diffraction angle 2θ of 24 degrees or more and 26 degrees or less when the titanium oxide particles are anatase-type and from a diffraction peak that appears at a diffraction angle 2θ of 26 degrees or more and 28 degrees or less when the titanium oxide particles are rutile-type.

A semiconductor device according to one aspect of the present invention includes at least one layer of a semiconductor layer including inorganic particles and an organic compound having relative permittivity of 3 or more and 150 or less, wherein the inorganic particles include metal oxide particles or silicon particles, content of the inorganic particles in the semiconductor layer is 10 mass % or more and 90 mass % or less, and the semiconductor layer has carrier mobility of 0.0001 cm2/Vs or more.

A method for manufacturing a solar cell according to one aspect of the present invention includes: preparing application liquid including inorganic particles, a compound having relative permittivity of 2 or more, and one type or more of dispersant, wherein the inorganic particles include metal oxide particles or silicon particles, content of the inorganic particles in the application liquid is 0.1 mass % or more and 49.9 mass % or less, content of the compound having relative permittivity of 2 or more in the application liquid is 0.1 mass % or more and 49.9 mass % or less, and content of the dispersant in the application liquid is 0.2 mass % or more and 99.8 mass % or less; applying the prepared application liquid on a semiconductor layer or a substrate having an electrode; and drying the applied application liquid and removing at least a part of the dispersant from the application liquid, wherein the application liquid is dried at a temperature of 20° C. or more and 150° or less.

A method for manufacturing a semiconductor device according to one aspect of the present invention includes: preparing application liquid including inorganic particles, a compound having relative permittivity of 2 or more, and one type or more of dispersant, wherein the inorganic particles include metal oxide particles or silicon particles, content of the inorganic particles in the application liquid is 0.1 mass % or more and 49.9 mass % or less, content of the compound having relative permittivity of 2 or more in the application liquid is 0.1 mass % or more and 49.9 mass % or less, and content of the dispersant in the application liquid is 0.2 mass % or more and 99.8 mass % or less; applying the prepared application liquid on a semiconductor layer or a substrate having an electrode; and drying the applied application liquid and removing at least a part of the dispersant from the application liquid, wherein the application liquid is dried at a temperature of 20° C. or more and 150° or less.

Advantageous Effects of Invention

According to the present invention, a solar cell that can be manufactured by non-vacuum process and can have more excellent photoelectric conversion efficiency and a manufacturing method therefor can be provided.

According to the present invention, a semiconductor device that can be manufactured by non-vacuum process and can have higher mobility and a manufacturing method therefor can be provided.

BRIEF DESCRIPTION OF DRAWINGS

FIGS. 23A to 23C illustrate the result of simulation on density of states when dielectric having relative permittivity of 1 is present around titanium oxide.

FIGS. 24A to 24C illustrate the result of simulation on density of states when dielectric having relative permittivity of 25.6 is present around titanium oxide.

DESCRIPTION OF EMBODIMENTS

Figure 1:
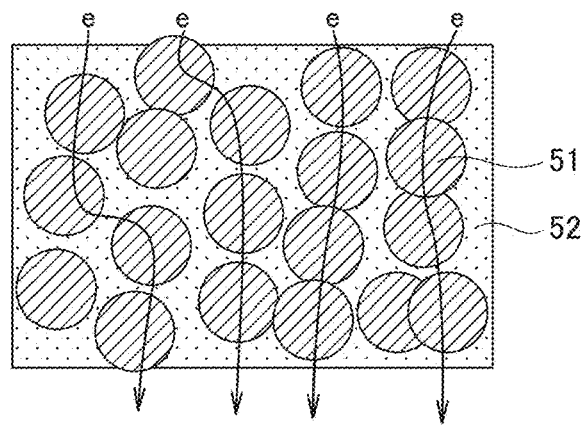
FIG. 1 schematically illustrates a semiconductor layer including metal oxide particles and a compound having relative permittivity of 2 or more.

The following describes preferable embodiments of the present invention in details.

First Embodiment

A solar cell according to a first embodiment of the present invention includes at least a first semiconductor layer and a second semiconductor layer. The first semiconductor layer is a layer including metal oxide particles of 1 nm or more and 500 nm or less (hereinafter 1 to 500 nm) in average particle size, and a compound having relative permittivity of 2 or more.

Firstly, the following describes materials and physical properties of the metal oxide particles, the compound having relative permittivity of 2 or more, the semiconductor layer and the junction interface layer. Next the structure of the solar cell is described. [Metal oxide particles]

Examples of oxides used for metal oxide particles include metal oxides, such as copper oxide (I), copper oxide (II), iron oxide, zinc oxide, silver oxide, titanium oxide (rutile, anatase), zinc oxide doped with aluminum (AZO), zinc oxide doped with gallium (GZO), indium tin oxide (ITO), tin oxide, tin oxide doped with fluorine (FTO), indium oxide, indium.gallium.zinc oxide, nickel oxide, $CuAlO_2$, $CuGaO_2$, $SrCu_2O_2$, LaCuOS, LaCuOSe, $CuInO_2$, $ZnRh_2O_4$, 12CaO. $7Al_2O_3$(C12A7), and $Ga_2O_3$. Oxides are preferably titanium oxide (rutile, anatase), zinc oxide, zinc oxide doped with aluminum (AZO) or zinc oxide doped with gallium (GZO) in terms of the transparency of oxides, carrier mobility and lower cost. Two types or more of these oxides may be used in combination as metal oxide particles.

As titanium oxide particles, one type or two types or more of particles made of titanium dioxide, titanium monoxide and titanium trioxide may be combined for use. Among them, titanium oxide particles are preferably made of titanium dioxide mainly. Titanium dioxide is sensitive to light, and so enables electrons to be excited more easily and reliably. A titanium oxide layer mainly including titanium dioxide particles as titanium oxide particles therefore can generate electrons more reliably (hereinafter "titanium oxide" means titanium dioxide).

Examples of types of titanium oxide particles that can be used include ST-01, ST-21, ST-31, ST-41, ST-30L, STS-01, STS-02, STS-21, STS-100, ST-K211, ST-K101, ST-K102a, ST-K102b, ST-K300, ST-K211, ST-K102, PT-301, PT-401M, PT-401L, CR-EL, PT-501R, PT501A, MC-50, MC-90, MC-150, FTL-100, FTL-110, FTL-200, FTL-300, R-820, R-830, R-930, R-980, CR-Super70, CR-80, CR-90, CR-90-2, CR-93, CR-95, CR-97, UT771, R-630, CR-50, CR-50-2, CR-57, CR-953, R-630, CR-58, R-780, CR-58-2, R-780-2, PF-736, CR-63, PF-742, CR-60-2, R-550, PF-690, PF-691, PF-737, PF-711, R-680, PF-739, PC-3, W-10, A-220, TTO-51(A), TTO-51(C), TTO-55(A), TTO-55(B), TTO-55(C), TTO-55(D), TTO-S-1, TTO-S-2, TTO-S-3, TTO-S-4, MPT-136, TTO-V-3, TTO-V-4, TTO-F-2, TTO-F-6 and TTO-W-5 (these are produced by Ishihara Sangyo Kaisha, Ltd.), P25, PF2, P90, T805 and NKT90 (these are produced by Nippon Aerosil Co., Ltd) and JR-301, JR-403, JR-405, JR-600A, JR-605, JR-600E, JR-603, JR-701, JRNC, JR-800, JR-805, JR-806, JR, JA-1, JA-3, JA-C, MT-01, MT-10EX, MT-05, MT-100TV, MT-100Z, MT-150A, MT-150EX, MT-150 W, MT-100AQ, MT-100WP, MT-100SA, MT-100HD, MT-500B, MT-500SA, MT-600B, MT-700B, MTY-02, MTY-110M3S, MT-500SAS, MTY-700BS, MT-300HD, MT-500HD, MT-600SA, MT-700HD, JMT-150IB, JMT-150AO, JMT-150FI, JMT-150ANO, AMT-100, AMT-400, AMT-600, TITANIX JA-1, TKP-101, TKP-102, TKS-201, TKS-202, TKS-203, TKD-701, TKD-702, TKD-801, TKD-802, TKC-303, TKC-304, TKC-305 and JR-1000 (these are produced by Tayca Corporation).

Titanium oxide particles are typically manufactured by a chlorine method or a sulfite method. In the chlorine method, a raw material (ilmenite ore) is allowed to react with coke.chlorine to be gaseous titanium tetrachloride once. The gaseous titanium tetrachloride is then cooled to be in a liquid form, which is then allowed to react with oxygen at high temperatures so as to separate chlorine gas therefrom, whereby titanium oxide particles are obtained. In the sulfite method, a raw material (ilmenite ore) is dissolved in concentrated sulfuric acid to separate iron as impurities therefrom as sulfate iron ($FeSO_4$) to be titanium oxysulfate ($TiOSO_4$) once. This is hydrolyzed to be precipitated as titanium oxyhydroxide ($TiO(OH)_2$). This precipitation is washed and dried, and baked, whereby titanium oxide particles can be obtained.

Titanium oxides have a crystal form that is an anatase-type, a rutile type or a brookite type. Titanium oxide has different lattice constants, strength and plane indexes based on their crystal forms, including an anatase-type, a rutile type and a brookite type, and so the crystal form can be identified by X-ray diffraction.

Titanium oxide particles that are a first embodiment and a second embodiment described later of the present invention are preferably of an anatase type, which preferably include anatase-type titanium oxide particles.

Titanium oxide may include the mixture of two types or more of different crystal forms, and 30 mass % or more of anatase-type titanium oxide particles are included preferably in terms of a photoconductive property to be developed, and 60 mass % or more is more preferable, 80 mass % or more is still more preferable, 90 mass % or more is very preferable, and 100 mass % is the most preferable.

In an X-ray diffraction spectrum of titanium oxide particles, the half width of a major peak is a scale to represent the crystallinity of the titanium oxides. In the case of X-ray diffraction measurement, when titanium oxide particles are anatase-type titanium oxide particles, a diffraction peak of (101) face that is a major peak of anatase appears at the diffraction angle 2θ of 24 to 26 degrees. When titanium oxide particles are rutile-type titanium oxide particles, a diffraction peak of (110) face that is a major peak of rutile appears at the diffraction angle 2θ of 26 to 28 degrees. The half width can be measured based on a major peak. The half width obtained through X-ray diffraction indicating crystallinity of titanium oxides is preferably 5.0 degrees or less, more preferably 3.0 degrees or less and still more preferably 2.0 degrees or less in terms of carrier transport in the titanium oxide particles. When the crystallinity of titanium oxide particles is too high, the film production property will be degraded, and therefore the half width is preferably 0.2 degrees or more, more preferably 0.3 degrees or more, and still more preferably 0.4 degrees or more.

Examples of types of zinc oxide particles that can be used include FZO-50 (produced by Ishihara Sangyo Kaisha, Ltd.), MZ-300, MZY-303S, MZ-306X, MZ-500, MZY-505S, MZY-510M3S, MZ-506X, MZ-510HPSX (these are produced by Tayca Corporation), and zinc oxide dispersion liquid (product No.: 721077, 721093, 721107, 721085, 633844, these are produced by Aldrich Corporation).

Alternatively metal oxides may be prepared by sputter, followed by pulverization for use. A method for pulverization may be dry pulverization, wet pulverization or both of them. For the dry pulverization, a hammer crusher or the like can be used. For the wet pulverization, a ball mill, a planetary ball mill, a bead mill, a homogenizer or the like can be used. Solvent for the wet pulverization may be those described later, similarly to a manufacturing method of silicon particles described later.

A method for manufacturing metal oxide particles is not limited especially, which may be manufactured by a sol-gel method, for example.

The surface of metal oxide particles may be modified with an organic functional group. Such modification with an organic functional group can improve dispersibility into organic solvent, and so a uniform film can be formed. As a method for the modification with an organic functional group, cyanoethylation may be used, for example.

The average particle size of metal oxide particles may be measured using a transmission electron microscope or a scanning electron microscope.

The average particle size of metal oxide particles may be 1 nm or more and 500 nm or less. The average particle size of metal oxide particles is preferably 3 nm or more and more preferably 5 nm or more in terms of a decrease in contact resistance between particles and diffusion length. In terms of a similar aspect, the average particle size is preferably 100 nm or less, more preferably 80 nm or less, and still more preferably 50 nm or less.

Metal oxide particles used in the first embodiment of the present invention and the second embodiment described later preferably have relative standard deviation σ of the particle size distribution that is 0.1 nm or more and 5.0 nm or less. Herein, in terms of lower resistance, this relative standard deviation σ is more preferably 3.0 nm or less and 2.0 nm or less still more preferably.

[Compound Having Relative Permittivity of 2 or More]

Relative permittivity is a value measured by an impedance method while setting the measurement frequency at 1 kHz and the measurement temperature at 23° C. A preferable range of the relative permittivity is 2 or more in terms of improvement in photoelectric conversion efficiency of a solar cell or improvement in carrier mobility of a semiconductor device, 3 or more is preferable, 5 or more is preferable, 10 or more is more preferable and 15 or more is still more preferable. In terms of a similar aspect, the relative permittivity is 5,000 or less preferably, and 1,500 or less is more preferable, 200 or less is preferable, and 100 or less is still more preferable.

Note here that the photoelectric conversion efficiency η can be found by the following expressions [1] and [2], $$\eta = (\text{output from solar cell})/100 \times 100 \quad [1],$$

where output from solar cell=short-circuit current density×open-circuit voltage×$FF$=$V$ max·$I$ max [2]

(I max denotes current when the output from a solar cell is the maximum. V max denotes voltage when the output from a solar cell is the maximum).

Compounds having relative permittivity of 2 or more are roughly classified into organic compounds and inorganic compounds.

Examples of the organic compounds include, as typical resins, polyvinylidene chloride, acrylic resin, acetylcellulose, aniline resin, ABS resin, ebonite, vinyl chloride resin, acrylonitrile resin, aniline formaldehyde resin, aminoalkyl resin, urethane, AS resin, epoxy resin, vinyl butyral resin, silicon resin, vinyl acetate resin, styrene-butadiene rubber, silicone rubber, acetylcellulose, styrene resin, dextrin, nylon, soft vinyl butyral resin, fluorine-based resin, furfural resin, polyamide, polyester resin, polycarbonate resin, phenol resin, fran resin, polyacetal resin, melamine resin, urea resin, polysulfide polymer, and polyethylene. Other examples include acetone, methyl alcohol, isobutyl alcohol, ethyl alcohol, aniline, isobutyl methyl ketone, ethylene glycol, propylene glycol, polyethyleneglycol, polypropyleneglycol, glycerin, cresolglycol, diallylphthalate, dextrin, pyranol, phenol, bakelite varnish, formalin, thioglycerol, chloropyren, succinic acid, succinonitrile, cellulose nitrate, ethylcellulose, hydroxyethyl cellulose, starch, hydroxypropyl starch, pullulan, glycidol pullulan, polyvinyl alcohol, sucrose, sorbitol, and cyano group-containing organic compounds.

The cyano group-containing organic compound is a compound in which one or more cyano groups are contained. More preferably, the cyano group-containing organic compound is a cyanoethyl group-containing organic compound. Specific examples of the cyano group-containing organic compound include cyanoethyl pullulan, cyanoethyl polyvinyl alcohol, cyanoethyl saccharose (cyanoethyl sucrose), cyanoethyl cellulose, cyanoethyl hydroxyethyl cellulose, cyanoethyl starch, cyanoethyl hydroxypropyl starch, cyanoethyl glycidol pullulan, and cyanoethyl sorbitol.

Specific examples of the fluorine-based resin include polyvinyl fluoride, polyvinylidene fluoride, and polytetrafluoroethylene that are a polymer having a C2F4-nHn skelton (n is 0 to 3). These may be copolymered, or these may be copolymered with another resin containing the fluorine-based resin as a base. A part of hydrogen in the chemical formula may be substituted with chlorine. An example thereof may be polychlorotrifluoroethylene.

Another example of the fluorine-based resin may be a fluorine-based ion-exchange resin. A specific example may be a resin that is at least a copolymer of a vinyl fluoride compound represented by a general formula CF2=CF—O (CF2CFX)nO—(CF2)m-W and fluorinated olefin represented by a general formula $CF_2$=CFZ. Herein, X is F or a perfluoroalkyl group having the carbon number from 1 to 3, n is an integer from 0 to 3, m is an integer from 1 to 5, Z is H, Cl, F or a perfluoroalkyl group having the carbon number from 1 to 3. W is any one of groups represented as COOH, $SO_3H$, $SO_2F$, $SO_2Cl$, $SO_2Br$, COF, COCl, COBr, $CO_2CH_3$, and $CO_2C_2H_5$.

Particularly in the case of an organic compound, an organic compound containing an atom or a functional group having high polarity is preferable because of large dielectric constant. Dipole moment that is an index of polarity can be estimated from the sum of the bond moment. As an organic compound having relative permittivity of 2 or more, a compound including a substituent having the bond moment of 1.4 D (D=3.33564×10$^{-30}$ Cm) or more is preferable. As a substituent having the bond moment of 1.4 D or more, OH, CF, CCl, C=O, N=O, CN, and so on are available. Examples of the organic compound including these substituents and having relative permittivity of 2 or more include fluorine-based resin, glycerin, thioglycerol, and cyano group-containing organic compounds.

Examples of the inorganic compounds include calcium silicate, glass, aluminum oxide, zinc oxide, titanium oxide, selenium, barium titanate, bismuth silicate, lead niobate, titanium dioxide, urea, bakelite, Pyrex (registered trademark), vaseline, mica, copper chloride, copper oxide, copper sulfate, iron oxide, potassium chlorate, potassium chloride, sodium chloride, silver chloride, potassium bromide, lithium fluoride, silicon oxide, magnesium oxide, calcium fluoride, zinc sulfide, NaI, NaF, $NaClO_3$, and $NaSO_4$.

Other examples of the inorganic compound, in addition to the above-described compounds, include complex oxides such as lead zirconate titanate, strontium titanate, calcium titanate, and barium strontium titanate, or perovskite-type complex oxides or the like in which these complex oxides are contained as a main component and a Ba site is replaced with magnesium, and a Ti site is replaced with tin and/or zirconium. Furthermore, one or two or more trace amount of additives to the perovskite-type complex oxides may be added for use.

Examples of such trace amount of additives include tungsten, tantalum, niobium, iron, copper, magnesium, bismuth, yttrium, molybdenum, vanadium, sodium, potassium, aluminum, manganese, nickel, zinc, calcium, strontium, silicon, tin, selenium, neodymium, erbium, thulium, hafnium, praseodymium, promethium, samarium, europium, gadolinium, terbium, dysprosium, lithium, scandium, barium, lanthanum, actinium, cerium, ruthenium, osmium, cobalt, palladium, silver, cadmium, boron, gallium, germanium, phosphorus, arsenic, antimony, fluorine, tellurium, lutetium and ytterbium.

Other examples of the trace amount of additives, in addition to the above-described ones, include ionic liquids in which imidazolium, pyridium, pyrrolidinium, phosphonium, ammonium, sulfonium, or the like is a cation.

It is preferable in terms of allowing the semiconductor layer to absorb light that the compound having relative permittivity of 2 or more be transparent to some extent. Transmittance of a film made of the compound having relative permittivity of 2 or more preferably is 35% or more for light of 550 nm in wavelength, more preferably 50% or more, and still more preferably 70% or more. The transmittance can be measured by a spectrophotometer. Although the upper limit of the transmittance is not particularly limited, it is 100% or less. The transmittance can be measured using a spectrophotometer. As a measurement substrate, quartz glass or a resin substrate can be used.

The compound having relative permittivity of 2 or more preferably includes an organic compound in terms of plasticity of the film and film production property. In terms of blocking oxygen by covering the surface of semiconductor particles as well, an organic compound is preferable.

For a simple method for manufacturing, one type of the compound having relative permittivity of 2 or more is used preferably.

[Semiconductor Layer]

A semiconductor layer of the first embodiment refers to a semiconductor layer including semiconductor, such as a layer of inorganic semiconductor or a layer of organic semiconductor, or a semiconductor layer made of metal oxide particles and a compound having relative permittivity of 2 or more.

(1) Semiconductor Layer Including Semiconductor

A semiconductor layer including semiconductor is roughly classified into a layer of inorganic semiconductor and a layer of organic semiconductor.

Specific examples of the layer of inorganic semiconductor include a silicon wafer obtained by slice-cutting a silicon ingot, a silicon wafer obtained by polishing the silicon wafer, an inorganic semiconductor layer that is formed from an inorganic semiconductor material on a substrate using a vacuum apparatus, such as vapor deposition, CVD, or sputter, or an inorganic semiconductor layer formed from an inorganic semiconductor material by coating. Such an inorganic semiconductor layer preferably has a thickness of 0.1 µm or more in terms of photoelectric conversion characteristics, and 1 µm or more is more preferable. In terms of a similar aspect, the thickness is 1,000 µm or less preferably, and 700 µm or less is more preferable. The thickness of a semiconductor layer may be measured by cross section SEM or cross section TEM observation.

Examples of the layer of organic semiconductor include a layer formed from an organic semiconductor material by coating or vapor deposition. Such an organic semiconductor layer preferably has a thickness of 0.01 µm or more in terms of photoelectric conversion characteristics, and 0.05 µm or more is more preferable. In terms of a similar aspect, the thickness is 2 µm or less preferably, and 1 µm or less is more preferable. The thickness of a semiconductor layer may be measured by cross section SEM or cross section TEM observation.

The semiconductor layer of the first embodiment is roughly classified into a p-type semiconductor layer and a n-type semiconductor layer. The p-type here is a case where a hole functions as a carrier of charge transfer in the semiconductor. The n-type is a case where an electron functions as a carrier of charge transfer in the semiconductor. The hole and the electron are collectively called a carrier.

Specifically examples of the p-type semiconductor layer include a monocrystalline or polycrystalline silicon wafer, an amorphous silicon film, a compound semiconductor layer such as CIS-based, CIGS-based or CZTS-based, a metal oxide layer such as copper oxide (I), nickel oxide, $CuAlO_2$, $CuGaO_2$, $SrCu_2O_2$, $LaCuOS$, $LaCuOSe$, $CuInO_2$ or $ZnRh_2O_4$, a layer made of silicon particles, a layer of metal oxide particles such as copper oxide (I), silver oxide, tin monooxide, nickel oxide, $CuAlO_2$, $CuGaO_2$, $SrCu_2O_2$, $LaCuOS$, $LaCuOSe$, $CuInO_2$ or $ZnRh_2O_4$, a layer made of compound semiconductor particles, such as CIS-based, CIGS-based or CZTS-based, and a layer of p-type organic semiconductor.

Examples of the layer containing silicon of the present invention include a monocrystalline silicon wafer, a polycrystalline silicon wafer, and a layer containing amorphous silicon and silicon particles.

In the case of a p-type silicon wafer, a silicon wafer prepared by doping with boron, gallium, or the like as an additive is used. In the case of a n-type silicon wafer, a silicon wafer prepared by doping with phosphorus, nitrogen, arsenic, or the like as an additive is used. It is preferable that the concentration of these additives contained in the silicon wafer be $1 \times 10^{12}$ atom/cm$^3$ or more, and more preferably $1 \times 10^{13}$ atom/cm$^3$ or more. It is preferable that the concentration of these additives be $1 \times 10^{21}$ atom/cm$^3$ or less, and more preferably $1 \times 10^{20}$ atom/cm$^3$ or less.

It is preferable in terms of charge transfer in the semiconductor and spread of a depletion layer that the resistivity of the silicon wafer be 0.0001 Ωcm or more, and more preferably 0.001 Ωcm or more. It is preferable that the resistivity be 1000 Ωcm or less, and more preferably 100 Ωcm or less.

Next amorphous silicon is described below. Amorphous silicon can be manufactured by glow discharge, reactive sputter, chemical vapor deposition (CVD) or the like. The glow discharge is a method to decompose $SiH_4$ in plasma generated by glow discharge. The reactive sputter is a method to apply electricity between electrodes placed in low-pressure argon gas to generate discharge, and to place a crystalline silicon substrate (target) on one of the electrodes for sputtering, thus forming a film on a substrate placed on the other electrode. The chemical vapor deposition is a method to decompose $SiH_4$ by heat at 400° C. to 700° C., followed by hydrogen plasma treatment to prepare amorphous silicon.

In the case of p-type amorphous silicon, amorphous silicon prepared by doping with boron, gallium, or the like as an additive is used. In the case of n-type amorphous silicon, amorphous silicon prepared by doping with phosphorus, nitrogen, arsenic, or the like as an additive is used.

For amorphous silicon, their dopants are diluted in hydrogen gas for introduction, whereby their conductivity type can be controlled.

Next, the layer containing silicon particles is described below. The layer containing silicon particles is a layer containing silicon particles alone or a layer containing silicon particles and other compounds such as solvent, a binder component, and semiconductor components other than silicon particles. The content of silicon particles in the layer containing silicon particles is preferably 10 mass % to 100 mass %. When the content is at least 30 mass % or more, the semiconductor layer can easily exert a function thereof sufficiently.

Examples of the solvent include water, pentane, hexane, heptane, octane, nonane, decane, 2-methylhexane, decalin, tatralin, methanol, ethanol, n-propanol, 2-propanol, n-butanol, t-butanol, ethylene glycol, diethylene glycol, ethylene glycol monomethyl ether, ethylene glycol monoethyl ether, diethylene glycol monobutyl ether, ethylene glycol monobutyl ether, diethylene glycol diethyl ether, diethylene glycol dibuthyl ether, ethylene glycol mono2-ethylhexyl ether, propylene glycol n-butyl ether, dipropylene glycol n-butyl ether, tripropylene glycol n-butyl ether, dipropylene glycol methyl ether, tripropylene glycol methyl ether, ketons such as glycerin acetone and methyl ethyl ketone, aromatics such as benzene, xylene, toluene, phenol, aniline, diphenyl ether, dimethylsulfoxide, dimethylformamide, acetonitrile, methyl acetate, tetrahydrofuran, butyl lactate, and N-methylpyrrolidone. These may be mixed for use.

The binder component may include general versatile resin or a surfactant. Specific examples of the general versatile resin include epoxy resin, acrylic resin, phenol resin, melamine resin, urea resin, unsaturated polyester resin, alkyd resin, polyurethane, polyimide, polyethylene, polypropylene, polyvinyl chloride, polystyrene, polyvinyl acetate, polytetrafluoroethylene, acrylonitrile-butadiene-styrene resin (ABS resin), polyamide, polyacetal, polycarbonate, polyester, cyclic polyolefin, and polysulfone.

The surfactant may include anionic surfactant, cationic surfactant, amphoteric surfactant, and nonionic surfactant. Specifically examples of the anionic surfactant include fatty acid sodium, monoalkyl sulfate, alkyl benzene sulfonate, and monoalkyl phosphate. Examples of the cationic surfactant include alkyltrimethylammonium salt, dialkyldimethylammonium salt, and alkylbenzylmethyl ammonium salt. Examples of the amphoteric surfactant include alkyldimethylamine oxide, and alkylcarboxybetaine. Examples of the nonionic surfactant include polyoxyethylene alkyl ether, sorbitan fatty acid ester, alkyl polyglycoside, fatty acid diethanolamide, and alkylmonoglyceryl ether.

The method for producing silicon particles is not particularly limited, and they can be produced by, for example, a method using a high crystallinity semiconductor microparticle production apparatus utilizing a pulse pressure addition orifice spraying method, a method of pulverizing a polycrystalline or monocrystalline silicon ingot or wafer or the like. Chips during wafer production or the like also can be used as silicon particles. A method of pulverizing an ingot or wafer may be either dry pulverization or wet pulverization, and both methods may be used. A hummer crusher or the like can be used for the dry pulverization. A ball mill, a planetary ball mill, a bead mill, a homogenizer, or the like can be used for the wet pulverization. Solvents for the wet pulverization include compounds in the following.

Specifically, examples of the solvent include water, pentane, hexane, heptane, octane, nonane, decane, 2-methylhexane, decalin, tatralin, methanol, ethanol, n-propanol, 2-propanol, n-butanol, t-butanol, ethylene glycol, diethylene glycol, ethylene glycol monomethyl ether, ethylene glycol monoethyl ether, diethylene glycol monobutyl ether, ethylene glycol monobutyl ether, diethylene glycol diethyl ether, diethylene glycol dibuthyl ether, ethylene glycol mono2-ethylhexyl ether, propylene glycol n-butyl ether, dipropylene glycol n-butyl ether, tripropylene glycol n-butyl ether, dipropylene glycol methyl ether, tripropylene glycol methyl ether, ketons such as glycerin acetone and methyl ethyl ketone, aromatics such as benzene, xylene, toluene, phenol, aniline, diphenyl ether, dimethylsulfoxide, dimethylformamide, acetonitrile, methyl acetate, tetrahydrofuran, butyl lactate, and N-methylpyrrolidone. These may be mixed for use. A surfactant or the like may be added, in addition to the solvents as stated above.

As p-type silicon particles, silicon particles prepared by doping with boron, gallium, or the like as an additive is used. As n-type silicon particles, silicon particles prepared by doping with phosphorus, nitrogen, arsenic, or the like as an additive is used. It is preferable that the concentration of these additives contained in the silicon particles be $1 \times 10^{12}$ atom/cm$^3$ or more, and more preferably $1 \times 10^{13}$ atom/cm$^3$ or more. It is preferable that the concentration of these additives be $1 \times 10^{21}$ atom/cm$^3$ or less, and more preferably $1 \times 10^{20}$ atom/cm$^3$ or less.

It is preferable in terms of charge transfer in the semiconductor and spread of a depletion layer that the resistivity of silicon particles be 0.0001 Ωcm or more, and more preferably 0.001 Ωcm or more. It is preferable that the resistivity be 1000 Ωcm or less, and more preferably 100 Ωcm or less.

It is preferable in terms of reduced contact resistance between particles that the average particle size of silicon particles be 400 μm or less, more preferably 200 μm or less, still more preferably 100 μm or less, and very preferably 70 μm or less. It is preferable in terms of reduced contact resistance between particles and an electrode and of diffusion length that the average particle size be 0.001 μm or more, more preferably 0.01 μm or more, and still more preferably 1 μm or more.

In the first embodiment and the second embodiment described later, the average particle size of particles such as silicon particles is measured by image processing using a microscope.

Herein examples of the method for forming a film-form semiconductor layer from silicon particles include a method using a vacuum system, such as vapor deposition, sputter, CVD, and a method using a non-vacuum system, such as printing including screen printing, gravure printing, and typography, and wet coating such as blade coating and spin coating. A layer containing silicon particles may be a layer made of a plurality of types of inorganic semiconductor particles including silicon particles. Examples of the method for forming a film-form semiconductor layer from these plurality of types of inorganic semiconductor particles include a method in which a plurality of materials are co-vapor deposited and are deposited on a substrate with an electrode, and a method in which application liquid including a plurality of materials is prepared and then a semiconductor layer is manufactured by various kinds of printing methods using the application liquid.

When the p-type semiconductor layer is made of compound semiconductor, examples of the compound used for the compound semiconductor include silicon germanium compounds, CIS-based compounds, CIGS-based compounds, CZTS-based compounds, CGS-based compounds, CdTe compounds, InP compounds, GaAs compounds, GaSb compounds, GaP compounds, InSb compounds, InAs compounds, ZnTe compounds, ZnSe compounds, FeS compounds, CuS compounds, tin sulfide, and antimony sulfide. The CIS-based compound is a compound made of Cu, In and S, Cu, In, S and Se or Cu, In and Se, and both compounds may be used together in one aspect. The CIGS-based compound is a compound made of Cu, In, Ga and S, Cu, In, Ga, S, and Se, or Cu, In, Ga and Se, and both compounds may be used together in one aspect. The CZTS-based compound is a compound made of Cu, Zn, Sn and S, Cu, Zn, Sn, S and Se or Cu, Zn, Sn and Se, and both compounds may be used together in one aspect. The CGS-based compound is a compound made of Cu, Ga and S, or Cu, Ga, S and Se, and both compounds may be used together in one aspect. These compounds used for the compound semiconductor particles may be used in combination of two types or more.

Examples of the p-type organic semiconductor include pentacene, pentacene derivatives such as 6,13-bis(triisopropylsilylethynyl)pentacene, tetracene, tetracene derivatives such as 2-hexyl tetracene, and aromatic amine-based materials such as N,N-diphenyl-N,N'-bis(1-naphtyl)-1,1'-biphenyl-4,4'-diamine (NPD), N,N'-diphenyl-N,N'-bis(3-methylphenyl)-1,1'-biphenyl-4,4'-diamine (TPD), and 1,3,5-tris(3-methyldiphenylamino)benzene (m-MTDATA). Other examples of the p-type organic semiconductor include phthalocyanine-based complexes such as copper phthalocyanine (CuPc) and zinc phthalocyanine (ZnPc), porphyrin-based compounds, perylene-based derivatives, imidazole derivatives, triazole derivatives, pyrazoline derivatives, oxazole derivatives, oxadiazole derivatives, stilbene derivatives, polyaryl alkane derivatives, and graphene oxide. Still other examples of the p-type organic semiconductors include derivatives of thiophene and derivatives of polyphenyl vinylene (PPV). Derivatives of thiophene specifically include P3HT (Poly(3-hexylthiophene-2,5-diyl)), P3OT (Poly(3-octylthiophene-2,5-diyl)), P3DDT (Poly(3-dodecylthiophene-2,5-diyl)), and a PEDOT-based polymer. The dopant for the PEDOT-based polymer is not limited particularly, which may include PSS (Poly(styrenesulfonate)), PVS (polyvinylsulfonate), dodecylbenzenesulfonate or salt thereof. These may be used as PEDOT:PSS or PEDOT:PVS. A product as PEDOT:PSS may be clevios (produced by Heraeous Corporation).

Two types or more of the p-type semiconductor may be mixed for use. A monocrystalline or polycrystalline silicon wafer is preferable as the p-type semiconductor layer in terms of carrier transfer and cost. In terms of manufacturing of a transparent solar cell, p-type semiconductor oxide is preferable. P-type and n-type are made of transparent metal oxides, whereby a solar cell having high transmittance of visible light (i.e., transparent solar cell) can be manufactured, which therefore can be used as a windowpane or the like.

Examples of the n-type semiconductor layer include a monocrystalline or polycrystalline silicon wafer, an amorphous silicon film, a layer made of metal oxide such as zinc oxide, titanium oxide (rutile, anatase), zinc oxide doped with aluminum (AZO), zinc oxide doped with gallium (GZO), indium tin oxide (ITO), tin oxide, tin oxide doped with fluorine (FTO), indium oxide, indium.gallium.zinc oxide, $CuInO_2$, $12CaO.7Al_2O_3(C12A7)$, and $Ga_2O_3$, a layer made of silicon particles, a layer made of metal oxide particles such as zinc oxide, titanium oxide (rutile, anatase), zinc oxide doped with aluminum (AZO), zinc oxide doped with gallium (GZO), indium tin oxide (ITO), tin oxide, tin oxide doped with fluorine (FTO), indium oxide, indium.gallium.zinc oxide, $CuInO_2$, $12CaO.7Al_2O_3(C12A7)$, and $Ga_2O_3$, and a layer of n-type organic semiconductor.

Examples of the n-type organic semiconductor include fluorinated acene-based compounds, fullerene-based compounds such as fullerene, 60PCBM ([6,6]-Phenyl C61 butyric acid methyl ester) and 70PCBM ([6,6]-Phenyl C71 butyric acid methyl ester), naphthalene derivatives, anthracene derivatives, phenanthrene derivatives, pyrene derivatives, perylene derivatives, perylene tetracarboxylic acid diimide derivatives, oxadiazole derivatives, triazole derivatives, triazine derivatives, and quinoline derivatives. A monocrystalline or polycrystalline silicon wafer and a layer made of metal oxide or metal oxide particles are preferable as the n-type semiconductor layer in terms of carrier transfer and cost. A solar cell according to the first embodiment preferably includes a layer made of silicon or a layer made of metal oxide. When silicon is n-type semiconductor, silicon prepared by doping with phosphorus, nitrogen, arsenic, or the like as an additive is used.

In the solar cell according to the first embodiment, a silicon oxide film is formed on the rear face side of a layer made of silicon, i.e., on the electrode side, whereby open-circuit voltage can be improved. In terms of power generation efficiency, the silicon oxide film preferably has a thickness of 1 nm or more, and 2 nm or more is more preferable. In terms of current extraction, the thickness is preferably less than 15 nm, and 10 nm or less is more preferable. The silicon oxide film may be in the form of covering the entire surface of a silicon layer on the electrode side, or of covering it in the island form. The silicon oxide film may be manufactured by immersing a silicon substrate in an oxidizing liquid for oxidizing treatment so as to form a very-thin oxide film on the surface of the substrate.

The oxidizing liquid is preferably at least one type selected from a mixture liquid of nitric acid, hydrogen peroxide water, hydrochloric acid, ozone dissolved water, perchloric acid, ammonia, and hydrogen peroxide water, a mixture liquid of hydrochloric acid and hydrogen peroxide water, and a mixture liquid of sulphuric acid and hydrogen peroxide water.

In the method for forming the oxide film, heat treatment in inert gas is preferably performed after the treatment with an oxidizing liquid. The heating temperature is preferably 300° C. or more, and 500° C. or more is more preferable.

A method for measuring the thickness of a silicon oxide film may include cross section TEM analysis.

In the case of hetero junction, the surface of a layer made of silicon on which light is incident, i.e., the face in contact with the other semiconductor layer may be etched using liquid such as alkali or acid so as to decrease the reflectance of light. Thereby, a pyramid structure can be formed on the surface of the layer made of silicon. Examples of the liquid used for etching may include aqueous sodium hydroxide, aqueous potassium hydroxide, aqueous cesium hydroxide, mixture liquid of aqueous potassium and alcohol, such as 2-propanol, mixture liquid of aqueous sodium and alcohol, such as 2-propanol, mixture liquid of aqueous cesium and alcohol, such as 2-propanol, mixture liquid of nitric acid and hydrofluoric acid, aqueous ammonium fluoride, mixture liquid of aqueous ammonium fluoride and hydrofluoric acid, aqueous tetramethylammonium, and SUN-X series (produced by Wako Pure Chemical Industries, Ltd.).

(2) Semiconductor Layer Including Metal Oxide Particles and Compound Having Relative Permittivity of 2 or More Next, the following describes a "semiconductor layer including metal oxide particles and a compound having relative permittivity of 2 or more".

As illustrated in FIG. 1, this semiconductor layer includes metal oxide particles 51 and a compound 52 having relative permittivity of 2 or more only. Alternatively this semiconductor layer includes the metal oxide particles 51, the compound 52 having relative permittivity of 2 or more, and another component (not illustrated). The other component may include at least any one or more of solvent, a binder component and an inorganic component, for example.

The metal oxide particles may include the p-type metal oxide particles and the n-type metal oxide particles as stated above. This semiconductor layer may have a structure such that the p-type metal oxide particles alone are included, the n-type metal oxide particles alone are included, or both of the p-type metal oxide particles and the n-type metal oxide particles are included.

Figure 2:
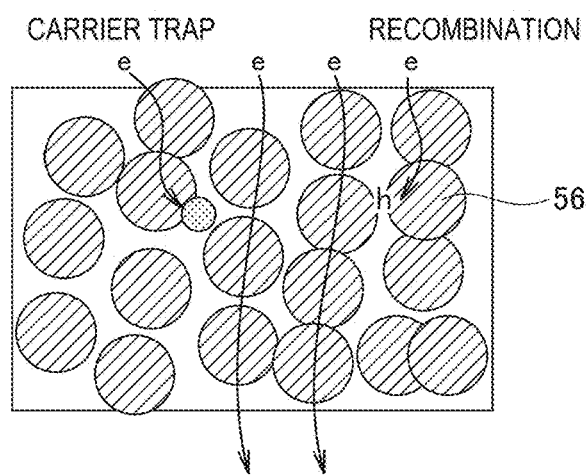
FIG. 2 schematically illustrates a semiconductor layer including metal oxide particles only.

Such mixture of the metal oxide particles and the compound having relative permittivity of 2 or more can solve a problem relating to the use of particles. The problem is that a defect on the surface of a particle becomes a trap level, so that properties of semiconductor in the form of particles are degraded. For example, as illustrated in FIG. 2, when a semiconductor layer includes metal oxide particles 56 alone, then a defect on the surface of a metal oxide particle 56 becomes a trap level to trap a carrier (e.g., an electron (e)). Herein, the problem can be partially solved by high-temperature sintering, but it becomes difficult to develop physical properties specific to the particles (i.e., a quantum size effect, a large surface area) because of high-temperature sintering, or the cost increases because of high-temperature process. Further, a film including particles prepared by low-temperature process is nonuniform in contact between the particles, and since it is not sintered, the carrier transfer is slow. Therefore, a technique to control defects on the surface of particles, to control a conduction path, and to control an electron state by low-temperature process is required.

In order to solve the problem, the present inventors found a technique to mix inorganic particles (at least one of metal oxide particles and silicon particles) and a compound having relative permittivity of 2 or more.

That is, the mixture of inorganic particles and a compound having relative permittivity of 2 or more leads to a decrease in the amount of defects on the surface of the inorganic particles, and as a result, this can prevent carrier transfer from being interfered with a defect level and can prevent recombination of carriers. Therefore, as compared with the case of a semiconductor layer including inorganic particles alone, electrical resistance of the semiconductor layer can be reduced, or the density or mobility of carriers can be improved. Such improvement in carrier mobility in a semiconductor layer is advantageous for transistor devices. Further, when resistance of a semiconductor layer is reduced, the filling factor of a solar cell can be improved, and its photoelectric conversion efficiency can be increased. Moreover, such prevention of recombination of carriers can lead to improvement in open-circuit voltage of the solar cell.

The mixture of inorganic particles and a compound having relative permittivity of 2 or more leads to another effect to increase a conductive path for carriers. When a semiconductor layer is made of inorganic particles only, a large number of parts where inorganic particles are not connected are generated. When the inorganic particles are mixed with a compound having relative permittivity of 2 or more, pseudo contact between inorganic particles can be increased. Although inorganic particles are actually connected mutually, it is estimated that the compound having relative permittivity of 2 or more intervening in the semiconductor layer at the interval of a few nm allows carriers to pass through the semiconductor layer. Therefore the amount of carriers flowing through the semiconductor layer increases, and the time for carriers to flow through the semiconductor layer also can be shortened.

The mixture of inorganic particles and a compound having relative permittivity of 2 or more leads to still another effect to block surrounding oxygen (i.e., air existing in the hollow wall at the particle interface). As a result, carriers that are deactivated by oxygen can be decreased, which therefore can contribute to improve the carrier density and mobility.

The mixture of inorganic particles and a compound having relative permittivity of 2 or more may lead to the ability to control the electron state of the semiconductor. Especially when the inorganic particles and the compound having relative permittivity of 2 or more surrounding the inorganic particles have closer values of dielectric constant, or when the compound having relative permittivity of 2 or more surrounding the inorganic particles has a value of dielectric constant higher than that of the inorganic particles, an increase in the density of electrons at conductive level leads to a good influence on the carrier transfer. Such an effect is noticeable when the inorganic particles and the compound having relative permittivity of 2 or more surrounding the inorganic particles have the same value of dielectric constant.

As illustrated in FIG. 2, even when the semiconductor layer between an anode layer and a cathode layer is made of inorganic particles (e.g., metal oxide particles 56) only and does not include a compound having relative permittivity of 2 or more, electrons will flow from the cathode layer to the anode layer as indicated with the arrows. The route (conductive path) for electrons is small, and carrier trap or recombination tends to occur. When the space between the anode layer and the cathode layer is filled with inorganic particles only as well, carrier trap, recombination or the like tends to occur because of a defect on the surface of the inorganic particles having enormous surface area.

On the contrary, in the present invention, inorganic particles (e.g., metal oxide particles 51) and a compound having relative permittivity of 2 or more (i.e., dielectric) are mixed, so that a composite film of the inorganic particles and the dielectric is formed as a semiconductor layer. This composite film has many conductive paths for electrons and defects also can be reduced, so that carrier trap or recombination can be suppressed. This composite film can block oxygen as well in the semiconductor particles. As a result, the amount of electrons flowing increases, and the traveling speed of electrons also can be increased.

Herein the ability of the compound having relative permittivity of 2 or more to control the electron state on the surface of titanium oxide particles (one example of the metal oxide particles) was confirmed from the experimental result (see FIG. 9 and FIG. 11) described later as well.

The content of the metal oxide particles in the "semiconductor layer including metal oxide particles and compound having relative permittivity of 2 or more" as stated above is preferably 10 mass % or more in terms of photoelectric conversion characteristics when this semiconductor layer is used for a solar cell, 20 mass % or more is more preferable, 35 mass % or more is more preferable, and 40 mass % or more is more preferable. In terms of a similar aspect, the content is preferably 99.5 mass % or less, and 99 mass % or less is more preferable, 90 mass % or less is more preferable, 80 mass % or less is still more preferable, and 70 mass % or less is very preferable.

The content of the compound having relative permittivity of 2 or more in the semiconductor layer as stated above is preferably 0.5 mass % or more in terms of photoelectric conversion characteristics, 1 mass % or more is more preferable, 10 mass % or more is still more preferable, 20 mass % or more is very preferable, 30 mass % or more is preferable, and 40 mass % or more is very preferable, In terms of a similar aspect, the content is preferably 90 mass % or less, and 80 mass % or less is more preferable, 70 mass % or less is still more preferable, 65 mass % or less is still more preferable, and 60 mass % or less is the most preferable. The thickness of the semiconductor layer is 0.1 μm or more preferably in terms of photoelectric conversion characteristics, and 0.2 μm or more is preferable and 0.5 μm or more is more preferable. In terms of a similar aspect, the thickness is preferably 1,000 μm or less, and 500 μm or less is more preferable. The compound having relative permittivity of 2 or more in the semiconductor layer is preferably an organic compound in terms of the function as a binder of metal oxide particles.

The mass % of the compound having relative permittivity of 2 or more to be mixed in the "semiconductor layer including metal oxide particles and compound having relative permittivity of 2 or more" varies with the density of the metal oxide. Therefore, the volume % of the compound having relative permittivity of 2 or more in the film also is important. In order to develop the flexibility of the film or the effect of dielectric, the content of the compound having relative permittivity of 2 or more in the film is preferably 10 volume % or more, and 20 volume % or more is more preferable. In terms of a similar aspect, the content of the compound is preferably 90 volume % or less, and 80 volume % or less is very preferable. The content of the metal oxide particles in the film is preferably 10 volume % or more, and 20 volume % or more is more preferable. In terms of a similar aspect, the content of the metal oxide particles is preferably 90 volume % or less, and 80 volume % or less is very preferable.

In the "semiconductor layer including metal oxide particles and compound having relative permittivity of 2 or more" as stated above, the compound having relative permittivity of 2 or more and the metal oxide particles are preferably distributed uniformly. Such uniform distribution can eliminate anisotropy of electrical characteristics, and so the stability of a solar cell can be increased. That is, the semiconductor layer is preferably a uniformly-dispersed film.

A uniformly-dispersed film of the present invention is described below specifically. A uniformly-dispersed film refers to a film in which inorganic particles and a compound having relative permittivity of 2 or more are uniformly dispersed in the film. In the uniformly-dispersed film, the ratio between the inorganic particles and the compound having relative permittivity of 2 or more is substantially the same between the lower half and the upper half of the film in the thickness direction, and it is preferable that a difference in the ratio (%) of inorganic particles at the lower half and the ratio (%) of inorganic particles at the upper half, i.e., the ratio of inorganic particles at the upper half—the ratio of inorganic particles at the lower half=10 or less. Uniformness in the thickness direction can be measured by cutting a cross section, and based on a contrast difference by a scanning electron microscope.

The average particle size of the metal oxide particles included in the semiconductor layer is 1 nm or more and 500 nm or less. The average particle size of the metal oxide particles is preferably 3 nm or more and more preferably 5 nm or more in terms of a decrease in contact resistance between particles and diffusion length. In terms of a similar aspect, the average particle size is preferably 100 nm or less, more preferably 80 nm or less, and still more preferably 50 nm or less. These metal oxide particles preferably have relative standard deviation σ of the particle size distribution that is 0.1 nm or more and 5.0 nm or less. Herein, in terms of lower resistance, this relative standard deviation σ is more preferably 3.0 nm or less and 2.0 nm or less still more preferably.

The "semiconductor layer including metal oxide particles and compound having relative permittivity of 2 or more" as stated above may be obtained by the following method, for example. That is, an example of the method for manufacturing a semiconductor layer includes the step of mixing the metal oxide particles and the compound having relative permittivity of 2 or more to prepare application liquid for semiconductor layer formation, and the step of applying the application liquid to a substrate on which an electrode is formed to prepare a coated film (or the step of applying application liquid for semiconductor layer formation to a semiconductor layer to prepare a coated film).

The application liquid for semiconductor layer formation as stated above may include one type or more of dispersant. This dispersant is liquid (i.e., solvent or disperse medium) to control the viscosity of the application liquid or to dissolve or disperse a compound having relative permittivity of 2 or more. When the application liquid for semiconductor layer formation includes dispersant, the method preferably includes a further step of, following the step to prepare a coated film, drying the coated film to remove at least a part of the dispersant from this coated film. The range of the temperature to dry this coated film is 20° C. more and 500° C. or less.

The range of temperatures to dry this coated film is preferably 20° C. more and 400° C. or less, and 20° C. more and 300° C. or less more preferably, 20° C. more and 200° C. or less more preferably, and 20° C. more and 150° C. or less the most preferably. The mixture of a compound having relative permittivity of 2 or more in the application liquid for semiconductor formation can eliminate the step of high-temperature sintering that has been required conventionally to form a metal oxide layer, and so a semiconductor layer can be manufactured by low-temperature process. High-temperature sintering is not required, because the compound having relative permittivity of 2 or more can suppress carrier trap or the like.

Herein, the dispersant is different from the compound having relative permittivity of 2 or more as described below.

Examples of the dispersant include alcohols such as methanol, ethanol, propanol, butanol, and hexanol, glycols such as ethylene glycol and propylene glycol, cellosolves such as cellosolve, methylcellosolve (2methoxyethanol), ethylcellosolve, and butylcellosolve, ketones such as acetone and methyl ethyl ketone, esters such as ethyl acetate, and butyl acetate, ethers such as dioxane and tetrahydrofuran; amides such as N,N-dimethyl formamide; hydrocarbons such as benzene, toluene, xylene, trimethylbenzene, hexane, heptane, octane, nonane, decane, cyclohexane, decahydronaphthalene (decalin), and tetralin, and water.

In terms of controlling of the viscosity, dissolving of the compound having relative permittivity of 2 or more or adjusting the dispersibility for easy handling of the application liquid, it is preferable that the content of dispersant in the application liquid for semiconductor layer formation be 0.2 mass % or more and 5 mass % or more preferably. Further, 99.8 mass % or less is preferable and 98.5 mass % or less is preferable.

The content of the compound having relative permittivity of 2 or more in the application liquid for semiconductor layer formation is preferably 0.1 mass % or more, and 0.5 mass % more preferably. Further, 49.9 mass % or less is preferable and 40 mass % or less is preferable.

The content of the metal oxide particles in the application liquid for semiconductor layer formation is preferably 0.1 mass % or more, and 0.5 mass % more preferably. Further, 49.9 mass % or less is preferable and 40 mass % or less is preferable.

When the compound having relative permittivity of 2 or more is liquid, the compound itself also functions as a dispersant. In this case, the viscosity can be adjusted without further adding a dispersant.

Note here that it is preferable in terms of allowing the semiconductor layer to absorb light that the "semiconductor layer including metal oxide particles and compound having relative permittivity of 2 or more" be transparent to some extent. It is preferable that the transmittance of this semiconductor layer for light having a wavelength of 550 nm be 35% or more, more preferably 50% or more, and still more preferably 70% or more. The transmittance can be measured by a spectrophotometer. Although the upper limit of the transmittance is not particularly limited, it is 100% or less. The transmittance can be measured using a spectrophotometer. As a measurement substrate, quartz glass or a resin substrate can be used. The compound having relative permittivity of 2 or more itself may be made of a material that does not absorb visible light. Specifically, the transmittance for light in the actual thickness used as a solar cell for light having a wavelength of 550 nm is preferably 30% or more, and more preferably 50% or more.

The "semiconductor layer including metal oxide particles and compound having relative permittivity of 2 or more" as stated above may be manufactured by coating as well as by printing as a non-vacuum method, such as screen printing, gravure printing, and typography.

[Junction Interface Layer]

A junction interface layer made of a compound having relative permittivity of 2 or more is disposed between two semiconductor layers, whereby a solar cell having excellent power generation efficiency can be easily manufactured. A junction interface layer made of a compound having relative permittivity of 2 or more is particularly preferably disposed at a junction interface between a layer of silicon and a "semiconductor layer including metal oxide particles and compound having relative permittivity of 2 or more".

The compound having relative permittivity of 2 or more includes the aforementioned compounds. Furthermore, it is preferable in terms of plasticity, film production properties, or the like that the junction interface layer include an organic compound. It is preferable that the organic compound have OH, CF, CCl, C=O, N=O, CN, or the like as a substituent group. It is preferable that specific organic compound be fluorine-based resin, glycerin, thioglycerol, or a cyano group-containing organic compound. The cyano group-containing organic compound refers to a compound in which one or more cyano groups are contained. It is more preferable that the cyano group-containing organic compound be a cyanoethyl group-containing organic compound. Specific examples of the cyano group-containing compound include cyanoethyl pullulan, cyanoethyl polyvinyl alcohols, cyanoethyl saccharose (cyanoethyl sucrose), cyanoethyl cellulose, cyanoethyl hydroxyethyl cellulose, cyanoethyl starch, cyanoethyl hydroxypropyl starch, cyanoethyl glycidol pullulan, and cyanoethyl sorbitol.

Specific examples of the fluorine-based resin include polyvinyl fluoride, polyvinylidene fluoride, and polytetrafluoroethylene that are a polymer having a $C_2F_{4-n}H_n$ skeleton (n is 0 to 3). These may be copolymered, or these may be copolymered with another resin, containing the fluorine-based resin as a base. A part of hydrogen in the chemical formula may be substituted with chlorine. An example thereof may be polychlorotrifluoroethylene.

A preferable range of the relative permittivity of the junction interface layer is 2 or more, more preferably 5 or more, and still more preferably 10 or more in terms of photoelectric conversion efficiency. In terms of a similar aspect, it is preferable that the relative permittivity be 5,000 or less, more preferably 1,500 or less, and still more preferably 200 or less.

It is preferable in terms of photoelectric conversion efficiency that the content of the compound having relative permittivity of 2 or more in the junction interface layer be 50 mass % or more, more preferably 80 mass % or more, still more preferably 90 mass % or more, and very preferably 95 mass %. Meanwhile, it is preferable in terms of improving solar cell characteristics that the upper limit of the content be 100 mass %, namely, it is preferable that the junction interface layer consist of the compound having relative permittivity of 2 or more. It is preferable in terms of performance of the solar cell that the junction interface layer be filled without containing air. The junction interface layer may include a general versatile resin as a binder component as well as a surfactant, a dispersant, and so on within a range without impairing the properties.

Examples of the dispersant include alcohols such as methanol, ethanol, propanol, butanol, and hexanol; glycols such as ethylene glycol and propylene glycol; cellosolves such as cellosolve, ethylcellosolve, and butylcellosolve; ketones such as acetone and methyl ethyl ketone; esters such as ethyl acetate, and butyl acetate; ethers such as dioxane and tetrahydrofuran; amides such as N,N-dimethyl formamide; hydrocarbons such as benzene, toluene, xylene, trimethylbenzene, hexane, heptane, octane, nonane, decane, cyclohexane, decahydronaphthalene (decalin), and tetralin; and water.

It is preferable in terms of adjusting the viscosity for easy handling of the application liquid that the content of the dispersant in the application liquid for forming a junction interface layer be 1 mass % or more and 98.5 mass % or less.

The amount of a surfactant that is added to the application liquid for forming a junction interface layer to improve dispersion stability is preferably 0.0001 mass % or more and 10 mass % or less in terms of dispersion stability.

The surfactant is not particularly limited, and, for example, anionic surfactant, nonionic surfactant, cationic surfactants, amphoteric surfactant, and polymer surfactant can be used.

Examples of the above-described surfactants include: anionic surfactants such as fatty acid salts including sodium lauryl sulfate, sulfuric acid ester salts of higher alcohols, alkyl benzene sulfonate including sodium dodecylbenzenesulfonate, polyoxyethylene alkyl ether sulfonates, polyoxyethylene polycyclic phenyl ether sulfates, polyoxynonylphenyl ether sulfonates, polyoxyethylene-polyoxypropylene glycol ether sulfonates, so-called reactive surfactants each having a sulfonic or sulfate group and a polymerizable unsaturated double bond in the molecule; nonionic surfactants such as polyoxyethylene alkyl ethers, polyoxyethylene alkylphenyl ethers, sorbitan fatty acid esters, polyoxyethylene fatty acid esters, polyoxyethylene-polyoxypropylene block copolymers, reactive nonionic surfactants having a polymerizable unsaturated double bond in the molecule of these "polyoxyethylene alkyl ethers, polyoxyethylene alkylphenyl ethers, sorbitan fatty acid esters, or polyoxyethylene fatty acid esters"; cationic surfactants such as alkyl amine salts, quaternary ammonium salts; (modified) polyvinyl alcohols; and straight chain alkyl thiols.

The junction interface layer does not have to be introduced over the entire face of the junction interface of the p-type semiconductor layer and the n-type semiconductor layer. It is preferable in terms of power generation efficiency that the junction interface layer cover 30% or more of the entire junction interface, more preferably 50% or more, and still more preferably 100%. The junction interface layer may be scattered like islands.

Note here that it is preferable in terms of power generation efficiency and carrier transfer that the average thickness of the junction interface layer be 1 nm or more, more preferably 20 nm or more, still more preferably 30 nm or more, and very preferably 50 nm or more. In terms of a similar aspect, it is preferable that the average thickness be 500 μm or less, more preferably 100 μm or less, still more preferably 50 μm or less, very preferably 10 μm or less, and the most preferably 5 μm or less. This junction interface layer has a high photoelectric conversion characteristics even when it has a thickness of 30 nm or more that leads to the difficulty to flow current due to tunneling. The thickness of the junction interface layer is measured by vertscan 2.0 (manufactured by Ryoka Systems Inc.) or cross section TEM observation.

Note here that it is preferable in terms of allowing the semiconductor layer to absorb light that the junction interface layer be transparent to some extent. It is preferable that the transmittance of the junction interface layer for light having a wavelength of 550 nm be 35% or more, more preferably 50% or more, and still more preferably 70% or more. The transmittance can be measured by a spectrophotometer. Although the upper limit of the transmittance is not particularly limited, it is 100% or less. The transmittance can be measured using a spectrophotometer. As a measurement substrate, quartz glass or a resin substrate can be used.

It is preferable that the resistivity of the junction interface layer be higher. It is estimated that such high resistivity can contribute to prevention of leak current. Note here that it is preferable from such a standpoint that the resistivity be 10 Ωcm or more, more preferably 100 Ωcm or more, still more preferably 1,000 Ωm, very preferably 10,000 Ωcm or more, and the most preferably 1000,000 Ωcm or more. Although the upper limit of the resistivity is not particularly limited; it is preferable that the upper limit of the resistivity be $1\times10^{19}$ Ωcm or less.

The resistivity in the first embodiment and the second embodiment described later is a scale of electrical conductivity and means resistivity per unit volume. This value is inherent to a substance and is found by letting constant current I flow through a cross-sectional area W of a substance and measuring a potential difference V between electrodes with a distance L therebetween. That is, the resistivity can be found by the following expression [3], $$\text{Resistivity} = (V/I) \times (W/L) \qquad [3].$$

It is effective to manufacture the junction interface layer by printing because it enables lower cost. In this case, it is preferable that a substrate be a flexible electrode substrate having plasticity for the substrate on which the junction interface layer is to be formed. This allows the electrode substrate including a junction interface layer thereon to be wound up into a rolled shape, and so the production speed can be improved.

[Solar Cell]

A solar cell according to the first embodiment at least includes a first semiconductor layer, a second semiconductor layer, an electrode, and a substrate, and is configured to generate power by light. Semiconductor that makes up the solar cell may be a p-p junction type or a n-n junction type, and a p-n junction type is preferable.

The first semiconductor layer is the "semiconductor layer including metal oxide particles and compound having relative permittivity of 2 or more" as stated above. The metal oxide particles included in this semiconductor layer may be those mentioned above as their types, among which titanium oxide or zinc oxide is preferable in terms of transparency and carrier mobility. The compound having relative permittivity of 2 or more is preferably an organic compound in terms of plasticity. Especially in terms of carrier transfer, the first semiconductor layer is preferably a layer made up of single metal oxide particles and a compound having relative permittivity of 2 or more only.

The second semiconductor layer is preferably made of a material that is not used in the first semiconductor layer, which may be a semiconductor layer made of metal oxide particles and compound having relative permittivity of 2 or more that are different from those in the first semiconductor layer. The first semiconductor layer and the second semiconductor layer include mutually different metal oxides, whereby a solar panel having high photoelectronic conversion efficiency and being transparent in visible light can be manufactured. In terms of carrier transfer and the ability to absorb light, the second semiconductor layer of the present invention is preferably a semiconductor layer made of semiconductor, and is more preferably made of silicon. A layer made of silicon is preferably a monocrystalline silicon wafer, a polycrystalline silicon wafer, or a layer made of amorphous silicon or silicon particles as stated above.

A solar cell is preferably flexible. Such a flexible solar call enables roll-to-roll during manufacturing, which can contribute to lower manufacturing cost and can be bent for use. A flexible solar cell refers to a device that can be bent at 30 degrees or more on a horizontal base.

Next, specific examples of a solar cell are described.

(1) First Example

Figure 3:
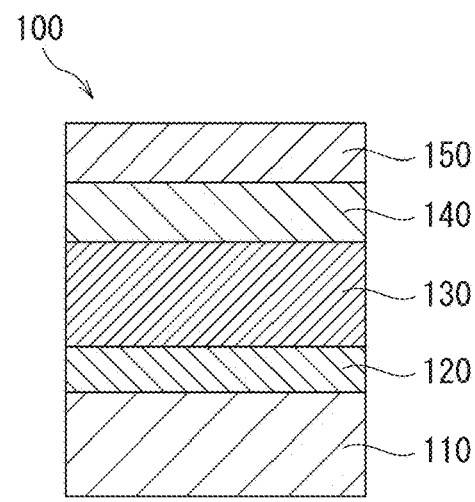
FIG. 3 is a cross-sectional view illustrative of an exemplary structure of a solar cell 100 according to a first embodiment.

FIG. 3 is a cross-sectional view schematically illustrating an exemplary structure of a solar cell 100 according to the first embodiment.

As illustrated in FIG. 3, this solar cell 100 includes a substrate 110, an anode layer 120 formed on the substrate 110, a second semiconductor layer 130 formed on the anode layer 120, a first semiconductor layer 140 formed on the second semiconductor layer 130, and a cathode layer 150 formed on the first semiconductor layer 140. The first semiconductor layer 140 is the "semiconductor layer including metal oxide particles and compound having relative permittivity of 2 or more" as stated above. The second semiconductor layer 130 is the "semiconductor layer made of semiconductor" as stated above.

When the solar cell 100 in FIG. 3 is of a p-p junction type, both of the first semiconductor layer 140 and the second semiconductor layer 130 are a p-type semiconductor layer, where the second semiconductor layer 130 has higher concentration of p-type than that of the first semiconductor layer 140. When the solar cell 100 is of a n-n junction type, both of the first semiconductor layer 140 and the second semiconductor layer 130 are a n-type semiconductor layer, where the first semiconductor layer 140 has higher concentration of n-type than that of the second semiconductor layer 130. When the solar cell 100 is of a p-n junction type, the first semiconductor layer 140 is a n-type semiconductor layer and the second semiconductor layer 130 is a p-type semiconductor layer.

Herein in this solar cell 100, the first semiconductor layer 140 and the second semiconductor layer 130 may be disposed in a reversed manner. That is, the first semiconductor layer 140 may be formed on the anode layer 120, and the second semiconductor layer 130 may be formed on the first semiconductor layer 140. In that case, when the solar cell is of a p-p junction type, the first semiconductor layer 140 has higher concentration of p-type than that of the second semiconductor layer 130, and when the solar cells of a n-n junction type, the second semiconductor layer 130 has higher concentration of n-type than that of the first semiconductor layer 140. When the solar cell is of a p-n junction type, the first semiconductor layer 140 is a p-type semiconductor layer and the second semiconductor layer 130 is a n-type semiconductor layer.

In this solar cell 100, each layer may be subdivided to have a plurality of layers. For example, an electron extraction layer (not illustrated) also can be disposed between the first semiconductor layer 140 and the cathode layer 150. A hole extraction layer (not illustrated) also can be disposed between the second semiconductor layer 130 and the anode layer 120. A light-absorbing layer (not illustrated) also can be disposed between the second semiconductor layer 130 and the first semiconductor layer 140. The second semiconductor layer 130 and the first semiconductor layer 140 may have a bulk hetero structure in which both layers are mixed with each other. It is preferable that one of the anode layer 120 and the cathode layer 150 be transparent. The substrate 110 may be present on the side of the cathode layer 150 instead on the side of the anode layer 120 or may be present on both sides of the anode layer 120 and the cathode layer 150.

(2) Second Example

Figure 4:
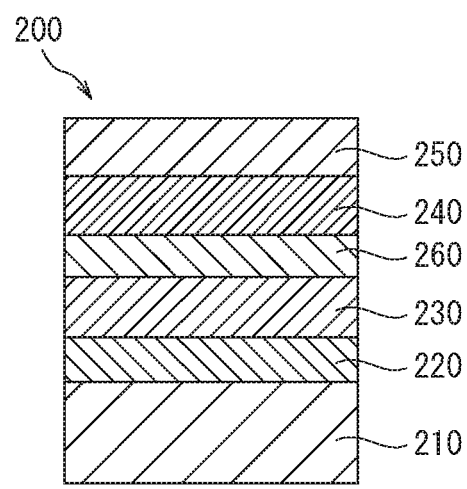
FIG. 4 is a cross-sectional view illustrative of an exemplary structure of a solar cell 200 according to the first embodiment.

FIG. 4 is a cross-sectional view schematically illustrating an exemplary structure of a solar cell 200 according to the first embodiment of the present invention.

The solar cell 200 illustrated in FIG. 4 includes a substrate 210, an anode layer 220 formed on the substrate 210, a second semiconductor layer 230 formed on the anode layer 220, a junction interface layer 260 formed on the second semiconductor layer 230, a first semiconductor layer 240 formed on the junction interface layer 260, and a cathode layer 250 formed on the first semiconductor layer 240. The junction interface layer 260 includes a compound having relative permittivity of 2 or more. The first semiconductor layer 240 is the "semiconductor layer including metal oxide particles and compound having relative permittivity of 2 or more" as stated above. The second semiconductor layer 230 is the "semiconductor layer made of semiconductor" as stated above.

When the solar cell 200 in FIG. 4 is of a p-p junction type, both of the first semiconductor layer 240 and the second semiconductor layer 230 are a p-type semiconductor layer, where the second semiconductor layer 230 has higher concentration of p-type than that of the first semiconductor layer 240. When the solar cell 200 is of a n-n junction type, both of the first semiconductor layer 240 and the second semiconductor layer 230 are a n-type semiconductor layer, where the first semiconductor layer 240 has higher concentration of n-type than that of the second semiconductor layer 230. When the solar cell 200 is of a p-n junction type, the first semiconductor layer 240 is a n-type semiconductor layer and the second semiconductor layer 230 is a p-type semiconductor layer.

Herein in this solar cell 200, the first semiconductor layer 240 and the second semiconductor layer 230 may be disposed in a reversed manner. That is, the first semiconductor layer 240 may be formed on the anode layer 220, the junction interface layer 260 may be formed on the first semiconductor layer 240, and the second semiconductor layer 230 may be formed on the junction interface layer 260. In that case, when the solar cell is of a p-p junction type, the first semiconductor layer 240 has higher concentration of p-type than that of the second semiconductor layer 230, and when the solar cell is of a n-n junction type, the second semiconductor layer 230 has higher concentration of n-type than that of the first semiconductor layer 240. When the solar cells of a p-n junction type, the first semiconductor layer 240 is a p-type semiconductor layer and the second semiconductor layer 230 is a n-type semiconductor layer.

In this solar cell 200, each layer may be subdivided to have a plurality of layers. For example, an electron extraction layer (not illustrated) also can be disposed between the first semiconductor layer 240 and the cathode layer 250. A hole extraction layer (not illustrated) also can be disposed between the second semiconductor layer 230 and the anode layer 220. The substrate 210 may be present on the side of the cathode layer 250 instead on the side of the anode layer 220 or may be present on both sides of the anode layer 220 and the cathode layer 250. It is preferable that one of the anode layer 220 and the cathode layer 250 be transparent.

(3) Tandem Structure

Although not illustrated, the solar cell according to the first embodiment may have a tandem structure in which two or more structures illustrated in FIG. 3 and FIG. 4 as above may be stacked in series.

For instance, a first unit cell includes the anode layer 120, the second semiconductor layer 130 formed on the anode layer 120, the first semiconductor layer 140 formed on the second semiconductor layer 130 and the cathode layer 150 formed on the first semiconductor layer 140 illustrated in FIG. 3. A second unit cell includes the anode layer 220, the second semiconductor layer 230 formed on the anode layer 220, the junction interface layer 260 formed on the second semiconductor layer 230, the first semiconductor layer 240 formed on the junction interface layer 260, and the cathode layer 250 formed on the first semiconductor layer 240 illustrated in FIG. 4.

The solar cell according to the first embodiment may have a structure in which two or more of the first unit cells are stacked in series, or in which two or more of the second unit cells are stacked in series. Alternatively, this may have a structure in which one or more of each of the first unit cell and the second unit cell are stacked in series.

(4) Materials and Physical Properties of these Parts

The substrates 110 and 210 may be any kind of substrate that is usually used, such as a glass substrate, a substrate of plastics such as PET (polyethylene terephthalate), PC (polycarbonate), PEN (polyethylene naphthalate), PP (polypropylene), polyether sulfone, polyimde, cycloolefin polymer, acrylic resin, fluorine-based resin, melamine resin, and phenol resin, an aluminum substrate, a stainless steel (SUS) substrate, a substrate made of clay, and a paper substrate.

The cathode layers 150 and 250 may be made of metals or metal oxides that are usually used, such as aluminum, SUS, gold, silver, alloy of indium and gallium, ITO (indium tin oxide), FTO (fluorine-doped tin oxide), IZO (indium zinc oxide), zinc oxide, and aluminum-doped zinc oxide. Conductive polymers, graphenes, and so on also can be used.

The anode layers 120 and 220 may be made of metals or metal oxides that are usually used, such as aluminum, SUS, gold, silver, alloy of indium and gallium, ITO (indium tin oxide), FTO (fluorine-doped tin oxide), IZO (indium zinc oxide), zinc oxide, and aluminum-doped zinc oxide. Conductive polymers, graphenes, and so on also can be used.

When an ITO-attached PET film is used as the substrates 110 and 210, the sheet resistance thereof is preferably 0.1 to 100Ω/☐ in terms of more improved photoelectric conversion efficiency, and 1 to 50Ω/☐ more preferably.

Although the thicknesses of the substrates 110, 210, the cathode layers 150, 250, and the anode layers 120, 220 are not particularly limited, the thicknesses can be about 0.1 mm to 100 mm, about 0.01 μm to 1,000 μm, and about 0.01 μm to 1,000 μm, respectively.

(5) Comparative Example

Figure 5:
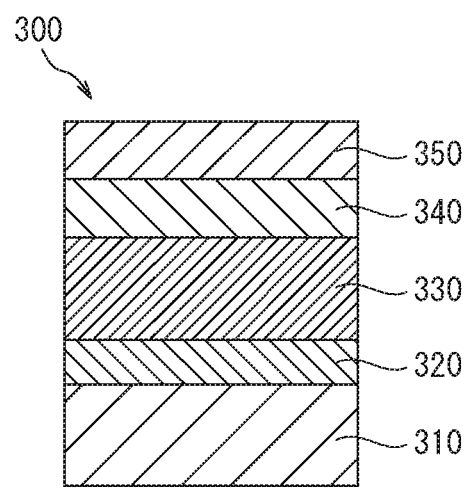
FIG. 5 is a cross-sectional view illustrative of an exemplary structure of a solar cell 300 according to a comparative example.

FIG. 5 is a cross-sectional view schematically illustrating a solar cell 300 according to a comparative example. The solar cell 300 illustrated in FIG. 5 is a typical pn junction solar cell. The solar cell includes, on a substrate 310, an anode layer 320, a p-type semiconductor layer 330, a n-type semiconductor layer 340, and a cathode layer 350. None of the p-type semiconductor layer 330 and the n-type semiconductor layer 340 is a "semiconductor layer including metal oxide particles and compound having relative permittivity of 2 or more". The solar cell 300 is different from the solar cells 100, 200 in this respect.

[Advantageous Effects of the First Embodiment]

The first embodiment of the present invention has the following advantageous effects (1) to (5).

(1) The first semiconductor layer making up the solar cell includes metal oxide particles with the average particle size of 1 nm or more and 500 nm or less, and a compound having relative permittivity of 2 or more. Thereby, as compared with the structure of the first semiconductor layer including metal oxide particles only, interference of carrier transfer with a defect level and air gap between particles, as well as recombination of carriers can be prevented. As a result, electrical resistance of the first semiconductor layer can be reduced, the filling factor of a solar cell can be improved, and its photoelectric conversion efficiency can be increased. Moreover, such prevention of recombination of carriers can lead to improvement in open-circuit voltage of the solar cell.

(2) The mixture of metal oxide particles and a compound having relative permittivity of 2 or more leads to another effect to increase a conductive path for carriers. Thereby the amount of carriers flowing through the first semiconductor layer increases, and the time for carriers to flow through the first semiconductor layer also can be shortened.

(3) The mixture of metal oxide particles and a compound having relative permittivity of 2 or more leads to still another effect to block surrounding oxygen. Thereby, carriers that are deactivated by oxygen can be decreased, which therefore can contribute to improve the carrier density and mobility in the first semiconductor layer.

(4) The first semiconductor layer and the second semiconductor layer can be manufactured at low cost and at low-temperature process that does not require vacuum process and the like, and can be formed by non-vacuum process, such as coating and printing. Thereby a solar cell that can be manufactured by non-vacuum process and can have more excellent photoelectric conversion efficiency and a method for manufacturing thereof can be provided.

(5) When the second semiconductor layer includes inorganic particles (at least one of metal oxide particles and silicon particles), the second semiconductor layer further includes a compound having relative permittivity of 2 or more more preferably, and this compound is an organic compound having relative permittivity of 3 or more and 150 or less more preferably. When the second semiconductor layer includes the above-stated compound in addition to the inorganic particles, the content of the inorganic particles in the second semiconductor layer is 10 mass % or more and 90 mass % or less preferably. The second semiconductor layer includes inorganic particles and a compound having relative permittivity of 2 or more, whereby as compared with a structure of the second semiconductor layer made of inorganic particles alone, the effect of suppressing carrier trop and the recombination on the surface of inorganic particles in the second semiconductor layer can be obtained and the mobility of the second semiconductor layer also can be improved, and so the performance a solar cell also can be improved Second Embodiment Next a semiconductor device is described.

A semiconductor device according to the second embodiment of the present invention includes at least one layer of a semiconductor layer including inorganic particles and a compound (hereinafter called organic compound) having relative permittivity of 3 or more and 150 or less. The inorganic particles are metal oxide particles or silicon particles. The content of the inorganic particles in the semiconductor layer is 10 mass % or more and 90 mass % or less, and the carrier mobility of the semiconductor layer is 0.0001 $cm^2/Vs$.

[Semiconductor Device]

A semiconductor device according to the second embodiment may be a diode, a transistor, a thin-film transistor, a memory, a photodiode, a light-emitting diode, a light-emitting transistor, a sensor or the like. A transistor and a thin-film transistor can be used in display devices such as an active matrix driving display, a liquid crystal display, a dispersive liquid crystal display, an electrophoretic display, a particle rotation display device, an electrochromic display, an organic light-emitting display, and electronic paper.

A transistor and a thin-film transistor may be used as a switching transistor for display pixels, elements in a signal driver circuit, a memory circuit element, an element in a signal processing circuit and the like in these display devices.

A switching transistor for display devices may be disposed at each pixel of the display device for switching of display of the pixel. With such an active driving device, patterning is not required on a conductive opposed substrate, and so pixel wiring can be simplified as compared with passive driving devices without transistors for switching of pixels in some circuit structures. One or a few switching transistors are disposed for each pixel typically. Such a display device has a structure on the substrate, at which data lines and gate lines that are formed two-dimensionally intersect, and the data lines and the gate lines are connected to a gate electrode, a source electrode and a drain electrode of each transistor. The data lines and the gate lines may be separated, or a current feeding line and a signal feeding line may be added.

The pixels of a display device may include capacitors in addition to the pixel wiring and the transistors to have a function of recording a signal. On the substrate with a display device formed thereon, a driver for data lines and gate lines, a memory of pixel signal, a pulse generator, a signal splitter, a controller or the like may be mounted.

When the semiconductor device is a thin-film transistor, its device structure may be a structure (bottom contact structure) including substrate/gate electrode/insulator layer (dielectric layer)/source electrode.drain electrode/semiconductor layer, a structure (top gate structure) including substrate/semiconductor layer/source electrode.drain electrode/insulator layer (dielectric layer)/gate electrode, a structure (top contact structure) including substrate/gate electrode/insulator layer (dielectric layer)/semiconductor layer/source electrode.drain electrode, and the like. In this case, a plurality of the source electrodes, the drain electrodes and the gate electrodes may be disposed. The plurality of semiconductor layers may be disposed on a same plane or may be stacked.

As the semiconductor layer of this thin-film transistor, a "semiconductor layer including inorganic particles and an organic compound" is used. That is, the semiconductor layer of the semiconductor device includes a layer made of metal oxide particles and an organic compound only, or a layer made of metal oxide particles, an organic compound and another component. The other component includes at least any one or more of solvent, a binder component and an inorganic component, for example. The inorganic particles (metal oxide particles, silicon particles) that can be used are as illustrated in the first embodiment. The mobility of this semiconductor layer is 0.0001 $cm^2$/Vs, 0.001 $cm^2$/Vs or more preferably, and more preferably 0.01 $cm^2$/Vs or more. Thereby, a semiconductor device can be used preferably in a display device to display an image.

When the semiconductor device is a transistor, its structure may be a MOS (metal-oxide (insulator layer)-semiconductor) type transistor or a bipolar type transistor. The device structure of the bipolar type transistor may be a structure including n-type semiconductor layer/p-type semiconductor layer/n-type semiconductor layer and a structure including p-type semiconductor layer/n-type semiconductor layer/p-type semiconductor layer, in which an electrode is connected to each semiconductor layer. Then, as at least one of the p-type semiconductor layer and the n-type semiconductor layer, the "semiconductor layer including inorganic particles and an organic compound" as stated above is used.

When the semiconductor device is a diode, its device structure may be a structure including electrode/n-type semiconductor layer/p-type semiconductor layer/electrode, for example. Then, as at least one of the p-type semiconductor layer and the n-type semiconductor layer, the "semiconductor layer including inorganic particles and an organic compound" as stated above is used.

At least a part of the junction surface between the semiconductor layer including inorganic particles and an organic compound and an electrode may be a Schottky junction and/or a tunnel junction. Examples of such junction structure include a structure including electrode/Schottky junction (tunnel junction)/semiconductor layer/electrode, a structure including electrode/semiconductor layer/tunnel junction/semiconductor layer/electrode and a structure including electrode/Schottky junction (tunnel junction)/semiconductor layer/tunnel junction/electrode.

A diode can be formed by simply applying a Schottky junction and/or a tunnel junction to the semiconductor made of metal oxide particles or silicon particles and an organic compound of the present invention. Such a semiconductor device having a junction structure is preferable because a diode or a transistor can be formed with a simple structure. A plurality of semiconductor devices having such a junction structure may be joined, whereby a semiconductor device, such as an inverter, an oscillator, a memory, or a sensor can be formed.

Such Schottky junction and tunnel junction can be used not only for adjusting diode characteristics or for a tunnel junction device, but a magnetic material or a photoresponsive material may be used for a Schottky junction part or a tunnel junction part, whereby a sophisticated semiconductor device can be manufactured.

Next, a specific example of the semiconductor device is described.

Figure 6:
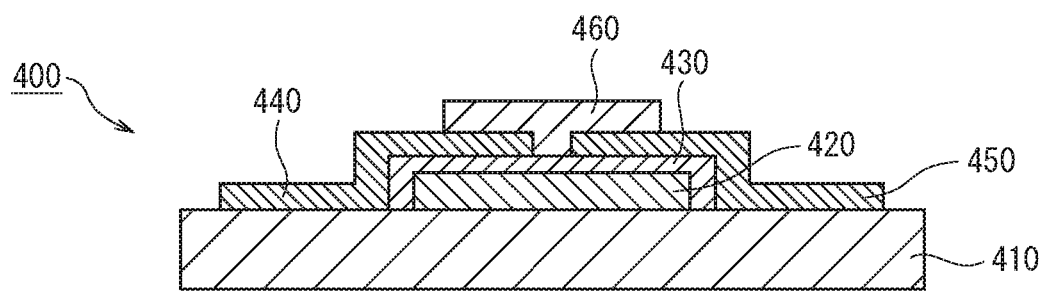
FIG. 6 is a cross-sectional view illustrative of an exemplary structure of a semiconductor device 400 according to a second embodiment.

FIG. 6 is a cross-sectional view schematically illustrating an exemplary structure of a semiconductor device 400 according to the second embodiment. As illustrated in FIG. 6, this semiconductor device 400 is a bottom contact structured thin-film transistor, including a substrate 410, a gate electrode 420 formed on the substrate 410, an insulator layer 430 formed on the substrate 410 to cover the gate electrode 420, a source electrode 440, a drain electrode 450, and a semiconductor layer 460. The source electrode 440 is formed on the substrate 410 so as to cover one end of the gate electrode 420 via the insulator layer 430. The drain electrode 450 is formed on the substrate 410 so as to cover the other end of the gate electrode 420 via the insulator layer 430. The semiconductor layer 460 is formed on the gate electrode 420 via the insulator layer 430, with which a space (i.e., a gap) between the source electrode 440 and the gate electrode 420 is filled.

A material of the substrate 410 may be glass or resin. Examples of materials of the gate electrode 420, the source electrode 440 and the drain electrode 450 include metal, conductive ceramic materials, carbon and conductive organic materials. Examples of the gate electrode 420, the source electrode 440 and the drain electrode 450 include gold, silver, aluminum, copper, indium tin oxide (ITO) or indium-gallium alloy more preferably in terms of favorable junction and adhesiveness with metal oxide and silicon.

[Method for Manufacturing Semiconductor Device]

A semiconductor device may be manufactured by a method to apply application liquid for semiconductor layer formation at predetermined regions of an electrode, semiconductor and an insulator layer that are pattern-formed on a substrate beforehand to form a semiconductor thin film, for example. A semiconductor device may be manufactured by another method to form a semiconductor thin film on a substrate, followed by patterning of the semiconductor thin film, formation of an electrode and formation of an insulator layer. Patterning of the semiconductor thin film in this case may be performed for pattern formation using a method, such as screen printing, gravure printing, offset printing, inkjet printing, or spraying.

A semiconductor device of the present invention can be manufactured by forming a semiconductor thin film on a substrate made of glass, resin or the like. Further, the semiconductor thin film can be formed by a simply method, such as printing or application of solution. Therefore a large number of semiconductor devices can be formed easily on a large-area substrate at one time. Therefore semiconductor devices or devices including these semiconductor devices (the aforementioned display device, arithmetic device, storage device or the like) can be manufactured at low cost. Such manufacturing of semiconductor devices using a semiconductor thin film is effective to make a device including a semiconductor device thinner or lighter as well.

[Electronic Devices]

A semiconductor device of the present invention can be used for an IC card, a smart card, an arithmetic device in an electronic device, such as an electronic tag, and a storage device as well. In that case, the semiconductor device can be used without problems whether they are of a contact type or a non-contact type.

These IC card, smart card and electronic tag may include a memory, a pulse generator, a signal splitter, a controller, a capacitor or the like, as well as an antenna and a battery.

A semiconductor device of the present invention can be used for a sensor as well, and can be applied to various sensors, such as a gas sensor, a biosensor, a blood sensor, an immune sensor, an artificial retina and a taste sensor.

[Advantageous Effects of the Second Embodiment]

According to the second embodiment of the present invention, a semiconductor device having high mobility and being stable in air can be provided. A semiconductor layer of the semiconductor device can be manufactured at low cost and at low-temperature process that does not require vacuum process and the like, and can be formed by non-vacuum process, such as coating and printing. In this way, according to the second embodiment of the present invention, a semiconductor device that can be manufactured by non-vacuum process and having higher mobility can be provided.

The range of temperatures to dry this semiconductor layer is preferably 20° C. or more and 400° C. or less, 20° C. or more and 300° C. or less more preferably, 20° C. or more and 200° C. or less still more preferably and 20° C. or more and 150° C. or less the most preferably. The mixture of a compound having relative permittivity of 2 or more in the application liquid for semiconductor layer formation can eliminate the step of high-temperature sintering that has been required conventionally to form a semiconductor layer, and so a semiconductor layer can be manufactured by low-temperature process. High-temperature sintering is not required, because the compound having relative permittivity of 2 or more can suppress carrier trap or the like.

Herein, the dispersant is different from the compound having relative permittivity of 2 or more as described below.

Examples of the dispersant include alcohols such as methanol, ethanol, propanol, butanol, and hexanol; glycols such as ethylene glycol and propylene glycol; cellosolves such as cellosolve, methylcellosolve (2methoxyethanol), ethylcellosolve, and butylcellosolve; ketones such as acetone and methyl ethyl ketone; esters such as ethyl acetate, and butyl acetate; ethers such as dioxane and tetrahydrofuran; amides such as N,N-dimethyl formamide; hydrocarbons such as benzene, toluene, xylene, trimethylbenzene, hexane, heptane, octane, nonane, decane, cyclohexane, decahydronaphthalene (decalin), and tetralin; and water.

In terms of controlling of the viscosity, dissolving of the compound having relative permittivity of 2 or more or adjusting the dispersibility for easy handling of the application liquid, it is preferable that the content of dispersant in the application liquid for semiconductor layer formation be 0.2 mass % or more and 5 mass % or more preferably. Further, the content is 99.8 mass % or less preferably and 98.5 mass % or less is more preferable.

The content of the compound having relative permittivity of 2 or more included in the application liquid for semiconductor layer formation is 0.1 mass % or more preferably, and 0.5 mass % is more preferable. Further, the content is 49.9 mass % or less preferably and 40 mass % or less is more preferable.

The content of the metal oxide particles in the application liquid for semiconductor layer formation is preferably 0.1 mass % or more, and 0.5 mass % more preferably. Further, the content is preferably 49.9 mass % or less and is 40 mass % or less more preferably.

EXAMPLES

The following describes the present invention in details by way of specific examples.

<Evaluation Methods>

In the following, evaluations were conducted under conditions of 25° C. and humidity of 45% unless otherwise specifically noted.

(1) Average Particle Size

For a particle size of 1 μm or more, the average particle size was measured using a desktop scanning microscope Carry Scope JCM 5100 (manufactured by JEOL Ltd.). The particle size of 10 points in total was measured, and the average thereof was defined as the average particle size.

For a particle size of less than 1 the average particle size was measured using a transmission electron microscope (TEM) HF-2000 (manufactured by Hitachi High-Technologies Cooperation). A specific method for measurement is as follows by way of an example of titanium oxide dispersion liquid TKS 201 (anatase type, produced by Tayca Corporation, solid content of 33 mass %). Firstly, the titanium oxide dispersion liquid was diluted to 2,000 times, this dilute dispersion liquid was dispersed by ultrasounds and mesh was soaked with this, followed by freeze drying of the mesh to prepare a sample for TEM measurement. This TEM measurement sample of titanium oxide was observed by magnifying it with a TEM to 570,000 times. The number of pixels of the particle image obtained was calculated, and the diameter of each particle was calculated from the number of pixels while converting the particle into a true circle by the following expressions [4] and [5], $$\text{True circle converted radius} = (\text{number of pixels}/\pi)^2 \quad [4], \text{ and}$$

$$\text{True circle converted diameter} = \text{true circle converted radius} \times 0.22 \times 2 \quad [5].$$

The true circle converted diameter was measured for 100 points in total (current number of points) by the above method, and the average was defined as the average particle size.

(2) X-Ray Half Width

The X-ray half width by X-ray diffraction was measured using the X-ray diffractometer (XRD)RINT-2500 (produced by Rigaku cooperation), where CuKα was a X-ray radiation source. Titanium oxide particles for measurement were applied to a substrate under the same condition as in the manufacturing of the device. The half width was obtained by X-ray diffraction measurement of the titanium oxide particles, and when the crystal form was of an anatase-type, the half width was measured from a peak of (101) face of titanium oxide particles of an anatase type (i.e., a peak appearing at 2θ of 24 to 26 degrees (around 25 degrees)). When titanium oxide particles are of a rutile-type, the half width was measured from a peak of (110) face of titanium oxide particles of a rutile type (i.e., a peak appearing at 2θ of 26 to 28 degrees (around 27 degrees)). The half width of titanium oxide particles used in the example was 0.48 degrees for AMT400, 0.29 degrees for AMT600, 1.04 degrees for TKS201, and 0.60 degrees for P90 when it was of an anatase type, and was 0.50 degrees for MT150A when it was of a rutile type.

(3) Evaluation of I-V Characteristics (Solar Cell Characteristics)

Photovoltaic characteristics were measured using a DC voltage and current supply (6241A manufactured by ADCMT) controlled by a computer (I-V measurement system manufactured by ADCMT) and a simplified solar simulator (manufactured by Abet Technologies, Inc.) to conduct evaluation of I-V characteristics. A BS-500 Si photodiode detector (for crystal Si solar cell, manufactured by Bunkoukeiki Co., Ltd., secondary standard solar cell) was used for examination of quantity of light (AM 1.5 G, 100 mW/cm$^2$).

Measurement was conducted in a state where a solar cell was fixed. A specific preparation method of a measurement sample is described referring to FIG. 7. Firstly, a solar cell 4 was placed on a metal jig 5 coated with an insulating treatment material. A silicon rubber sheet 3 of 2 mm in thickness, a quartz plate 2 of 3 mm in thickness, and a metal jig 1 (a light transmission hole for transmitting light 10 is provided in the center thereof) coated with the insulating treatment material were stacked on the solar cell in this order, and each of the four corners of the metal jigs 1 and 5 that were mutually opposed was fixed together with a screw 9.

The I-V characteristics of the solar cell were evaluated while adjusting the quantity of light so as to irradiate the solar cell with light having quantity of light of 1 sun. A conductive tape or a copper tape and a silicon crystal wafer were joined on the side of the silicon-side wafer using indium and gallium alloy paste. Then a conductive tape and a layer of titanium oxides were joined on the side of the layer of titanium oxide particles using an ITO electrode and silver paste. Terminals during I-V measurement were taken from the conductive tape.

In the present evaluation, the I-V characteristics as well as I max and V max were found. I max is current when the output of the solar cell becomes maximum, and V max is voltage when the output of the solar cell becomes maximum.

Then the short-circuit current density, the open-circuit voltage, the filling factor (FF), and the photoelectric conversion efficiency were calculated from the graph of the I-V characteristics. The short-circuit current density (Isc) is current density when voltage is 0, and the open-circuit voltage (Voc) is voltage when current is 0.

FF can be found from the following expression [6], $$FF=(V\max \cdot I\max)/(Voc \cdot Isc) \quad [6].$$

The photoelectric conversion efficiency η can be found from the following expression [7], $$\eta=(\text{output of solar cell})/100 \times 100 \quad [7].$$

The output of a solar cell can be found from the following expression [8], $$\text{Output of solar cell}=\text{short-circuit current density} \times \text{open-circuit voltage} \times FF = V\max \cdot I\max \quad [8].$$

(4) Relative Permittivity

Relative permittivity is a value measured by an impedance method while setting a measurement frequency at 1 kHz and a measurement temperature at 23° C. Specifically, the relative permittivity was found from the following expression [9] using an LCR meter (4284A PRECISION LCR METER manufactured by Agilent Technologies), $$\text{Dielectric constant of a sample}=(\text{distance between electrodes} \times \text{electrostatic capacity})/(\text{area of electrode} \times \text{dielectric constant of vacuum}) \quad [9].$$

where, the dielectric constant of vacuum is $8.854 \times 10^{-12}$ (F/m).

When the sample is liquid, the dielectric constant is measured by inserting an electrode into the liquid using a jig for measuring liquid (16452A LIQUID TEST FIXTURE manufactured by Agilent Technologies).

When the sample is solid, the dielectric constant is measured by forming a film on an electrode plate using a jig for measuring a film (16451B DIELECTRIC TEST FIXTURE manufactured by Agilent Technologies) and holding the film with one of the electrodes.

(5) Film Thickness

Film thickness of the semiconductor layer and the junction interface layer was measured by vertscan 2.0 (manufactured by Ryoka Systems Inc.). The semiconductor layer or the junction interface layer for measurement was manufactured by applying it to a substrate under the same conditions as in the manufacturing of the device. Film thickness was measured at 5 points at random of these layers, and the average calculated was defined as the average film thickness.

Film thickness of the semiconductor layer and the junction interface layer after manufacturing a solar cell was measured by cross section TEM observation or cross section SEM observation. The measurement was conducted after cutting the cross section of the solar cell by an FIB (Focused Ion Beam) method. A method for cross section SEM observation is described later in (10).

In the FIB method, Ga ions accelerated at 30 to 40 kV were focused to 0.01 to 0.1 μm, and sputtering was conducted while scanning the cross section of the solar cell. A carbon film or a tungsten film was vapor-deposited as a protection film of the outermost sputtering surface. Cross section TEM observation was conducted at 2 positions, and the film thickness was measured at 5 points with equal intervals for each position. The average value of the film thicknesses of 10 points in total was calculated, and the average was defined as the average film thickness. It was confirmed that the average film thickness obtained by the cross section TEM observation had almost the same value as the results of the above-described film thickness measurement.

(6) Spectral Sensitivity Measurement

Spectral sensitivity is measured by irradiating a solar cell with light taken out from a light source for each wavelength by a spectroscope, and measuring the output from the solar cell. External quantum efficiency is calculated from the incident light intensity and the output current. For the light source, a xenon light source (xenon lamp: L2274 produced by Hamamatsu Photonics K.K., E7536 produced by Hamamatsu Photonics K.K., C4263 produced by Hamamatsu Photonics K.K.) was used, and for the spectroscope, GRATING MONOCHROMATOR MODEL77250 produced by Oriel cooperation was used. For the driving source of the spectroscope, SHOT-204-MS, SGSP-60YAW produced by Sigmakoki Co., Ltd. was used, and FMV-C8240 produced by Fujitsu Limited was used for a control PC. Current was measured using a digital electrometer TR8652 produced by Adventest corporation. Note here that this evaluation was conducted for Example 5 only described later.

(7) Method for Measuring Film Thickness of Silicon Oxide Film

Analysis was made by forming a thin slice of silicon by focused ion beam processing (FIB processing), and directly observing the cross-sectional structure thereof using a transmission electron microscope (TEM). The microscope used here was TITAN80-300 produced by FEI company.

(8) Simple Solar Cell Evaluation (Short-Circuit Current Density, Open-Circuit Voltage)

For a xenon light-source lamp, quartz light guide was attached to XEF152S (produced by KenkoTokina Corporation), which was used as a light source of pseudo solar light. Then, voltage and current were measured by 6241A (manufactured by ADCMT) as a DC voltage and current supply, which were displayed on a PC (I-V measurement system produced by ADCMT).

Using this apparatus, change over time of short-circuit current and open-circuit voltage versus dielectric constant were measured, and power generation data on a transparent solar cell and power generation data on a flexible solar cell were obtained.

Measurement was conducted in a state where a solar cell was fixed. A specific preparation method of a measurement sample is described referring to FIG. 7. Firstly, a solar cell 4 was placed on a metal jig 5 coated with an insulating treatment material. A silicon rubber sheet 3 of 2 mm in thickness, a quartz plate 2 of 3 mm in thickness, and a metal jig 1 (a light transmission hole for transmitting light 10 is provided in the center thereof) coated with the insulating treatment material were stacked on the solar cell in this order, and each of the four corners of the metal jigs 1 and 5 that were mutually opposed was fixed together with a screw 9.

(9) Mobility

Mobility was measured by TOF (Time of flight).

Figure 8:
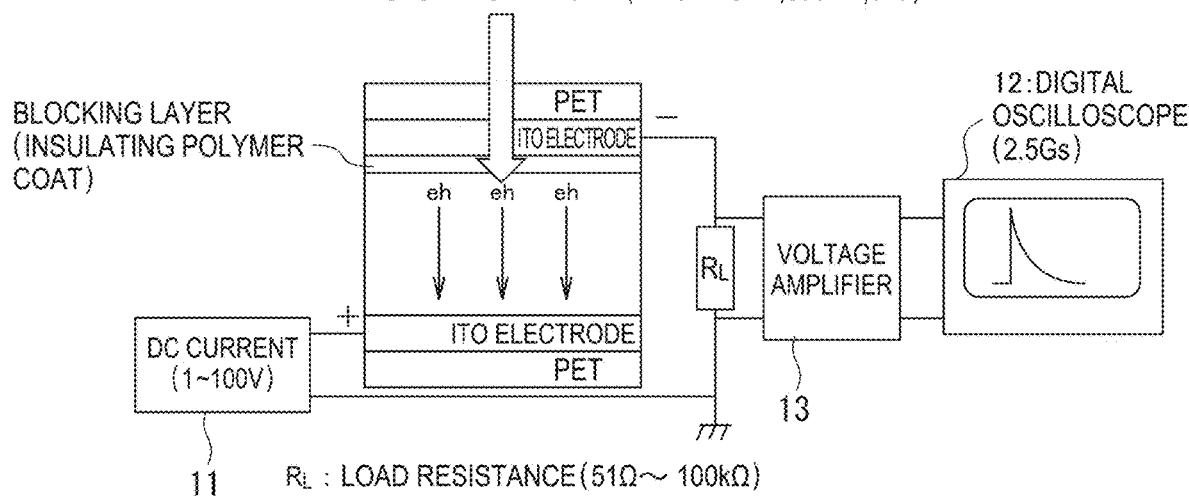
FIG. 8 schematically illustrates a TOF apparatus.

FIG. 8 schematically illustrates a TOF apparatus. The TOF apparatus was configured to apply light from a YAG laser (355 nm, pulse width 4 to 6 ns, produced by HOYA-Continuum Corporation, Type Minilite I) and measure time when excited electrons flow. The mobility was found by the following expression [10], $$\mu = L^2 / V \cdot Tr (cm^2/Vs) \quad [10].$$

where Tr denotes traveling time, L denotes distance between electrodes (thickness), V/L (applied voltage/thickness) denotes electric field applied to thin film, and μ denotes mobility (unit electric field, moving speed of electric charge per one second).

The following describes in more details. As illustrated in FIG. 8, a measurement cell and a load resistance $R_L$ were connected with a DC power supply 11 in series. Next, the measurement cell was irradiated with pulsed laser light, and change over time of voltage resulting from transient current flowing through the load resistance $R_L$ due to carrier transfer was recorded by a digital oscilloscope (produced by Tektronix Inc., type TDS3032) 12.

Data from the digital oscilloscope 12 was imported into a personal computer (PC), and the traveling time Tr was found from log-log plot of the transient current and the time. When the carrier mobility was high, a change of transient current in the time range from a few hundreds ns to a few μs was observed. At this time, when the load resistance $R_L$ is set too large, the transient current signal may be distorted because of influences by the CR time constant. Then, when the carrier mobility was high, measurement was conducted while setting the load resistance $R_L$ at 51 Ω. At this time, when the signal level on the digital oscilloscope 12 was weak, the signal from the load resistance $R_L$ was amplified by a voltage amplifier 13 for measurement.

When the carrier mobility was low, a change of transient current in the time range from a few hundreds ms to a few seconds was observed. Due to carrier transfer in a wide bandwidth, the level of the transient current signal was very small as compared with the case of high carrier mobility (when the amount of electric charge generated by photoexcitation is considered constant, the amount of electric charge flowing through unit time is current, and so the signal level will be small by several digits). In such a case, load resistance $R_L$ was increased gradually while confirming no distortion occurring in the transient current signal, and the condition was set so as to avoid the difficulty in analysis of the traveling time Tr due to influences by noise for measurement.

Measurement was conducted in a state where a device was fixed. A specific preparation method of a measurement sample is described referring to FIG. 7. Firstly, a semiconductor device instead of a solar cell 4 was placed on a metal jig 5 coated with an insulating treatment material. A silicon rubber sheet 3 of 2 mm in thickness, a quartz plate 2 of 3 mm in thickness, and a metal jig 1 (a light transmission hole for transmitting light 10 is provided in the center thereof) coated with the insulating treatment material were stacked thereon in this order, and each of the four corners of the metal jigs 1 and 5 that were mutually opposed was fixed together with a screw 9.

(10) Cross Section SEM (Scanning Electron Microscope) Image

A sample of an appropriate size was cut out, which was placed on a sample base, and an observation cross section was prepared by cooling BIB (Broad Ion Beam). This was coated with $OsO_4$ of about 1 nm in thickness for conductive processing to be a sample for microscopic examination. BIB processing was performed with the accelerated voltage of 4 kV using E-3500 (manufactured by Hitachi High-Technologies Cooperation). SEM observation was conducted using S-4800 (manufactured by Hitachi High-Technologies Cooperation) with the accelerated voltage of 1.0 kV.

(11) AC Impedance Measurement

Impedance was measured using an LCR meter 6510P (produced by Wayne Kerr Electronics) and measurement/control software produced by Toyo Corporation. The measurement frequency was 20 to 1 MHz.

Example 1

1.05 g of cyanoethyl saccharose (relative permittivity: 25) solution (adjusted to have solid content 20 mass % with 2methoxyethanol solvent) was added to 1.0 g of aqueous dispersion liquid containing titanium oxide particles (anatase type, TKS 201 produced by Tayca Corporation, solid content 33 mass %) of 6 nm in average particle size, followed by stirring to prepare mixture solution A. Meanwhile, an ITO attached PET film (produced by Aldrich Corporation, sheet resistance 60Ω/□) was washed with methanol, followed by UV ozone treatment for 10 minutes.

Next, a layer made of titanium oxide particles and cyanoethyl saccharose (titanium oxide containing layer) was formed on the ITO face of this ITO attached PET film using the mixture solution A by spin coating (2,000 rpm, 30 seconds). Then, the titanium oxide containing layer was dried at 120° C. for 10 minutes. The thickness of the titanium oxide containing layer after drying was 1 μm. The mass % of titanium oxide in the titanium oxide containing layer was (1.0×0.33)/(1.0×0.33+1.05×0.2)×100=61 mass %.

Meanwhile, a p-type silicon crystal wafer of 500 μm in thickness and with the resistivity of 3 Ω/cm was ultrasonic washed with methanol for 5 minutes. The washed silicon crystal wafer was dried, which was then bonded with the titanium oxide containing layer. During bonding, a polyester film (produced by Teraoka Seisakusho co., Ltd.) of 9 μm in thickness with a hole of 4 mmφ was inserted so that the titanium oxide containing layer and the silicon crystal wafer were brought into contact with each other at a part of the hole only. Then, an aluminum evaporated film with a hole of 2 mmφ was attached to the PET face of the ITO attached PET film (i.e., the face opposite to the ITO face) to be a mask. Thereby a solar cell 4 was manufactured.

Example 2

1.05 g of cyanoethyl saccharose solution (adjusted to have solid content 20 mass % with 2methoxyethanol solvent) was added to 1.0 g of aqueous dispersion liquid containing titanium oxide particles (anatase type, TKS 201 produced by Tayca Corporation, solid content 33 mass %) of 6 nm in average particle size, followed by stirring to prepare mixture solution A. Meanwhile, an ITO attached PET film (produced by Aldrich Corporation, sheet resistance 60Ω/□) was washed with methanol, followed by UV ozone treatment for 10 minutes.

Next, a titanium oxide containing layer was formed on the ITO face of this ITO attached PET film using the mixture solution A by spin coating (2,000 rpm, 30 seconds). Then, the titanium oxide containing layer was dried at 120° C. for 10 minutes. The thickness of the titanium oxide containing layer after drying was 1 μm. The mass % of titanium oxide in the titanium oxide containing layer was 61 mass %.

On the titanium oxide containing layer, a film was further formed using a liquid prepared by diluting cyanoethyl saccharose with 2methoxyethanol for adjustment to be 1 mass % by spin coating (2,000 rpm, 30 seconds), which was dried at 120° C. for 1 minute. The thickness of the cyanoethyl saccharose layer after drying was 20 nm.

Meanwhile, a p-type silicon crystal wafer of 500 μm in thickness and with the resistivity of 3 Ω/cm was ultrasonic washed with methanol for 5 minutes. The washed silicon crystal wafer was dried, which was then bonded with the titanium oxide containing layer coated with cyanoethyl saccharose. During bonding, a polyester film (produced by Teraoka Seisakusho co., Ltd.) of 9 μm in thickness with a hole of 4 mmφ was inserted so that the layer of cyanoethyl saccharose and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

In this Example 2, the layer of cyanoethyl saccharose was present between the silicon crystal wafer and the titanium oxide containing layer as a junction interface layer.

Example 3

1.05 g of cyanoethyl saccharose solution (adjusted to have solid content 20 mass % with 2methoxyethanol solvent) was added to 1.0 g of aqueous dispersion liquid (solid content 33 mass %) containing titanium oxide particles (anatase type, VP TiO$_2$ P90 produced by Nippon Aerosil Co., Ltd.) of 14 nm in average particle size and hydrochloric acid, followed by stirring to prepare mixture solution B. Meanwhile, an ITO attached PET film (produced by Aldrich Corporation, sheet resistance 60Ω/□) was washed with methanol, followed by UV ozone treatment for 10 minutes.

Next, a titanium oxide containing layer was formed on the ITO face of this ITO attached PET film using the mixture solution B by spin coating (2,000 rpm, 30 seconds). Then, the titanium oxide containing layer was dried at 120° C. for 10 minutes. The thickness of the titanium oxide containing layer after drying was 1.1 μm. The mass % of titanium oxide in the titanium oxide containing layer was 61 mass %.

Meanwhile, a p-type silicon crystal wafer of 500 μm in thickness and with the resistivity of 3 Ω/cm was ultrasonic washed with methanol for 5 minutes. The washed silicon crystal wafer was dried, which was then bonded with the titanium oxide containing layer. During bonding, a polyester film (produced by Teraoka Seisakusho co., Ltd.) of 9 μm in thickness with a hole of 4 mmφ was inserted so that the titanium oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 4

1.58 g of cyanoethyl saccharose solution (adjusted to have solid content 20 mass % with 2methoxyethanol solvent) was added to 1.0 g of aqueous dispersion liquid containing titanium oxide particles (anatase type, TKS 201 produced by Tayca Corporation, solid content 33 mass %) of 6 nm in average particle size, followed by stirring to prepare mixture solution C. Meanwhile, an ITO attached PET film (sheet resistance 30Ω/□, produced by Geomatec Co., Ltd.) was washed with methanol, followed by UV ozone treatment for 10 minutes.

Next, a titanium oxide containing layer was formed on the ITO face of this ITO attached PET film using the mixture solution C by spin coating (2,000 rpm, 30 seconds). The thickness of the titanium oxide containing layer was 0.7 μm. The mass % of titanium oxide in the titanium oxide containing layer was 51 mass %.

Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. The washed silicon crystal wafer was dried. Immediately after drying, this silicon crystal wafer and the ITO attached PET film were bonded so that the titanium oxide containing layer and the silicon crystal wafer came into contact with each other. During bonding, a polyester film (produced by Teraoka Seisakusho co., Ltd.) of 9 μm in thickness with a hole of 4 mmφ was inserted so that the titanium oxide containing layer and the silicon crystal wafer were brought into contact with each other at a part of the hole only. Then, an aluminum evaporated film with a hole of 2 mmφ was attached to the PET face of the ITO attached PET film (i.e., the face opposite to the ITO face) to be a mask. Thereby a solar cell 4 was manufactured.

Example 5

Titanium oxide particles (AMT400, anatase type, produced by Tayca Corporation) of 15 nm in average particle size were dispersed in 2methoxyethanol to prepare dispersion liquid having solid content of 33 mass %. Then 1.58 g of cyanoethyl saccharose solution (adjusted to have solid content 20 mass % with 2methoxyethanol solvent) was added to 1.0 g of the titanium oxide dispersion liquid, followed by stirring to prepare mixture solution D. The mixture solution D was allowed to stand for one day, and was stirred for 10 seconds immediately before spin coating. Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. Immediately after washing, a titanium oxide containing layer was formed on the surface of this silicon crystal wafer using the mixture solution D by spin coating (2,000 rpm, 30 seconds). The thickness of the titanium oxide containing layer was 1.7 μm. The mass % of titanium oxide in the titanium oxide containing layer was 51 mass %.

Next, an ITO attached PET film (sheet resistance 30Ω/□, produced by Geomatec Co., Ltd.) was washed with methanol, and the PET film after washing and the silicon crystal wafer were bonded so that the ITO face was brought into contact with the titanium oxide containing layer. During bonding, a polyester film (produced by Teraoka Seisakusho co., Ltd.) of 9 μm in thickness with a hole of 4 mmφ was inserted so that the ITO and the titanium oxide containing layer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 6

Titanium oxide particles (AMT600, anatase type, produced by Tayca Corporation) of 30 nm in average particle size were dispersed in 2methoxyethanol to prepare dispersion liquid having solid content of 33 mass %. Then 1.58 g of cyanoethyl saccharose solution (adjusted to have solid content 20 mass % with 2methoxyethanol solvent) was added to 1.0 g of the titanium oxide dispersion liquid, followed by stirring to prepare mixture solution E. The mixture solution E was allowed to stand for one day, and was stirred for 10 seconds immediately before spin coating. Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. Immediately after washing, a titanium oxide containing layer was formed on the surface of this silicon crystal wafer using the mixture solution E by spin coating (2,000 rpm, 30 seconds). The thickness of the titanium oxide containing layer was 1.8 The mass % of titanium oxide in the titanium oxide containing layer was 51 mass %.

Next, an ITO attached PET film (sheet resistance 30Ω/□, produced by Geomatec Co., Ltd.) was washed with methanol, and the ITO-attached PET film after washing and the silicon crystal wafer were bonded so that the ITO face was brought into contact with the titanium oxide containing layer. During bonding, a polyester film (produced by Teraoka Seisakusho co., Ltd.) of 9 μm in thickness with a hole of 4 mmφ was inserted so that the ITO and the titanium oxide containing layer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 7

Titanium oxide particles (MT150A, rutile type, produced by Tayca Corporation) of 15 nm in average particle size were dispersed in 2methoxyethanol to prepare dispersion liquid having solid content of 33 mass %. Then 1.58 g of cyanoethyl saccharose solution (adjusted to have solid content 20 mass % with 2methoxyethanol solvent) was added to 1.0 g of the titanium oxide dispersion liquid, followed by stirring to prepare mixture solution F. The mixture solution F was allowed to stand for one day, and was stirred for 10 seconds immediately before spin coating. Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. Immediately after washing, a titanium oxide containing layer was formed on the surface of this silicon crystal wafer using the mixture solution F by spin coating (2,000 rpm, 30 seconds). The thickness of the titanium oxide containing layer was 1.7 μm. The mass % of titanium oxide in the titanium oxide containing layer was 51 mass %.

Next, an ITO attached PET film (sheet resistance 30Ω/□, produced by Geomatec Co., Ltd.) was washed with methanol, and the ITO-attached PET film after washing and the silicon crystal wafer were bonded so that the ITO face was brought into contact with the titanium oxide containing layer. During bonding, a polyester film (produced by Teraoka Seisakusho co., Ltd.) of 9 μm in thickness with a hole of 3 mmφ was inserted so that the ITO and the titanium oxide containing layer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 8

Titanium oxide particles (AMT400, anatase type, produced by Tayca Corporation) of 15 nm in average particle size were dispersed in 2methoxyethanol to prepare dispersion liquid having solid content of 33 mass %. Then 1.58 g of cyanoethyl saccharose solution (adjusted to have solid content 6.59 mass % with 2methoxyethanol solvent) was added to 1.0 g of the titanium oxide dispersion liquid, followed by stirring to prepare mixture solution G. The mixture solution G was allowed to stand for one day, and was stirred for 10 seconds immediately before spin coating. Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. Immediately after washing, a titanium oxide containing layer was formed on the surface of this silicon crystal wafer using the mixture solution G by spin coating (2,000 rpm, 30 seconds). The thickness of the titanium oxide containing layer was 1.5 The mass % of titanium oxide in the titanium oxide containing layer was 76 mass %.

Next, an ITO attached PET film (sheet resistance 30Ω/□, produced by Geomatec Co., Ltd.) was washed with methanol, and the ITO-attached PET film after washing and the silicon crystal wafer were bonded so that the ITO face was brought into contact with the titanium oxide containing thin film. During bonding, a polyester film (produced by Teraoka Seisakusho co., Ltd.) of 9 μm in thickness with a hole of 4 mmφ was inserted so that the ITO and the titanium oxide containing thin film were brought into contact with each other at a part of the hole only. Then, an aluminum evaporated film with a hole of 2 mmφ was attached to the PET face of the ITO attached PET film to be a mask. Thereby a solar cell 4 was manufactured.

Example 9

Titanium oxide particles (AMT400, anatase type, produced by Tayca Corporation) of 15 nm in average particle size were dispersed in 2methoxyethanol to prepare dispersion liquid having solid content of 33 mass %. Then 1.58 g of cyanoethyl saccharose solution (adjusted to have solid content 20 mass % with 2methoxyethanol solvent) was added to 1.0 g of the titanium oxide dispersion liquid, followed by stirring to prepare mixture solution H. The mixture solution H was allowed to stand for one day, and was stirred for 10 seconds immediately before spin coating. Meanwhile, an ITO attached PET film (sheet resistance 30Ω/□, produced by Geomatec Co., Ltd.) was washed with methanol, followed by UV ozone treatment for 10 minutes.

Next, a titanium oxide containing layer was formed on the ITO face of this ITO attached PET film using the mixture solution H by spin coating (2,000 rpm, 30 seconds). The thickness of the titanium oxide containing layer was 1.8 μm. The mass % of titanium oxide in the titanium oxide containing layer was 51 mass %.

Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. The washed silicon wafer was dried, and immediately after drying, this silicon crystal wafer and the ITO attached PET film were bonded so that the titanium oxide containing layer and the silicon crystal wafer were brought into contact with each other. During bonding, a polyester film (produced by Teraoka Seisakusho co., Ltd.) of 9 μm in thickness with a hole of 4 mmφ was inserted so that the titanium oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 10: Manufacturing of Hetero-Junction Solar Cell Including Silicon Crystal Wafer Titanium oxide particles (MT150A, rutile type, produced by Tayca Corporation) of 15 nm in average particle size were dispersed in 2methoxyethanol to prepare dispersion liquid having solid content of 33 mass %. Then 1.58 g of glycerin (relative permittivity: 48) solution (adjusted so that the ratio of glycerin contained was 20 mass % with 2methoxyethanol solvent) was added to 1.0 g of the titanium oxide dispersion liquid, followed by stirring to prepare mixture solution I. The mixture solution I was allowed to stand for one day, and was stirred for 10 seconds immediately before spin coating. Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. Immediately after washing, a titanium oxide containing layer was formed on the surface of this silicon crystal wafer using the mixture solution I by spin coating (2,000 rpm, 30 seconds). The thickness of the titanium oxide containing layer was 1.7 The mass % of titanium oxide in the titanium oxide containing layer was 51 mass %.

Next, an ITO attached PET film (sheet resistance 30Ω/□, produced by Geomatec Co., Ltd.) was washed with methanol, and the ITO attached PET film after washing and the silicon crystal wafer were bonded so that the ITO face was brought into contact with the titanium oxide containing layer. During bonding, a polyester film (produced by Teraoka Seisakusho co., Ltd.) of 9 μm in thickness with a hole of 3 mmφ was inserted so that the ITO and the titanium oxide containing layer were brought into contact with each other at a part of the hole only. Then, an aluminum evaporated film with a hole of 2 mmφ was attached to the PET face to be a mask. Thereby a solar cell 4 was manufactured.

Example 11: Manufacturing of Solar Cell Including Silicon Crystal Wafer

A solar cell 4 was manufactured similarly to Example 6 other than that the compound having relative permittivity of 2 or more was changed from cyanoethyl saccharose to cyanoethyl polyvinyl alcohol (relative permittivity: 15). The thickness of the titanium oxide containing layer was 1.9 μm. The mass % of titanium oxide in the titanium oxide containing layer was 51 mass %.

Example 12: Manufacturing of Solar Cell Including Silicon Crystal Wafer

A solar cell 4 was manufactured similarly to Example 6 other than that the compound having relative permittivity of 2 or more was changed from cyanoethyl saccharose to glycerin (relative permittivity: 15). Note here that since glycerin is liquid, the glycerin solution was adjusted with 2methoxyethanol solvent so that the ratio of glycerin contained was 20 mass %. The thickness of the titanium oxide containing layer was 1.6 μm. The mass % of titanium oxide in the titanium oxide containing layer was 51 mass %.

Example 13: Manufacturing of Solar Cell Including Silicon Crystal Wafer

A solar cell 4 was manufactured similarly to Example 6 other than that the compound having relative permittivity of 2 or more was changed from cyanoethyl saccharose to thioglycerol (relative permittivity: 132). Note here that since glycerin is liquid, the glycerin solution was adjusted with 2methoxyethanol solvent so that the ratio of glycerin contained was 20 mass %. The thickness of the titanium oxide containing layer was 1.5 μm. The mass % of titanium oxide in the titanium oxide containing layer was 51 mass %.

Example 14

Cyanoethylated titanium oxide was synthesized. The following describes a method for synthesis in details.

250 g of acetonitrile and 25 g of titanium oxide (AMT600, produced by Tayca Corporation) were added to a four neck flask, followed by stirring at room temperatures. Subsequently, 1.3 g of aqueous potassium hydroxide that was 40 mass % was poured into the four neck flask. The internal temperature of this four neck flask was controlled at 50° C., which was stirred for 18 hours. The dispersion liquid in this four neck flask was cooled and filtered, and the residue after filtering was washed with acetone, chloroform and heptane. The residue after washing was dried under reduced pressure, whereby cyanoethylated titanium oxide was obtained. As a result of a TgDTA measurement on this cyanoethylated titanium oxide, it was found that 6 mass % of organic substance was combined with titanium oxide only.

The cyanoethylated titanium oxide particles were dispersed in 2methoxyethanol to prepare dispersion liquid having solid content of 33 mass %. Then 1.58 g of cyanoethyl saccharose solution (adjusted to have solid content 20 mass % with 2methoxyethanol solvent) was added to 1.0 g of the titanium oxide dispersion liquid, followed by stirring to prepare mixture solution Y. The mixture solution Y was allowed to stand for one day, and was stirred for 10 seconds immediately before spin coating. Meanwhile, a p-type silicon crystal wafer of 500 µm in thickness and with the resistivity of 3 Ω/cm was washed with acetone for 5 minutes, which was then immersed in 20% ammonium fluoride solution for 20 minutes, followed by washing with ultrapure water. Immediately after washing, a titanium oxide containing layer was formed on the surface of this silicon crystal wafer using the mixture solution Y by spin coating (2,000 rpm, 30 seconds). The thickness of the titanium oxide containing layer was 1.2 µm. The mass % of titanium oxide in the titanium oxide containing layer was 51 mass %.

Next, an ITO attached PET film (sheet resistance 30Ω/□, produced by Geomatec Co., Ltd.) was washed with methanol, and the PET film after washing and the silicon crystal wafer were bonded so that the ITO face was brought into contact with the titanium oxide containing layer. During bonding, a polyester film (produced by Teraoka Seisakusho co., Ltd.) of 9 µm in thickness with a hole of 4 mmφ was inserted so that the ITO and the titanium oxide containing layer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 15: Manufacturing of Hetero-Junction Solar Cell Including Silicon Crystal Wafer Titanium oxide particles (AMT400, anatase type, produced by Tayca Corporation) of 15 nm in average particle size were dispersed in 2methoxyethanol to prepare dispersion liquid having solid content of 33 mass %. Then 3.16 g of cyanoethyl saccharose solution (adjusted to have solid content 20 mass % with 2methoxyethanol solvent) was added to 1.0 g of the titanium oxide dispersion liquid, followed by stirring to prepare mixture solution Z. The mixture solution Z was allowed to stand for one day, and was stirred for 10 seconds immediately before spin coating. Meanwhile, a p-type silicon crystal wafer of 500 µm in thickness and with the resistivity of 3 Ω/cm was washed with acetone for 5 minutes, which was then immersed in 5% hydrofluoric acid solution for 5 minutes, followed by washing with ultrapure water. Immediately after washing, a titanium oxide containing layer was formed on the surface of this silicon crystal wafer using the mixture solution Z by spin coating (2,000 rpm, 30 seconds). The thickness of the titanium oxide containing layer was 1.3 µm. The mass % of titanium oxide in the titanium oxide containing layer was 34 mass %.

Next, an ITO attached PET film (sheet resistance 30Ω/□, produced by Geomatec Co., Ltd.) was washed with methanol, and the ITO attached PET film after washing and the silicon crystal wafer were bonded so that the ITO face was brought into contact with the titanium oxide containing thin film. During bonding, a polyester film (produced by Teraoka Seisakusho co., Ltd.) of 9 µm in thickness with a hole of 4 mmφ was inserted so that the ITO and the titanium oxide containing thin film were brought into contact with each other at a part of the hole only. Then, an aluminum evaporated film with a hole of 2 mmφ was attached to the PET face of the ITO attached PET film to be a mask. Thereby a solar cell 4 was manufactured.

Example 16: Manufacturing of Hetero-Junction Solar Cell Including Silicon Crystal Wafer A coating film containing titanium oxide particles (anatase type, produced by Tayca Corporation, TKS201, solid content of 33 mass %) of 6 nm in average particle size was formed by spin coating on the ITO face of an ITO attached PET film (produced by Aldrich Corporation, sheet resistance 60Ω/□). After spin coating, this coating film was dried at 120° C. for 10 minutes. On the layer of titanium oxide particles, liquid prepared by diluting cyanoethyl saccharose with 2methoxyethanol for adjustment to be 18 mass % was applied by spin coating, which was then dried at 80° C. for 30 seconds.

Meanwhile hydrofluoric acid treatment described later was conducted to a p-type silicon crystal wafer of 500 µm in thickness and with the resistivity of 3 Ωcm. The silicon crystal wafer and the ITO attached PET film coated with cyanoethyl saccharose and the layer of titanium oxide particles were bonded to form a lamination body. A solar cell was manufactured from this lamination body. After manufacturing the solar cell, the thickness of the layer of titanium oxide particles was 1,200 nm, the thickness of the layer of cyanoethyl saccharose was 150 nm, and the thickness of the silicon layer was 500 µm.

During bonding, a polyester film (produced by Teraoka Seisakusho co., Ltd.) of 9 µm in thickness with a hole of 4 mmφ was inserted so that the junction interface layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

[Hydrofluoric Acid Treatment]:

The aforementioned p-type silicon crystal wafer was washed with acetone to remove dirt on the surface of the wafer, which was then immersed in 5% hydrofluoric acid solution for 5 minutes, followed by washing with ultrapure water. Subsequently, it was washed with methanol. After washing, this silicon crystal wafer was dried at room temperatures under vacuum for 1 hour.

Example 17: Manufacturing of Hetero-Junction Solar Cell Including Silicon Crystal Wafer A solar cell was manufactured similarly to Example 1 other than that titanium oxide particles (anatase type, produced by Nippon Aerosil Co., Ltd, VPTiO2 P90, solid content of 20 mass %) of 14 nm in average particle size was used. The thickness of the layer of titanium oxide particles after manufacturing of the solar cell was 900 nm, the thickness of the layer of cyanoethyl saccharose was 150 nm, and the thickness of the silicon layer was 500 µm.

Example 18: Manufacturing of Solar Cell Including Silicon Crystal Wafer

A coating film was formed on an ITO attached PET film (produced by Aldrich Corporation, sheet resistance 60Ω/□) using titanium oxide particles dispersion liquid of 6 nm in average particle size (anatase type, produced by Tayca Corporation, TKS201, solid content of 33 mass %) by spin coating. After spin coating, this coating film was dried at 120° C. for 10 minutes. On the layer of titanium oxide particles, liquid prepared by diluting cyanoethyl saccharose with 2methoxyethanol for adjustment so that the content of cyanoethyl saccharose (relative permittivity 25) was 18 mass % was applied by spin coating (number of revolutions was 2,500 rpm), which was then dried at 120° C. for 1 minute.

Meanwhile nitric acid treatment described later was conducted to a p-type silicon crystal wafer of 500 μm in thickness and with the resistivity of 3 Ω/cm. Hydrofluoric acid treatment described later was further conducted to the face serving as a pn junction face only. The face of the silicon crystal wafer subjected to the hydrofluoric acid treatment and the layer of cyanoethyl saccharose were bonded, whereby a solar cell was manufactured.

Figure 7:
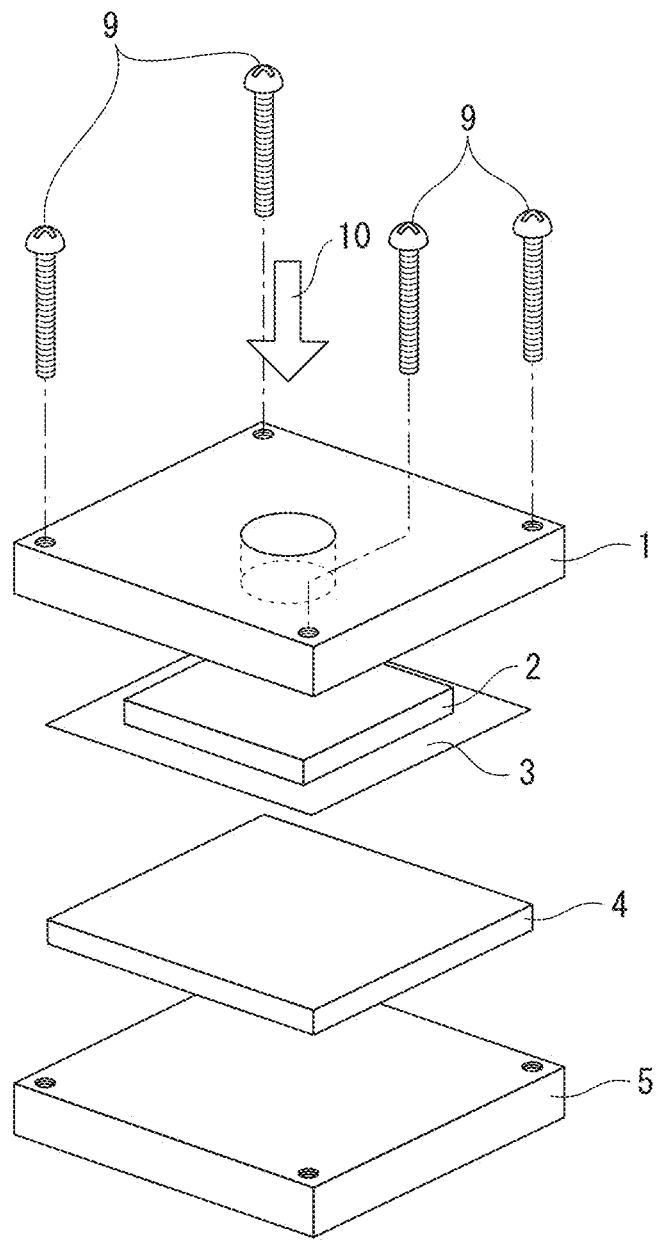
FIG. 7 illustrates a specific preparation method for a solar cell evaluation sample in the examples.

The solar cell was fixed using a jig as illustrated in FIG. 7. The silicon oxide film on the face of the silicon crystal wafer facing an electrode had a thickness of 2.9 nm. The thickness of the titanium oxide layer was 1,500 nm, and the thickness of the cyanoethyl saccharose layer was 150 nm.

During bonding, a polyester film (produced by Teraoka Seisakusho co., Ltd.) of 9 μm in thickness with a hole of 4 mmφ was inserted so that the junction interface layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

[Nitric Acid Treatment]:

A silicon crystal wafer was washed with acetone to remove dirt on the wafer surface, which was then immersed in 5% hydrofluoric acid solution for 5 minutes, followed by washing with ultrapure water. Subsequently, this was immersed in hot concentrated nitric acid at 113° C. for 10 minutes. Then this was washed with ultrapure water.

[Hydrofluoric Acid Treatment]:

A protective film was attached to one side of a silicon crystal wafer, which was then immersed in 5% hydrofluoric acid solution for 5 minutes, followed by washing with ultrapure water. Subsequently, this was washed with methanol.

Example 19: Manufacturing of Solar Cell Including Silicon Crystal Wafer 0.25 g of cyanoethyl saccharose (relative permittivity: 25) solution (adjusted to have solid content 20 mass % with 2methoxyethanol solvent) was added to 1.0 g of aqueous dispersion liquid containing titanium oxide particles (anatase type, TKS 201 produced by Tayca Corporation, solid content 33 mass %) of 6 nm in average particle size, followed by stirring to prepare mixture solution J. Meanwhile, an ITO attached PET film (produced by Aldrich Corporation, sheet resistance 60Ω/□) was washed with methanol, followed by UV ozone treatment for 10 minutes.

Next, a layer made of titanium oxide particles and cyanoethyl saccharose (titanium oxide containing layer) was formed on the ITO face of this ITO attached PET film using the mixture solution J by spin coating (2,000 rpm, 30 seconds). Subsequently, the titanium oxide containing layer was dried at 120° C. for 10 minutes. The thickness of the titanium oxide containing layer after drying was 0.8 μm.

Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. The washed silicon crystal wafer was kept in a vacuum desiccator. The silicon crystal wafer taken out of the vacuum desiccator and the titanium oxide containing layer were bonded. During bonding, a polyester film (produced by Teraoka Seisakusho co., Ltd.) of 9 μm in thickness with a hole of 4 mmφ was inserted so that the titanium oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 20: Manufacturing of Solar Cell Including Silicon Crystal Wafer 0.53 g of cyanoethyl saccharose (relative permittivity: 25) solution (adjusted to have solid content 20 mass % with 2methoxyethanol solvent) was added to 1.0 g of aqueous dispersion liquid (anatase type, TKS 201 produced by Tayca Corporation, solid content 33 mass %) containing titanium oxide particles of 6 nm in average particle size, followed by stirring to prepare mixture solution K. Meanwhile, an ITO attached PET film (produced by Aldrich Corporation, sheet resistance 60Ω/□) was washed with methanol, followed by UV ozone treatment for 10 minutes.

Next, a layer made of titanium oxide particles and cyanoethyl saccharose (titanium oxide containing layer) was formed on the ITO face of this ITO attached PET film using the mixture solution K by spin coating (2,000 rpm, 30 seconds). Subsequently, the titanium oxide containing layer was dried at 120° C. for 10 minutes. The thickness of the titanium oxide containing layer after drying was 0.8 μm.

Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. The washed silicon crystal wafer was kept in a vacuum desiccator. The silicon crystal wafer taken out of the vacuum desiccator and the titanium oxide containing layer were bonded. During bonding, a polyester film (produced by Teraoka Seisakusho co., Ltd.) of 9 μm in thickness with a hole of 4 mmφ was inserted so that the titanium oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 21: Manufacturing of Solar Cell Including Silicon Crystal Wafer 1.58 g of cyanoethyl saccharose (relative permittivity: 25) solution (adjusted to have solid content 20 mass % with 2methoxyethanol solvent) was added to 1.0 g of aqueous dispersion liquid containing titanium oxide particles (anatase type, TKS 201 produced by Tayca Corporation, solid content 33 mass %) of 6 nm in average particle size, followed by stirring to prepare mixture solution L. Meanwhile, an ITO attached PET film (produced by Aldrich Corporation, sheet resistance 60Ω/□) was washed with methanol, followed by UV ozone treatment for 10 minutes.

Next, a layer made of titanium oxide particles and cyanoethyl saccharose (titanium oxide containing layer) was formed on the ITO face of this ITO attached PET film using the mixture solution L by spin coating (2,000 rpm, 30 seconds). Subsequently, the titanium oxide containing layer was dried at 120° C. for 10 minutes. The thickness of the titanium oxide containing layer after drying was 0.7 μm.

Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. The washed silicon crystal wafer was kept in a vacuum desiccator. The silicon crystal wafer taken out of the vacuum desiccator and the titanium oxide containing layer were bonded. During bonding, a polyester film (produced by Teraoka Seisakusho co., Ltd.) of 9 μm in thickness with a hole of 4 mmφ was inserted so that the titanium oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 22: Manufacturing of Solar Cell Including Silicon Crystal Wafer 1.58 g of cyanoethyl saccharose (relative permittivity: 25) solution (adjusted to have solid content 20 mass % with 2methoxyethanol solvent) was added to 1.0 g of aqueous dispersion liquid (anatase type, TKS 201 produced by Tayca Corporation, solid content 33 mass %) containing titanium oxide particles of 6 nm in average particle size, followed by stirring to prepare mixture solution M. Meanwhile, an ITO attached PET film (produced by Geomatec Co., Ltd., sheet resistance 30Ω/□) was washed with methanol, followed by UV ozone treatment for 10 minutes.

Next, a layer made of titanium oxide particles and cyanoethyl saccharose (titanium oxide containing layer) was formed on the ITO face of this ITO attached PET film using the mixture solution M by spin coating (2,000 rpm, 30 seconds). Subsequently, the titanium oxide containing layer was dried at 120° C. for 10 minutes. The thickness of the titanium oxide containing layer after drying was 0.7 μm.

Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. The washed silicon crystal wafer was kept in a vacuum desiccator. The silicon crystal wafer taken out of the vacuum desiccator and the titanium oxide containing layer were bonded. During bonding, a polyester film (produced by Teraoka Seisakusho co., Ltd.) of 9 μm in thickness with a hole of 4 mmφ was inserted so that the titanium oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 23: Manufacturing of Solar Cell Including Silicon Crystal Wafer 2.02 g of cyanoethyl saccharose (relative permittivity: 25) solution (adjusted to have solid content 20 mass % with 2methoxyethanol solvent) was added to 1.0 g of aqueous dispersion liquid (anatase type, TKS 201 produced by Tayca Corporation, solid content 33 mass %) containing titanium oxide particles of 6 nm in average particle size, followed by stirring to prepare mixture solution N. Meanwhile, an ITO attached PET film (produced by Geomatec Co., Ltd., sheet resistance 30Ω/□) was washed with methanol, followed by UV ozone treatment for 10 minutes.

Next, a layer made of titanium oxide particles and cyanoethyl saccharose (titanium oxide containing layer) was formed on the ITO face of this ITO attached PET film using the mixture solution N by spin coating (2,000 rpm, 30 seconds). Subsequently, the titanium oxide containing layer was dried at 120° C. for 10 minutes. The thickness of the titanium oxide containing layer after drying was 0.6 μm.

Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. The washed silicon crystal wafer was kept in a vacuum desiccator. The silicon crystal wafer taken out of the vacuum desiccator and the titanium oxide containing layer were bonded. During bonding, a polyester film (produced by Teraoka Seisakusho co., Ltd.) of 9 μm in thickness with a hole of 4 mmφ was inserted so that the titanium oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 24: Manufacturing of Solar Cell Including Silicon Crystal Wafer 3.16 g of cyanoethyl saccharose (relative permittivity: 25) solution (adjusted to have solid content 20 mass % with 2methoxyethanol solvent) was added to 1.0 g of aqueous dispersion liquid containing titanium oxide particles (anatase type, TKS 201 produced by Tayca Corporation, solid content 33 mass %) of 6 nm in average particle size, followed by stirring to prepare mixture solution O. Meanwhile, an ITO attached PET film (produced by Aldrich Corporation, sheet resistance 60Ω/□) was washed with methanol, followed by UV ozone treatment for 10 minutes.

Next, a layer made of titanium oxide particles and cyanoethyl saccharose (titanium oxide containing layer) was formed on the ITO face of this ITO attached PET film using the mixture solution O by spin coating (2,000 rpm, 30 seconds). Subsequently, the titanium oxide containing layer was dried at 120° C. for 10 minutes. The thickness of the titanium oxide containing layer after drying was 0.6 μm.

Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. The washed silicon crystal wafer was kept in a vacuum desiccator. The silicon crystal wafer taken out of the vacuum desiccator and the titanium oxide containing layer were bonded. During bonding, a polyester film (produced by Teraoka Seisakusho co., Ltd.) of 9 μm in thickness with a hole of 4 mmφ was inserted so that the titanium oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 25: Manufacturing of Solar Cell Including Silicon Crystal Wafer 0.27 g of cyanoethyl saccharose (relative permittivity: 25) solution (adjusted to have solid content 40 mass % with 2methoxyethanol solvent) was added to 1.0 g of aqueous dispersion liquid containing zinc oxide particles (produced by Aldrich Corporation, product number: 721077, solid content 50 mass %) of 100 nm or less in average particle size, followed by stirring to prepare mixture solution P. Meanwhile, an ITO attached PET film (produced by Aldrich Corporation, sheet resistance 60Ω/□) was washed with methanol, followed by UV ozone treatment for 10 minutes.

Next, a layer made of zinc oxide particles and cyanoethyl saccharose (zinc oxide containing layer) was formed on the ITO face of this ITO attached PET film using the mixture solution P by spin coating (2,000 rpm, 30 seconds). Subsequently, the zinc oxide containing layer was dried at 120° C. for 10 minutes. The thickness of the zinc oxide containing layer after drying was 0.5 μm.

Meanwhile, a p-type silicon crystal wafer of 500 μm in thickness and with the resistivity of 3 Ω/cm was washed with acetone for 5 minutes, which was then immersed in 20% ammonium fluoride solution for 20 minutes, followed by washing with ultrapure water. After washing, the dried silicon crystal wafer and the zinc oxide containing layer were bonded. During bonding, a polyester film (produced by Teraoka Seisakusho co., Ltd.) of 9 μm in thickness with a hole of 4 mmφ was inserted so that the zinc oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 26: Manufacturing of Solar Cell Including Silicon Crystal Wafer 0.82 g of cyanoethyl saccharose (relative permittivity: 25) solution (adjusted to have solid content 40 mass % with 2methoxyethanol solvent) was added to 1.0 g of aqueous dispersion liquid containing zinc oxide particles (produced by Aldrich Corporation, product number: 721077, solid content 50 mass %) of 100 nm or less in average particle size, followed by stirring to prepare mixture solution Q. Meanwhile, an ITO attached PET film (produced by Aldrich Corporation, sheet resistance 60Ω/□) was washed with methanol, followed by UV ozone treatment for 10 minutes.

Next, a layer made of zinc oxide particles and cyanoethyl saccharose (zinc oxide containing layer) was formed on the ITO face of this ITO attached PET film using the mixture solution Q by spin coating (2,000 rpm, 30 seconds). Subsequently, the zinc oxide containing layer was dried at 120° C. for 10 minutes. The thickness of the zinc oxide containing layer after drying was 0.4 μm.

Meanwhile, a p-type silicon crystal wafer of 500 μm in thickness and with the resistivity of 3 Ω/cm was washed with acetone for 5 minutes, which was then immersed in 20% ammonium fluoride solution for 20 minutes, followed by washing with ultrapure water. After washing, the dried silicon crystal wafer and the zinc oxide containing layer were bonded. During bonding, a polyester film (produced by Teraoka Seisakusho co., Ltd.) of 9 μm in thickness with a hole of 4 mmφ was inserted so that the zinc oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 27: Manufacturing of Solar Cell Including Silicon Crystal Wafer 1.37 g of cyanoethyl saccharose (relative permittivity: 25) solution (adjusted to have solid content 40 mass % with 2methoxyethanol solvent) was added to 1.0 g of aqueous dispersion liquid containing zinc oxide particles (produced by Aldrich Corporation, product number: 721077, solid content 50 mass %) of 100 nm or less in average particle size, followed by stirring to prepare mixture solution R. Meanwhile, an ITO attached PET film (produced by Aldrich Corporation, sheet resistance 60Ω/□) was washed with methanol, followed by UV ozone treatment for 10 minutes.

Next, a layer made of zinc oxide particles and cyanoethyl saccharose (zinc oxide containing layer) was formed on the ITO face of this ITO attached PET film using the mixture solution R by spin coating (2,000 rpm, 30 seconds). Subsequently, the zinc oxide containing layer was dried at 120° C. for 10 minutes. The thickness of the zinc oxide containing layer after drying was 0.4 μm.

Meanwhile, a p-type silicon crystal wafer of 500 μm in thickness and with the resistivity of 3 Ω/cm was washed with acetone for 5 minutes, which was then immersed in 20% ammonium fluoride solution for 20 minutes, followed by washing with ultrapure water. After washing, the dried silicon crystal wafer and the zinc oxide containing layer were bonded. During bonding, a polyester film (produced by Teraoka Seisakusho co., Ltd.) of 9 μm in thickness with a hole of 4 mmφ was inserted so that the zinc oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 28: Manufacturing of Transparent Solar Cell Including Nickel Oxide 1.58 g of cyanoethyl saccharose (relative permittivity: 25) solution (adjusted to have solid content 20 mass % with 2methoxyethanol solvent) was added to 1.0 g of aqueous dispersion liquid containing titanium oxide particles (anatase type, TKS 201 produced by Tayca Corporation, solid content 33 mass %) of 6 nm in average particle size, followed by stirring to prepare mixture solution S. Meanwhile, an ITO attached PET film (produced by Geomatec Co., Ltd., sheet resistance 30Ω/□) was washed with methanol, followed by UV ozone treatment for 10 minutes.

Next, a layer made of titanium oxide particles and cyanoethyl saccharose (titanium oxide containing layer) was formed on the ITO face of this ITO attached PET film using the mixture solution S by spin coating (2,000 rpm, 30 seconds). Subsequently, the titanium oxide containing layer was dried at 120° C. for 10 minutes. The thickness of the titanium oxide containing layer after drying was 0.7 μm.

Meanwhile 100 nm of a nickel oxide film was formed on the ITO face of an ITO attached PET film (produced by Geomatec Co., Ltd., sheet resistance 30Ω/□) by a sputter (RF magnetron sputter, not heated as film formation temperature, 5 mmTorr as film formation pressure). Then, the ITO attached PET film with the titanium oxide containing layer formed thereon and the ITO attached PET film with the nickel oxide film formed thereon were bonded so that nickel oxide and the titanium oxide containing layer were brought into contact with each other. After bonding, the both sides were fixed with Kapton tape. The electrode was directly attached to the ITO by pinching it with a crocodile clip so as to perform a simplified evaluation on the solar cell including nickel oxide and the titanium oxide containing layer.

Example 29

Titanium oxide particles (AMT400, anatase type, produced by Tayca Corporation) of 15 nm in average particle size were dispersed in 2methoxyethanol to prepare dispersion liquid having solid content of 4.6 mass %. Then 1.58 g of PVDF solution (adjusted to have solid content 4 mass % with NMP solvent) was added to 1.0 g of the titanium oxide dispersion liquid, followed by stirring to prepare mixture solution T. The mixture solution T was allowed to stand for one day, and was stirred for 10 seconds immediately before spin coating. Meanwhile, a p-type silicon crystal wafer of 500 μm in thickness and with the resistivity of 3 Ω/cm was washed with acetone for 5 minutes, which was then immersed in 20% ammonium fluoride solution for 20 minutes, followed by washing with ultrapure water. Immediately after washing, a titanium oxide containing layer was formed on the surface of this silicon crystal wafer using the mixture solution T by spin coating (2,000 rpm, 30 seconds). The thickness of the titanium oxide containing layer was 0.2 μm.

Next, an ITO attached PET film (sheet resistance 30Ω/□, produced by Geomatec Co., Ltd.) was washed with methanol, and the ITO-attached PET film and the silicon crystal wafer were bonded so that the ITO face was brought into contact with the titanium oxide containing layer. During bonding, a polyester film (produced by Teraoka Seisakusho co., Ltd.) of 9 μm in thickness with a hole of 4 mmφ was inserted so that the ITO and the titanium oxide containing layer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 30

Titanium oxide particles (AMT400, anatase type, produced by Tayca Corporation) of 15 nm in average particle size were dispersed in 2methoxyethanol to prepare dispersion liquid having solid content of 33 mass %. Then 1.58 g of cyanoethyl polyvinyl alcohol solution (adjusted to have solid content 20 mass % with 2methoxyethanol solvent) was added to 1.0 g of the titanium oxide dispersion liquid, followed by stirring to prepare mixture solution U. The mixture solution U was allowed to stand for one day, and was stirred for 10 seconds immediately before spin coating. Meanwhile, a p-type silicon crystal wafer of 500 μm in thickness and with the resistivity of 3 Ω/cm was washed with acetone for 5 minutes, which was then immersed in 20% ammonium fluoride solution for 20 minutes, followed by washing with ultrapure water. Immediately after washing, a titanium oxide containing layer was formed on the surface of this silicon crystal wafer using the mixture solution U by spin coating (2,000 rpm, 30 seconds). The thickness of the titanium oxide containing layer was 1.5 μm.

Next, an ITO attached PET film (sheet resistance 30Ω/□, produced by Geomatec Co., Ltd.) was washed with methanol, and the ITO-attached PET film and the silicon crystal wafer were bonded so that the ITO face was brought into contact with the titanium oxide containing layer. During bonding, a polyester film (produced by Teraoka Seisakusho co., Ltd.) of 9 μm in thickness with a hole of 4 mmφ was inserted so that the ITO and the titanium oxide containing layer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 31

Titanium oxide particles (AMT400, anatase type, produced by Tayca Corporation) of 15 nm in average particle size were dispersed in 2methoxyethanol to prepare dispersion liquid having solid content of 33 mass %. Then 1.58 g of cyanoethyl saccharose solution (adjusted to have solid content 20 mass % with 2methoxyethanol solvent) was added to 1.0 g of the titanium oxide dispersion liquid, followed by stirring to prepare mixture solution V. The mixture solution V was allowed to stand for one day, and was stirred for 10 seconds immediately before spin coating. Meanwhile, a p-type silicon crystal wafer of 500 μm in thickness and with the resistivity of 3 Ω/cm was washed with acetone for 5 minutes, which was then immersed in 20% ammonium fluoride solution for 20 minutes, followed by washing with ultrapure water.

Immediately after washing, a titanium oxide containing layer was formed on the surface of this silicon crystal wafer using the mixture solution V by spin coating (2,000 rpm, 30 seconds). The thickness of the titanium oxide containing layer was 1.6 μm.

Next, an ITO attached PET film (sheet resistance 30Ω/□, produced by Geomatec Co., Ltd.) was washed with methanol, and then the ITO attached PET film and the silicon crystal wafer were bonded so that the ITO face was brought into contact with the titanium oxide containing layer. During bonding, a polyester film (produced by Teraoka Seisakusho co., Ltd.) of 9 μm in thickness with a hole of 4 mmφ was inserted so that the ITO and the titanium oxide containing layer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 32

Titanium oxide particles (AMT400, anatase type, produced by Tayca Corporation) of 15 nm in average particle size were dispersed in 2methoxyethanol to prepare dispersion liquid having solid content of 33 mass %. Then 1.58 g of glycerin solution (adjusted to have glycerin content of 20 mass % with 2methoxyethanol solvent) was added to 1.0 g of the titanium oxide dispersion liquid, followed by stirring to prepare mixture solution W. The mixture solution W was allowed to stand for one day, and was stirred for 10 seconds immediately before spin coating. Meanwhile, a p-type silicon crystal wafer of 500 μm in thickness and with the resistivity of 3 Ω/cm was washed with acetone for 5 minutes, which was then immersed in 20% ammonium fluoride solution for 20 minutes, followed by washing with ultrapure water. Immediately after washing, a titanium oxide containing layer was formed on the surface of this silicon crystal wafer using the mixture solution W by spin coating (2,000 rpm, 30 seconds). The thickness of the titanium oxide containing layer was 1.5 μm.

Next, an ITO attached PET film (sheet resistance 30Ω/□, produced by Geomatec Co., Ltd.) was washed with methanol, and then the ITO attached PET film and the silicon crystal wafer were bonded so that the ITO face was brought into contact with the titanium oxide containing layer. During bonding, a polyester film (produced by Teraoka Seisakusho co., Ltd.) of 9 μm in thickness with a hole of 4 mmφ was inserted so that the ITO and the titanium oxide containing layer were brought into contact with each other at a part of the hole only. Then, an aluminum evaporated film with a hole of 2 mmφ was attached to the PET face of the ITO attached PET film to be a mask. Thereby a solar cell 4 was manufactured.

Example 33

Titanium oxide particles (AMT400, anatase type, produced by Tayca Corporation) of 15 nm in average particle size were dispersed in 2methoxyethanol to prepare dispersion liquid having solid content of 33 mass %. Then 1.58 g of thioglycerol solution (adjusted to have thioglycerol content of 20 mass % with 2methoxyethanol solvent) was added to 1.0 g of the titanium oxide dispersion liquid, followed by stirring to prepare mixture solution X. The mixture solution X was allowed to stand for one day, and was stirred for 10 seconds immediately before spin coating. Meanwhile, a p-type silicon crystal wafer of 500 μm in thickness and with the resistivity of 3 Ω/cm was washed with acetone for 5 minutes, which was then immersed in 20% ammonium fluoride solution for 20 minutes, followed by washing with ultrapure water. Immediately after washing, a titanium oxide containing layer was formed on the surface of this silicon crystal wafer using the mixture solution X by spin coating (2,000 rpm, 30 seconds). The thickness of the titanium oxide containing layer was 1.5 μm.

Next, an ITO attached PET film (sheet resistance 30Ω/□, produced by Geomatec Co., Ltd.) was washed with methanol, and then the ITO attached PET film and the silicon crystal wafer were bonded so that the ITO face was brought into contact with the titanium oxide containing layer. During bonding, a polyester film (produced by Teraoka Seisakusho co., Ltd.) of 9 μm in thickness with a hole of 4 mmφ was inserted so that the ITO and the titanium oxide containing layer were brought into contact with each other at a part of the hole only. Then, an aluminum evaporated film with a hole of 2 mmφ was attached to the PET face of the ITO attached PET film to be a mask. Thereby a solar cell 4 was manufactured.

Comparative Example 1

A coating film containing titanium oxide particles was formed using aqueous dispersion liquid containing titanium oxide particles (anatase type, VP $TiO_2$ P90 produced by Nippon Aerosil Co., Ltd.) of 14 nm in average particle size and hydrochloric acid by spin coating on the ITO face of an ITO attached PET film (produced by Aldrich Corporation, sheet resistance 60Ω/□). After spin coating, this coating film was dried at 120° C. for 10 minutes. The thickness of the layer made of titanium oxide particles after drying was 1.1 μm.

On this layer of titanium oxide particles, a film was further formed using liquid prepared by diluting cyanoethyl saccharose with 2methoxyethanol for adjustment so that the content of cyanoethyl saccharose was 0.1 mass % by spin coating, which was then dried at 120° C. for 1 minute. The thickness of the cyanoethyl saccharose layer was 20 nm.

Meanwhile, a p-type silicon crystal wafer of 500 μm in thickness and with the resistivity of 3 Ω/cm was washed with methanol. After washing, the dried silicon crystal wafer and the layer made of titanium oxide particles coated with cyanoethyl saccharose were bonded, whereby a solar cell was manufactured. During bonding, a polyester film (produced by Teraoka Seisakusho co., Ltd.) of 9 μm in thickness with a hole of 4 mmφ was inserted so that the zinc oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Comparative Example 2

A coating film containing titanium oxide particles was formed using aqueous dispersion liquid containing titanium oxide particles (anatase type, VP $TiO_2$ P90 produced by Nippon Aerosil Co., Ltd.) of 14 nm in average particle size and hydrochloric acid by spin coating on the ITO face of an ITO attached PET film (produced by Aldrich Corporation, sheet resistance 60Ω/□). After spin coating, this coating film was dried at 120° C. for 10 minutes. The thickness of the layer made of titanium oxide particles after drying was 1.1 μm.

Meanwhile, a p-type silicon crystal wafer of 500 μm in thickness and with the resistivity of 3 Ω/cm was washed with methanol. After washing, the dried silicon crystal wafer and the layer made of titanium oxide particles were bonded, whereby a solar cell was manufactured. During bonding, a polyester film (produced by Teraoka Seisakusho co., Ltd.) of 9 μm in thickness with a hole of 4 mmφ was inserted so that the titanium oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Comparative Example 3: Manufacturing of Hetero-Junction Solar Cell Including Silicon Crystal Wafer Liquid prepared by diluting cyanoethyl saccharose with acetone to be 2 mass % was applied by spin coating on a p-type silicon crystal wafer subjected to the above-stated hydrofluoric acid treatment of 500 μm in thickness and with the resistivity of 3 Ωm, which was dried at 80° C. for 30 seconds. On the cyanoethyl saccharose layer, a film of titanium oxide was formed by a sputter (substrate temperature 100° C.). On the sputtered titanium oxide layer, an ITO film was formed by a sputter (substrate temperature 100° C.) to form a lamination body. A solar cell was manufactured using this lamination body. After manufacturing the solar cell, the thickness of the layer of titanium oxide particles was 200 nm, the thickness of the layer of cyanoethyl saccharose was 20 nm, and the thickness of the silicon layer was 500 μm.

Comparative Example 4: Manufacturing of Hetero-Junction Solar Cell Including Silicon Crystal Wafer A coating film was formed on the ITO face of an ITO attached PET film (produced by Aldrich Corporation, sheet resistance 60Ω/□) using titanium oxide particles dispersion liquid of 6 nm in average particle size (anatase type, produced by Tayca Corporation, TKS201, solid content of 33 mass %) by spin coating. After spin coating, this coating film was dried at 120° C. for 10 minutes. On the layer of titanium oxide particles, liquid prepared by diluting cyanoethyl saccharose with 2methoxyethanol for adjustment so that the content of cyanoethyl saccharose was 18 mass % was applied by spin coating (number of revolutions was 2,500 rpm), which was then dried at 120° C. for 1 minute.

Then a p-type silicon crystal wafer of 500 μm in thickness and with the resistivity of 3 Ω/cm and the layer of cyanoethyl saccharose were bonded, whereby a solar cell was manufactured. The solar cell was fixed using a jig as illustrated in FIG. 7. The silicon oxide film on the face of the silicon crystal wafer facing an electrode had a thickness of 0.8 nm. The thickness of the titanium oxide layer was 1,500 nm, and the thickness of the cyanoethyl saccharose layer was 150 nm.

During bonding, a polyester film (produced by Teraoka Seisakusho co., Ltd.) of 9 μm in thickness with a hole of 4 mmφ was inserted so that the titanium oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Comparative Example 5: Manufacturing of Hetero-Junction Solar Cell Including Silicon Crystal Wafer An ITO attached PET film (produced by Geomatec Co., Ltd., sheet resistance 30Ω/□) was washed with methanol, followed by UV ozone treatment for 10 minutes. Next, a layer made of titanium oxide particles was formed on the ITO face of this ITO attached PET film using aqueous dispersion liquid containing titanium oxide particles (anatase type, produced by Tayca Corporation, TKS201, solid content of 33 mass %) of 6 nm in average particle size by spin coating (2,000 rpm, 30 seconds). Subsequently, the thus formed layer was dried at 120° C. for 10 minutes. The thickness of the titanium oxide containing layer after drying was 0.9 μm.

Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. The washed silicon crystal wafer was kept in a vacuum desiccator. The silicon crystal wafer taken out of the vacuum desiccator and the titanium oxide containing layer were bonded. During bonding, a polyester film (produced by Teraoka Seisakusho co., Ltd.) of 9 μm in thickness with a hole of 4 mmφ was inserted so that the titanium oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Comparative Example 6: Manufacturing of Hetero-Junction Solar Cell Including Silicon Crystal Wafer An ITO attached PET film (produced by Aldrich Corporation, sheet resistance 60Ω/□) was washed with methanol, followed by UV ozone treatment for 10 minutes. Next, a layer made of zinc oxide particles was formed on the ITO face of this ITO attached PET film using aqueous dispersion liquid containing zinc oxide particles (produced by Aldrich Corporation, product number: 721077, solid content 50 mass %) of 100 nm or less in average particle size by spin coating (2,000 rpm, 30 seconds). Subsequently, the thus formed layer was dried at 120° C. for 10 minutes. The thickness of the zinc oxide layer after drying was 0.5 μm.

Meanwhile, a p-type silicon crystal wafer of 500 μm in thickness and with the resistivity of 3 Ω/cm was washed with acetone for 5 minutes, which was then immersed in 20% ammonium fluoride solution for 20 minutes, followed by washing with ultrapure water. After washing, the dried silicon crystal wafer and the zinc oxide containing layer were bonded. During bonding, a polyester film (produced by Teraoka Seisakusho co., Ltd.) of 9 μm in thickness with a hole of 4 mmφ was inserted so that the zinc oxide containing layer and the silicon crystal wafer were brought into contact with each other at a part of the hole only. Then, an aluminum evaporated film with a hole of 2 mmφ was attached to the PET face of the ITO attached PET film to be a mask. Thereby a solar cell 4 was manufactured.

Comparative Example 7

Titanium oxide particles (AMT400, anatase type, produced by Tayca Corporation) of 15 nm in average particle size were dispersed in 2methoxyethanol to prepare titanium oxide dispersion liquid having solid content of 33 mass %. The titanium oxide dispersion liquid was allowed to stand for one day, and was stirred for 10 seconds immediately before spin coating. Meanwhile, a p-type silicon crystal wafer of 500 μm in thickness and with the resistivity of 3 Ω/cm was washed with acetone for 5 minutes, which was then immersed in 20% ammonium fluoride solution for 20 minutes, followed by washing with ultrapure water. Immediately after washing, a titanium oxide layer was formed on the surface of this silicon crystal wafer using the titanium oxide dispersion liquid by spin coating (2,000 rpm, 30 seconds). The thickness of the titanium oxide layer was 1.5 μm.

Next, an ITO attached PET film (sheet resistance 30Ω/□, produced by Geomatec Co., Ltd.) was washed with methanol, and then the ITO attached PET film and the silicon crystal wafer were bonded so that the ITO face was brought into contact with the titanium oxide layer. During bonding, a polyester film (produced by Teraoka Seisakusho co., Ltd.) of 9 μm in thickness with a hole of 4 mmφ was inserted so that the ITO and the titanium oxide containing layer were brought into contact with each other at a part of the hole only. Then, an aluminum evaporated film with a hole of 2 mmφ was attached to the PET face of the ITO attached PET film to be a mask. Thereby a solar cell 4 was manufactured.

Comparative Example 8

Titanium oxide particles (AMT400, anatase type, produced by Tayca Corporation) of 15 nm in average particle size were dispersed in 2methoxyethanol to prepare titanium oxide dispersion liquid having solid content of 33 mass %. The titanium oxide dispersion liquid was allowed to stand for one day, and was stirred for 10 seconds immediately before spin coating. Meanwhile, a p-type silicon crystal wafer of 500 μm in thickness and with the resistivity of 3 Ω/cm was washed with acetone for 5 minutes, which was then immersed in 5% hydrofluoric acid solution for 5 minutes, followed by washing with ultrapure water. Immediately after washing, a titanium oxide layer was formed on the surface of this silicon crystal wafer using the titanium oxide dispersion liquid by spin coating (2,000 rpm, 30 seconds). The thickness of the titanium oxide layer was 1.5 μm.

Next, an ITO attached PET film (sheet resistance 60Ω/□, produced by Geomatec Co., Ltd.) was washed with methanol, and then the ITO attached PET film and the silicon crystal wafer were bonded so that the ITO face was brought into contact with the titanium oxide layer. During bonding, a polyester film (produced by Teraoka Seisakusho co., Ltd.) of 9 μm in thickness with a hole of 4 mmφ was inserted so that the ITO and the titanium oxide containing layer were brought into contact with each other at a part of the hole only. Then, an aluminum evaporated film with a hole of 2 mmφ was attached to the PET face of the ITO attached PET film to be a mask. Thereby a solar cell 4 was manufactured.

<Evaluations of Solar Cell Characteristics>

Table 1 illustrates the result of evaluations of Examples 1 to 15 and Comparative Examples 1, 2, 5 and 8. As can be found from this evaluations result, it was confirmed that the mixture layer of a compound having relative permittivity of 2 or more and metal oxide particles leads to great improvement of characteristics of the solar cells (performance).

TABLE 1

| | \<n-type semiconductor layer\> | | | | | | |
|---|---|---|---|---|---|---|---|
| | Junction interface layer included? | Compound having relative permittivity of 2 or more included? | Titanium oxide particle size (nm) | Crystal type | Thickness (μm) | mass % of titanium oxide in titanium oxide containing layer | Substrate for titanium oxide containing layer |
| Ex. 1 | — | Yes | 6 | anatase | 1 | 61 | ITO |
| Ex. 2 | Yes | Yes | 6 | anatase | 1 | 61 | ITO |
| Ex. 3 | — | Yes | 14 | anatase | 1.1 | 61 | ITO |
| Ex. 4 | — | Yes | 6 | anatase | 0.7 | 51 | ITO |
| Ex. 5 | — | Yes | 15 | anatase | 1.7 | 51 | silicon |
| Ex. 6 | — | Yes | 30 | anatase | 1.8 | 51 | silicon |
| Ex. 7 | — | Yes | 15 | rutile | 1.7 | 51 | silicon |
| Ex. 8 | — | Yes | 15 | anatase | 1.5 | 76 | silicon |
| Ex. 9 | — | Yes | 15 | anatase | 1.8 | 51 | ITO |
| Ex. 10 | — | Yes | 15 | rutile | 1.7 | 51 | silicon |
| Ex. 11 | — | Yes | 30 | anatase | 1.9 | 51 | silicon |
| Ex. 12 | — | Yes | 30 | anatase | 1.6 | 51 | silicon |
| Ex. 13 | — | Yes | 30 | anatase | 1.5 | 51 | silicon |
| Ex. 14 | — | Yes | 30 | anatase | 1.2 | 51 | silicon |
| Ex. 15 | — | Yes | 15 | anatase | 1.3 | 34 | silicon |
| Comp. Ex. 1 | Yes | — | 14 | anatase | 1.1 | 100 | ITO |
| Comp. Ex. 2 | — | — | 14 | anatase | 1.1 | 100 | ITO |
| Comp. Ex. 5 | — | — | 6 | anatase | 0.9 | 100 | ITO |
| Comp. Ex. 8 | — | — | 15 | anatase | 1.5 | 100 | silicon |

| | ITO attached PET film sheet resistance (Ω/□) | Immediately preceding washing with hydrofluoric acid or ammonium fluoride done? | Solar cell characteristics | | | |
|---|---|---|---|---|---|---|
| | | | Short-circuit current density mA/cm$^2$ | Open-circuit voltage V | FF | Conversion efficiency % |
| Ex. 1 | 60 | No | 34.2 | 0.46 | 0.19 | 2.9 |
| Ex. 2 | 60 | No | 34.3 | 0.44 | 0.18 | 2.8 |
| Ex. 3 | 60 | No | 33.1 | 0.40 | 0.22 | 2.9 |
| Ex. 4 | 30 | Yes | 36.0 | 0.56 | 0.50 | 10.1 |
| Ex. 5 | 30 | Yes | 35.7 | 0.55 | 0.67 | 13.0 |
| Ex. 6 | 30 | Yes | 30.7 | 0.51 | 0.67 | 10.4 |
| Ex. 7 | 30 | Yes | 36.0 | 0.53 | 0.64 | 11.5 |
| Ex. 8 | 30 | Yes | 26.5 | 0.50 | 0.61 | 8.0 |
| Ex. 9 | 30 | Yes | 29.5 | 0.57 | 0.70 | 11.6 |
| Ex. 10 | 30 | Yes | 30.5 | 0.51 | 0.66 | 10.3 |
| Ex. 11 | 30 | Yes | 31.7 | 0.55 | 0.36 | 6.2 |
| Ex. 12 | 30 | Yes | 30.5 | 0.50 | 0.52 | 8.0 |
| Ex. 13 | 30 | Yes | 31.4 | 0.44 | 0.54 | 7.4 |
| Ex. 14 | 30 | Yes | 35.6 | 0.49 | 0.64 | 11.2 |
| Ex. 15 | 30 | Yes | 34.7 | 0.53 | 0.57 | 10.3 |
| Comp. Ex. 1 | 60 | No | 18.7 | 0.39 | 0.23 | 1.7 |
| Comp. Ex. 2 | 60 | No | 19.5 | 0.30 | 0.21 | 1.2 |
| Comp. Ex. 5 | 60 | Yes | 12.3 | 0.39 | 0.20 | 0.9 |
| Comp. Ex. 8 | 60 | Yes | 3.6 | 0.32 | 0.33 | 0.3 |

Figure 9:
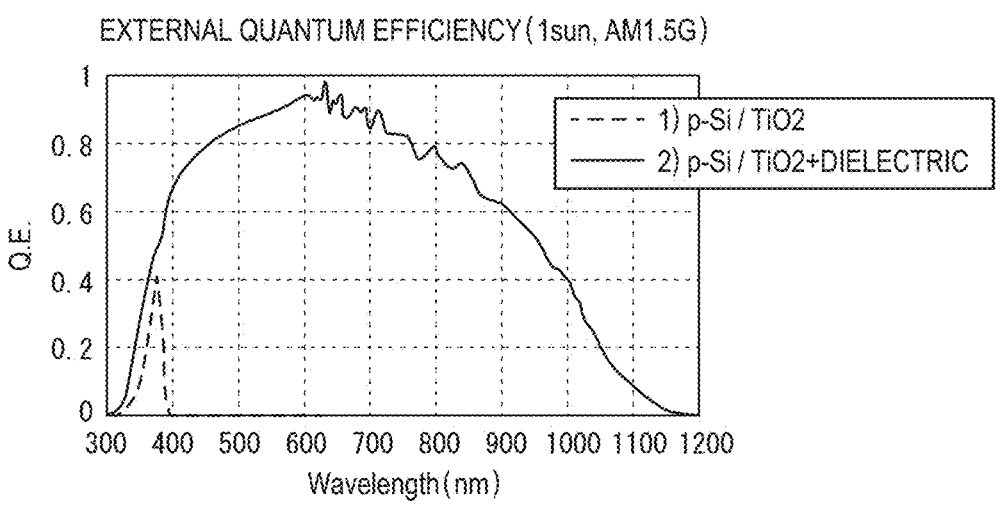
FIG. 9 illustrates the result of measurements of spectral sensitivity in the examples.

FIG. 9 illustrates the result of measurements of spectral sensitivity. In FIG. 9, the horizontal axis represents the wavelength of light incident on a solar cell, and the vertical axis represents the quantum efficiency (Q.E.).

In FIG. 9, 2)p-Si/TiO$_2$+ dielectric indicates the evaluation of a solar cell manufactured in Example 5. For comparison, 1)p-Si/TiO$_2$ indicates the evaluation of a solar cell manufactured similarly to Example 5 other than that the mixture solution AA was used instead of the mixture solution D.

As illustrated in FIG. 9, whereas 2)p-Si/TiO$_2$+ dielectric generates electricity for light up to 1,100 nm, 1)p-Si/TiO$_2$ generates light for ultraviolet light only and does not generate electricity in the visible light region. Although titanium oxide exerts photoconductivity when it is irradiated with ultraviolet rays and conveys carriers, it does not convey carries when it is not irradiated with ultraviolet rays. Therefore 1)p-Si/TiO$_2$ cannot take out current through photoelectric conversion in the visible light region. On the contrary, in the case of 2)p-Si/TiO$_2$+ dielectric, titanium oxides thereof convey carries in the region where ultraviolet rays are not applied as well. It was confirmed from this result that the compound having relative permittivity of 2 or more can control the state of electrons on the surface of titanium oxide particles, which leads to favorable sensitivity in the visible light region as well.

Mixture solution AA: Titanium oxide particles (AMT400, anatase type, produced by Tayca Corporation) of 15 nm in average particle size were dispersed in 2methoxyethanol to prepare dispersion liquid having solid content of 33 mass %. Then 1.58 g of 2methoxyethanol solvent was added to 1.0 g of the titanium oxide dispersion liquid, followed by stirring to prepare mixture solution AA.

Next Table 2 illustrates the result of evaluations of Examples 16, 17 and Comparative Example 3. These solar cells had a cell structure substantially similar to that illustrated in FIG. 4. I-V characteristics of these solar cells were adjusted for measurement so that each solar cell was irradiated with light having a quantity of light of 1 sun. For both of Examples 16, 17 and Comparative Example 3, a conductive tape and a silicon crystal wafer were joined using indium and gallium alloy paste on the side of the silicon crystal wafer. On the side of the layer of titanium oxide particles (titanium oxide layer), a conductive tape and a layer made of titanium oxide particles (titanium oxide layer) were joined using an ITO electrode and Ag paste. A terminal during I-V measurement was taken from the conductive tape.

As illustrated in Table 2, it was found that the system including titanium oxide particles having crystallinity in the range specified by the present invention had improved short-circuit current density and high optoelectronic conversion efficiency.

Next Table 3 illustrates the result of evaluations on solar cells of Example 18 and Comparative Example 4. I-V characteristics of these solar cells were adjusted for measurement so that each solar cell was irradiated with light having a quantity of light of 1 sun. For both of Example 18 and Comparative Example 4, a small amount of indium and gallium alloy paste was applied to the end face of the wafer on the side of the silicon crystal wafer for joining of a conductive tape and the silicon crystal wafer. On the side of the layer of titanium oxide particles, a conductive tape was attached to the ITO electrode, and the ITO electrode and the conductive tape were joined using Ag paste. A terminal during I-V measurement was taken from the conductive tape.

TABLE 3

| Thickness of silicon oxide film (nm) | Short-circuit current density (mA/cm$^2$) | Open-circuit voltage (V) | FF | Photoelectric conversion efficiency (%) |
|---|---|---|---|---|
| Ex. 18 | 2.9 | 32.8 | 0.54 | 0.33 | 5.8 |
| Comp. Ex. 4 | 0.8 | 30.9 | 0.5 | 0.29 | 4.5 |

As illustrated in Table 3, when a silicon oxide film of 1 nm or more in thickness was present between the layer made of silicon and the electrode, their short-circuit current density, open-circuit voltage, and FF were improved, and their photoelectronic conversion efficiency was large.

Next Table 4 illustrates the result of evaluations on the solar cells of Examples 19 to 24 and Comparative Example 5. These devices were manufactured and evaluated under the same conditions. I-V characteristics of these solar cells were adjusted for measurement so that each solar cell was irradiated with light having a quantity of light of 1 sun. For both of Examples 19 to 24 and Comparative Example 5, a small amount of indium and gallium alloy paste was applied to the end face of the wafer on the side of the silicon crystal wafer for joining of a conductive tape and the silicon crystal wafer. The conductive tape was attached to the edge side. On the side of the layer of titanium oxide particles, a conductive tape was attached to the ITO electrode, and the ITO electrode and the conductive tape were joined using Ag paste. A terminal during I-V measurement was taken from the conductive tape.

TABLE 2

| Type of titanium oxide | Crystal type | Primary particle size | X-ray half width of titanium oxide | Short-circuit current density (mA/cm$^2$) | Open-circuit voltage (V) | FF | Conversion efficiency (%) |
|---|---|---|---|---|---|---|---|
| Ex. 16 | anatase | 6 | 1.04° | 35 | 0.46 | 0.31 | 5 |
| Ex. 17 | anatase | 14 | 0.6° | 26 | 0.41 | 0.21 | 2.2 |
| Comp. Ex. 3 | — | — | — | 1 | 0.18 | 0.19 | 0.04 |

TABLE 4

| | n-type semiconductor layer | | | | mass % of organic compound (dielectric) in titanium oxide containing layer | ITO attached PET film sheet resistance (Ω/□) | solar cell characteristics | | | |
|---|---|---|---|---|---|---|---|---|---|---|
| | Compound having relative permittivity of 2 or more included? | Titanium oxide particle size (nm) | Crystal type | Thickness (μm) | | | Short-circuit current density mA/cm$^2$ | Open-circuit voltage V | FF | Conversion efficiency % |
| Ex. 19 | Yes | 6 | anatase | 0.8 | 13 | 60 | 24.7 | 0.51 | 0.29 | 3.6 |
| Ex. 20 | Yes | 6 | anatase | 0.8 | 24 | 60 | 21.7 | 0.53 | 0.34 | 3.9 |
| Ex. 21 | Yes | 6 | anatase | 0.7 | 49 | 60 | 30.0 | 0.58 | 0.34 | 6.0 |
| Ex. 22 | Yes | 6 | anatase | 0.7 | 49 | 30 | 33.1 | 0.53 | 0.47 | 8.3 |
| Ex. 23 | Yes | 6 | anatase | 0.6 | 55 | 30 | 34.5 | 0.58 | 0.43 | 8.5 |
| Ex. 24 | Yes | 6 | anatase | 0.6 | 66 | 60 | 31.3 | 0.52 | 0.39 | 6.4 |
| Comp. Ex. 5 | — | 6 | anatase | 0.9 | — | 60 | 12.3 | 0.39 | 0.20 | 0.9 |

It was found that a solar cell including a compound having relative permittivity of 2 or more that was mixed more had favorable characteristics. It was found that especially a solar cell including an organic compound having relative permittivity of 2 or more mixed that is 10 mass % or more and 70 mass % or less had favorable characteristics.

Next Table 5 illustrates the result of evaluations on the solar cell of Examples 25 to 27 and Comparative Example 6. These devices were manufactured and evaluated under the same conditions. I-V characteristics of these solar cells were adjusted for measurement so that each solar cell was irradiated with light having a quantity of light of 1 sun. For both of Examples 25 to 27 and Comparative Example 6, a small amount of indium and gallium alloy paste was applied to the end face of the wafer on the side of the silicon crystal wafer for joining of a conductive tape and the silicon crystal wafer. The conductive tape was attached to the edge side. On the side of the layer of titanium oxide particles, a conductive tape was attached to the ITO electrode, and the ITO electrode and the conductive tape were joined using Ag paste. A terminal during I-V measurement was taken from the conductive tape. It was confirmed from this result that the performance of a solar cell improves when zinc oxide as a composite is used as semiconductor as well. In this way, it was found that the present technique is versatile, which is not limited to specific oxides. It was found that, in the case of zinc oxides as well, a solar cell including a compound having relative permittivity of 2 or more that is 10 mass % or more and 60 mass % or less had favorable characteristics.

TABLE 5

| | n-type semiconductor layer | | | Organic compound (dielectric) in zinc oxide containing layer | ITO attached PET film sheet resistance (Ω/□) | solar cell characteristics | | | |
|---|---|---|---|---|---|---|---|---|---|
| | Compound having relative permittivity of 2 or more included? | Zinc oxide particle size (nm) | Thickness (μm) | | | Short-circuit current density mA/cm$^2$ | Open-circuit voltage V | FF | Conversion efficiency % |
| Ex. 25 | Yes | 100 or less | 0.5 | 17.8 | 60 | 28.6 | 0.40 | 0.39 | 4.5 |
| Ex. 26 | Yes | 100 or less | 0.4 | 39.6 | 60 | 28.9 | 0.48 | 0.59 | 8.1 |
| Ex. 27 | Yes | 100 or less | 0.4 | 52.3 | 60 | 35.3 | 0.51 | 0.42 | 7.5 |
| Comp. Ex. 6 | — | 100 or less | 0.5 | 0 | 60 | 17.8 | 0.25 | 0.24 | 1.0 |

<Simplified Evaluations of Solar Cells (Transparent Solar Cells)>

Using the evaluation system (i.e., the bonded solar cell and the simplified evaluation device of solar cells as stated above), a transparent solar cell of Example 28 was checked whether it was driven as a battery.

Figure 10A:
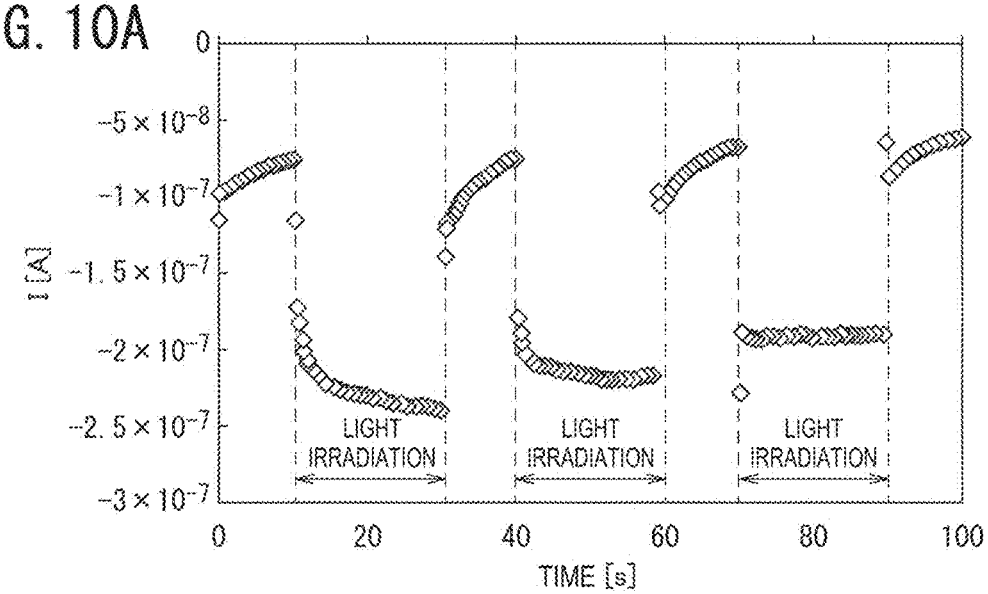
FIGS. 10A and 10B illustrate the evaluation result of power generation by a solar cell in Example 28 and a photo thereof.
Figure 10B:

FIG. 10A and FIG. 10B illustrate the result of evaluation on power generation by a solar cell manufactured in Example 28, and a photo indicating that this solar cell was a transparent solar cell. In FIGS. 10A and 10B, the horizontal axis represents irradiation time of pseudo solar light, and the vertical axis represents the current value output from the solar cell, which is a result of repetition of ON and OFF of light irradiation at regular time intervals.

As illustrated in FIG. 10A, it was found that the solar cell of Example 28 generated power in spite that it was transparent. In FIG. 10B the photo is of the solar cell in Example 28 that was actually taken, indicating that letters written on a sheet placed below the solar cell can be seen clearly through the solar cell (that is, transparent). This solar cell was made of a film, which was a flexible solar cell. It was confirmed that the solar cell generated power even when it was bent 5 times at the angle of 35°.

<Simplified Evaluations of Solar Cells (Change Over Time of Short-Circuit Current Density)>

Figure 11:
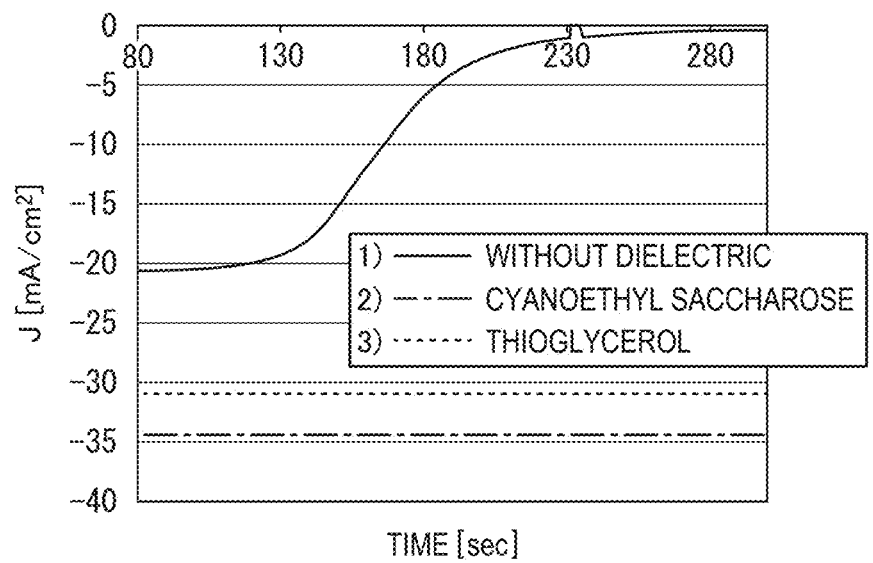
FIG. 11 illustrates the measurement result of change over time in short-circuit current density in the examples.

FIG. 11 illustrates the result of measurement on a change over time of short-circuit current density. In FIG. 11, the horizontal axis represents the elapsed time from starting of the irradiation with pseudo solar light, and the vertical axis represents short-circuit current density. In FIG. 11, 2) Cyanoethyl saccharose indicates the evaluation of a solar cell manufactured in Example 5. 3) Thioglycerol indicates the evaluation of a solar cell that was manufactured by a method similar to Example 5 other than that thioglycerol was used as the compound having relative permittivity of 2 or more. 1) Without dielectric indicates the evaluation of a solar cell for comparison that was manufactured similar to Example 5 other than that titanium oxide only was dispersed in 2methoxyethanol, and dispersion liquid of 33 mass % was applied to a silicon crystal wafer.

It was found that in the case of 1) Without dielectric, although the short-circuit current density increased immediately after starting of light irradiation, the short-circuit current density decreased with time after that, and finally it became close to 0. On the contrary, in the case of 2) Cyanoethyl saccharose and 3) Thioglycerol, a decrease in short-circuit current density was not found other than immediately after starting of light irradiation. Such a phenomenon was not found even when cyanoethyl saccharose was changed to glycerin. It is estimated from this that, in the case of titanium oxide only, carries are deactivated because of influences from defects and surrounding oxygen, whereas a dielectric having relative permittivity of 2 or more contained can suppress them. It was confirmed from this result that the system introducing a dielectric as in Example 5 (cyanoethyl saccharose, thioglycerol) hardly changes in short-circuit current density over time, and so a more stable solar cell can be manufactured.

<Simplified Evaluations of Solar Cells (Short-Circuit Current Density and Open-Circuit Voltage)>

Table 6 illustrates values of short-circuit current density and open-circuit voltage of Examples 29 to 33 and Comparative Example 7.

TABLE 6

| | Dielectric | Relative permittivity | Short-circuit current density mA/cm$^2$ | Voltage V |
|---|---|---|---|---|
| Ex. 29 | PVDF | 8 | 33 | 0.44 |
| Ex. 30 | Cyanoethyl polyvinyl alcohol | 15 | 30 | 0.49 |
| Ex. 31 | Cyanoethyl saccharose | 25 | 36 | 0.52 |
| Ex. 32 | Glycerin | 48 | 34 | 0.5 |
| Ex. 33 | Thioglycerol | 132 | 35 | 0.45 |
| Comp. Ex. 7 | none (air) | 1 | 0.2 | 0.34 |

Figure 12:
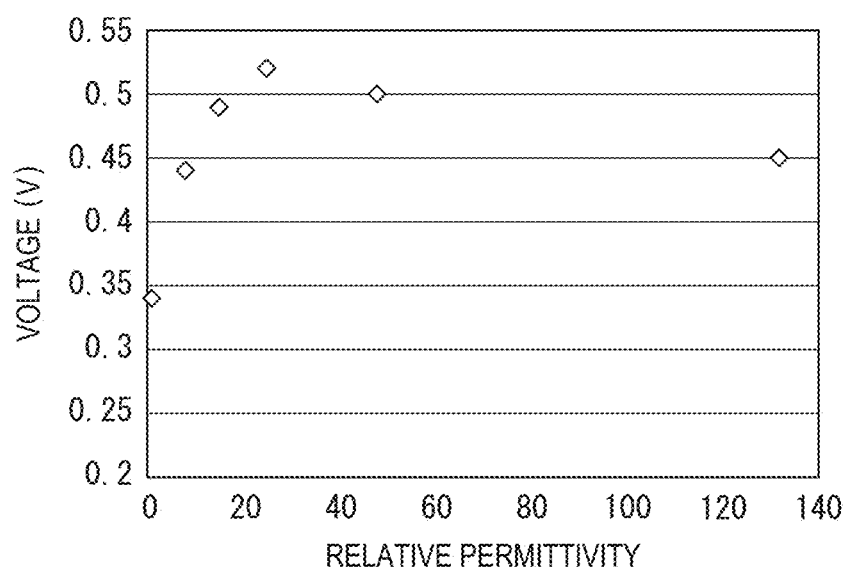
FIG. 12 is a drawing in which the relationship between relative permittivity of dielectrics in the examples and the open-circuit voltage of the solar cells is plotted.

FIG. 12 is a drawing in which the relationship between relative permittivity of dielectrics in Table 6 and the open-circuit voltage of solar cells is plotted. In FIG. 12, the horizontal axis represents relative permittivity, and the vertical axis represents open-circuit voltage. As illustrated in FIG. 12, it was found that the open-circuit voltage was high when the relative permittivity was 3 or more and 200 or less. It was further found that the open-circuit voltage was the maximum when the relative permittivity was 10 or more and 50 or less. Since the open-circuit voltage is a value resulting from recombination of carriers, the effect of suppressing recombination can be expected when the relative permittivity is 3 to 200.

Mobility Measurement

Example 34

Firstly, titanium oxide AMT400 (produced by Tayca Corporation) was dispersed in 2methoxyethanol to prepare dispersion liquid of titanium oxide having solid content of 33 mass %. Next, sucrose was mixed with 2methoxyethanol to prepare solution of 20 mass %. 2.01 g of the solution was added to 1 g of the titanium oxide dispersion liquid, followed by stirring for 10 minutes. After stirring, the solution was allowed to stand for one day, whereby application liquid was obtained.

An ITO attached glass substrate (10Ω/□) was washed with acetone, which was UV ozone treated. Two layers of Kapton tape (50 μm thickness) were attached to both faces of this ITO attached glass substrate for guard. The application liquid was dropped on the ITO face of the ITO attached glass substrate, which was made thinner along the guard using a glass rod, followed by drying of solvent at room temperatures. Thereafter, this was dried using a hot plate at 120° C. for 2 minutes, whereby an ITO substrate having a semiconductor layer was obtained.

Next, the following describes manufacturing of a blocking layer. 50 mg of acetylcellulose (produced by Aldrich Corporation, containing 38.8 mass % of acetyl, average Mn=30,000) was measured, to which 2methoxyethanol was added to be 1 g, whereby solution of 5 mass % was prepared. Using this solution, a film was formed by spin coating (2,000 rpm, 30 seconds) on the ITO face of an ITO attached PET substrate (produced by Aldrich Corporation, 60Ω/□). After spin coating, this ITO attached PET substrate was placed on a hot plate for drying at 80° C. for 20 seconds. The thickness of acetylcellulose was 232 nm.

The ITO substrate having a semiconductor layer and the ITO substrate having a blocking layer were bonded, which was fixed by an aluminum plate, whereby a device was obtained.

Examples 35 to 37

Devices were obtained by a method similar to Example 30 other than that organic compounds described in Table 7 were used instead of sucrose.

Example 38

Firstly, titanium oxide AMT400 (produced by Tayca Corporation) was dispersed in 2methoxyethanol to prepare dispersion liquid of titanium oxide having solid content of 33 mass %. Next, glycerin was mixed with 2methoxyethanol to prepare solution of 20 mass %. 1.601 g of the solution was added to 1 g of the titanium oxide dispersion liquid, followed by stirring for 10 minutes. After stirring, the solution was allowed to stand for one day, whereby application liquid was obtained.

An ITO attached glass substrate (10Ω/□) was washed with acetone, which was UV ozone treated. Two layers of Kapton tape (50 μm thickness) were attached to both faces of this ITO attached glass substrate for guard. The application liquid was dropped on the ITO face of the ITO attached glass substrate, which was made thinner along the guard using a glass rod, followed by drying of solvent at room temperatures. Thereafter, the ITO-attached glass substrate was placed on a hot plate for drying at 120° C. for 2 minutes, whereby an ITO substrate having a semiconductor layer was obtained.

Next, the following describes manufacturing of a blocking layer. 30 mg of polystyrene (produced by ACROS ORGANIC Corporation) was measured, to which toluene was added to be 1 g, whereby solution of 3 mass % was prepared. Using this solution, a film was formed by spin coating (2,000 rpm, 30 seconds) on the ITO face of an ITO attached PET substrate (produced by Aldrich Corporation, 60Ω/□). After spin coating, this ITO attached PET substrate was placed on a hot plate for drying at 80° C. for 20 seconds. The thickness of polystyrene was 217 nm.

The ITO substrate having a semiconductor layer and the ITO substrate having a blocking layer were bonded, which was fixed by an aluminum plate, whereby a device was obtained.

Example 39

A device was obtained by a method similar to Example 38 other than that thioglycerol was used instead of glycerin.

Comparative Example 9

A device was obtained by a method similar to Example 34 other than that the application liquid included titanium oxide dispersion liquid only. The blocking layer included acetylcellulose.

<Evaluations on mobility>

Figure 21:
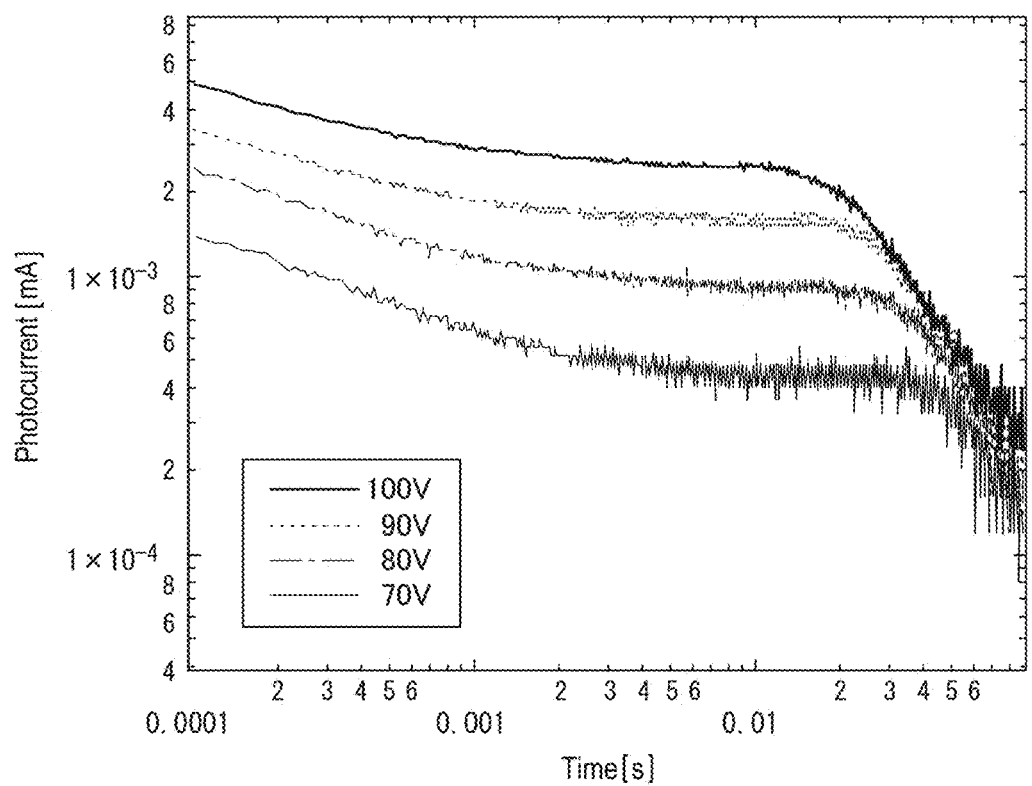
FIG. 21 illustrates the measurement of traveling time (Tr) using the device of Comparative Example 8.

FIGS. 15 to 20 illustrate the measurements of traveling time (Tr) using the devices of Examples 34 to 39, and FIG. 21 illustrates the measurement of traveling time (Tr) using the device of Comparative Example 9. In these drawings of FIGS. 15 to 21, the horizontal axis represents elapsed time on a logarithmic scale (Time, units are seconds(s)), and the vertical axis represents photocurrent (units are milliampere (mA)) on a logarithmic scale. Mobility was evaluated based on such Tr. Table 7 illustrates the result. As is found from Table 7, the present inventors found that the mobility improves when organic compound is mixed in titanium oxide dispersion liquid. It was found from this result that mixture of organic compound having relative permittivity of 3 or more and 200 or less improves the mobility. Another result was found such that relative permittivity of 10 or more and 50 or less leads to the highest mobility. This result indicates that the present invention is effective for semiconductor devices as well, and is preferable for transistor devices or the like. This is effective for solar cells as well because it relates to a decrease in serial resistance, for example.

Example 40 Flexible Solar Cell

A p-type silicon wafer (3 Ωcm) was pulverized in ethanol solvent in a mortar. The thus prepared liquid was stirred, and was filtered with a nylon mesh with openings of 37 μm while removing large particles sank early, whereby silicon particles (residue after filtering) of 37 μm or more and 150 μm or less were obtained. To these silicon particles, three times its volume of glycerin/ethanol solution (containing 20 mass % of glycerin) was added, followed by stirring for 5 minutes to obtain application liquid. This application liquid was dropped on SUS foil, and was made thinner using a glass rod. Thereafter, this thinner application liquid was heated at 150° C. for 3 minutes to remove ethanol. Next, the film of silicon particles and glycerin was coated with 20 mass % of cyanoethyl polyvinyl alcohol (2methoxyethanol), which was heated at 150° C. for 1 minute to remove 2methoxyethanol. The total film thickness of this film after removing 2methoxyethanol was 500 μm.

Next, 1.58 g of cyanoethyl saccharose solution (adjusted to have solid content 20 mass % with 2methoxyethanol solvent) was added to 1 g of titanium oxide dispersion liquid (TKS 201 produced by Tayca Corporation, 33 mass %), followed by stirring to prepare application liquid BB. An ITO attached PET film (produced by Aldrich Corporation, sheet resistance 60Ω/□) was washed with methanol, followed by UV ozone treatment for 10 minutes. Next, a layer made of titanium oxide particles and dielectric was formed using the application liquid BB on the ITO face of the PET film subjected to this UV ozone treatment by spin coating (2,000 rpm, 30 seconds). Subsequently, this PET film was annealed at 120° C. for 10 minutes, so that 2methoxyethanol and water were removed from the thus prepared layer.

Figure 22:
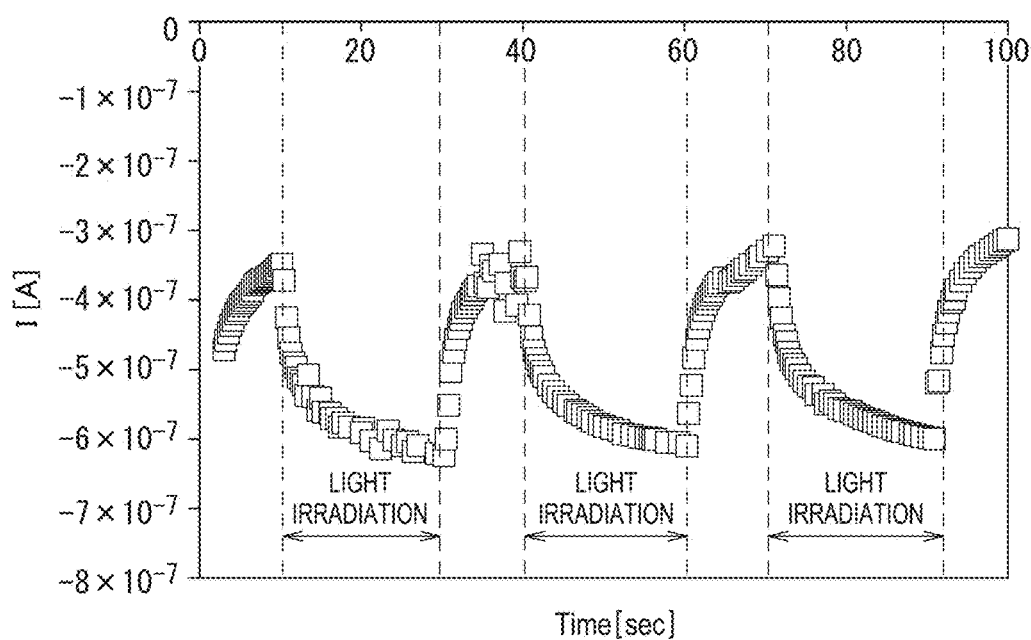
FIG. 22 illustrates the evaluation result of power generation by a solar cell in Example 40.

Next, the PET film was bonded so that the dielectric face on the silicon particles side and the composite film of titanium oxide and the dielectric faced each other. The bonded one was fixed with Kapton tape. A test to bend this device at the angle of 35° was repeated 5 times, and a change in current value with and without light irradiation was measured by the simplified solar cell evaluation. The light irradiation area of 1.2 cmφ was measured. FIG. 22 illustrates the measurement result. In FIG. 22, the horizontal axis represents the irradiation time with pseudo solar light, and the vertical axis represents current values output from the solar cell, which is a result of repetition of ON and OFF of light irradiation at regular time intervals. It was found from

TABLE 7

|  | Titanium oxide dispersion liquid (33 mass %) | Organic compound (20 mass %) | | | Blocking layer | Titanium oxide/dielectric composite film thickness (μm) | mobility (cm$^2$/Vs) |
|---|---|---|---|---|---|---|---|
|  |  | Sample name | Amount (g) | Relative permittivity |  |  |  |
| Ex. 34 | 1 g | Sucrose | 2.01 | 3 | Acetylcellulose | 24.8 | 5.2E−06 |
| Ex. 35 | 1 g | Cyanoethyl polyvinyl alcohol | 1.396 | 15 | Acetylcellulose | 19.1 | 8.4E−04 |
| Ex. 36 | 1 g | Cyanoethyl pullulan | 1.599 | 19 | Acetylcellulose | 52.9 | 4.5E−03 |
| Ex. 37 | 1 g | Cyanoethyl saccharose | 1.561 | 25 | Acetylcellulose | 44.4 | 1.7E−02 |
| Ex. 38 | 1 g | Glycerin | 1.601 | 48 | Polystyrene | 44.5 | 2.0E−05 |
| Ex. 39 | 1 g | Thioglycerol | 1.58 | 132 | Polystyrene | 21.4 | 3.1E−07 |
| Comp. Ex. 9 | 1 g | — |  |  | Acetylcellulose | 10.6 (titanium oxide only) | 6.2E−08 |

FIG. 22 that the solar cell could generate power even when it underwent the bending test.

<SEM Image>

Figure 13A:
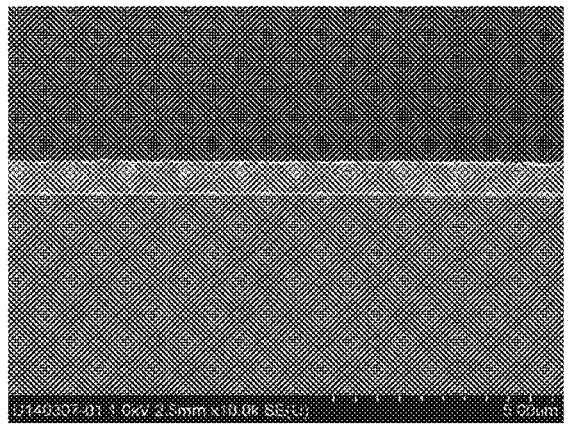
FIGS. 13A and 13B illustrate a cross-sectional SEM photo of the titanium oxide containing layer of Example 21.
Figure 13B:
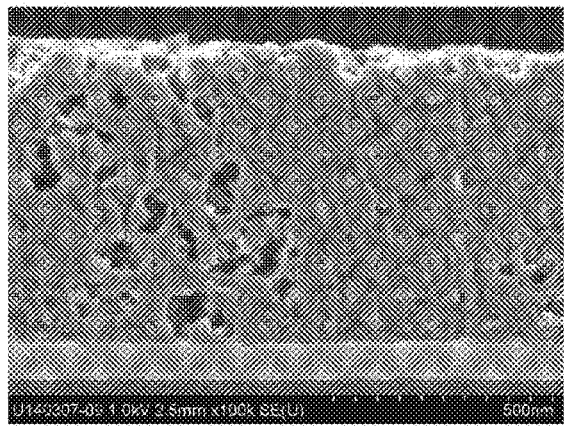

FIG. 13 illustrates a cross-sectional SEM photo of the titanium oxide containing layer of Example 21. FIG. 13B is a magnified photo of a part of FIG. 13A. As illustrated in FIGS. 13A and 13B, it was confirmed that the dielectric and the titanium oxide particles were dispersed tidily (i.e., substantially uniformly) in the titanium oxide containing layer.

<AC Impedance Measurement>

Figure 14A:
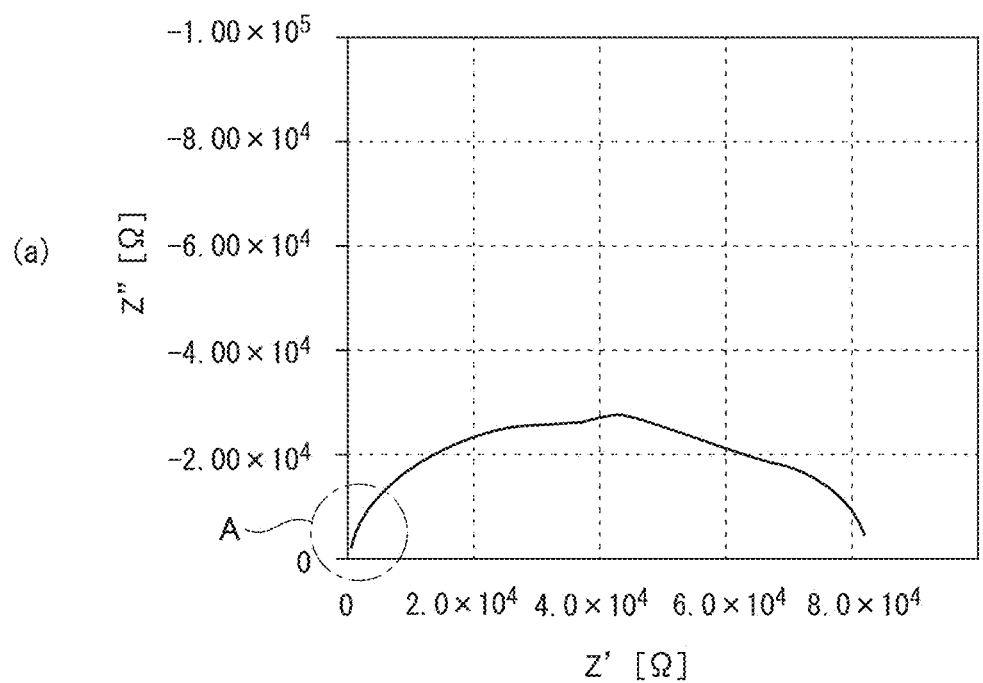
FIGS. 14A and 14B illustrate the measurement result of AC impedance for the devices of Example 31 and Comparative Example 7.
Figure 14B:
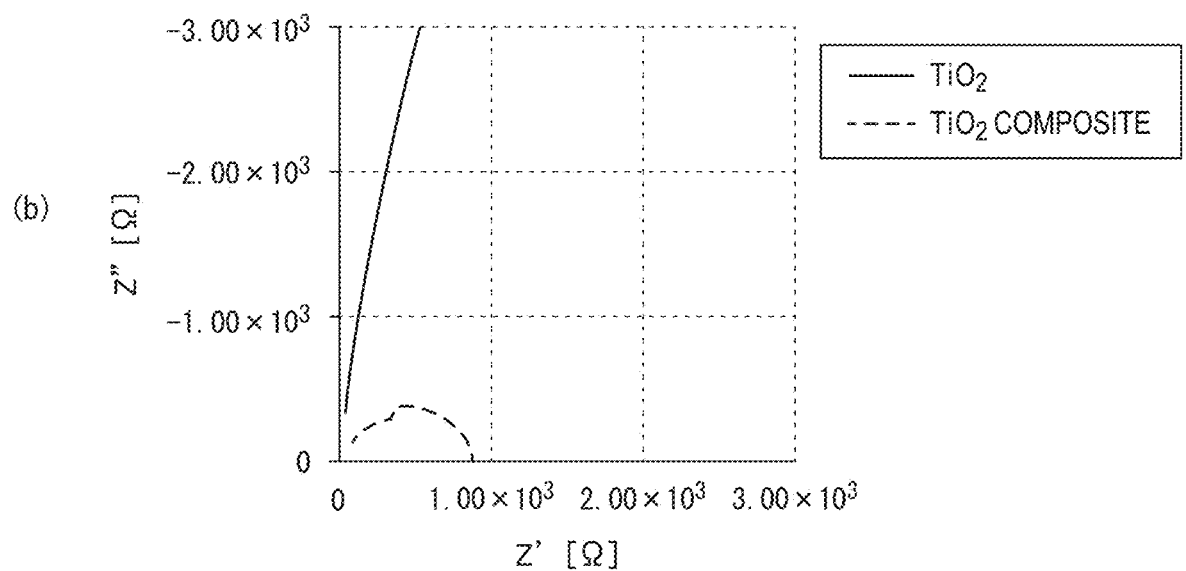
Figure 15:
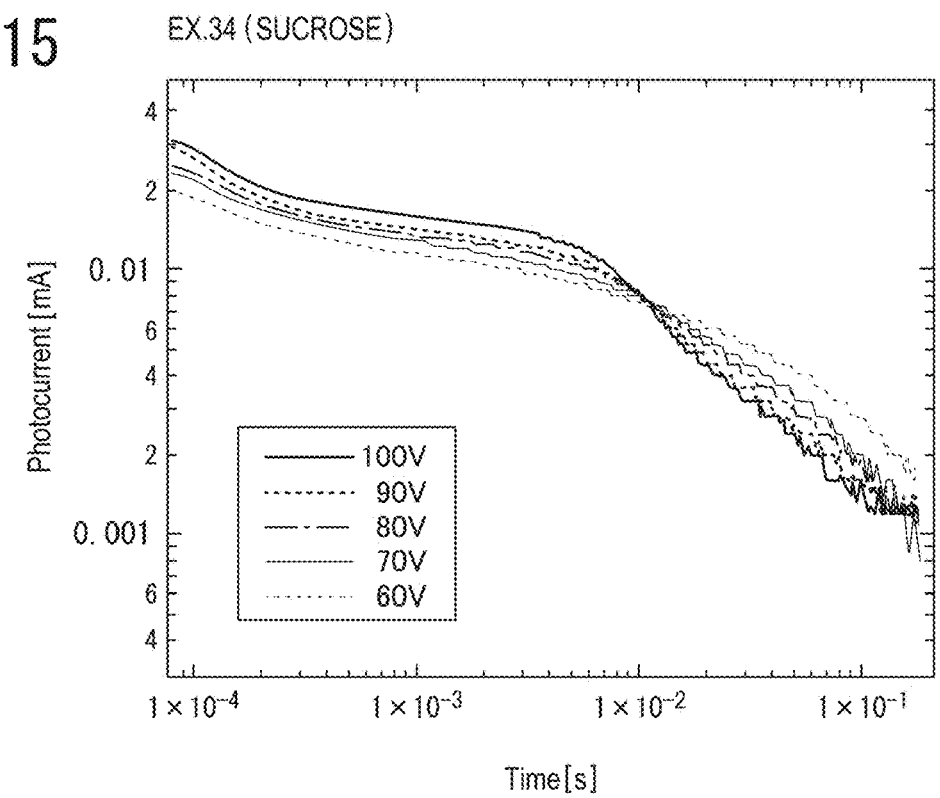
FIG. 15 illustrates the measurement of traveling time (Tr) using the device of Example 34.
Figure 16:
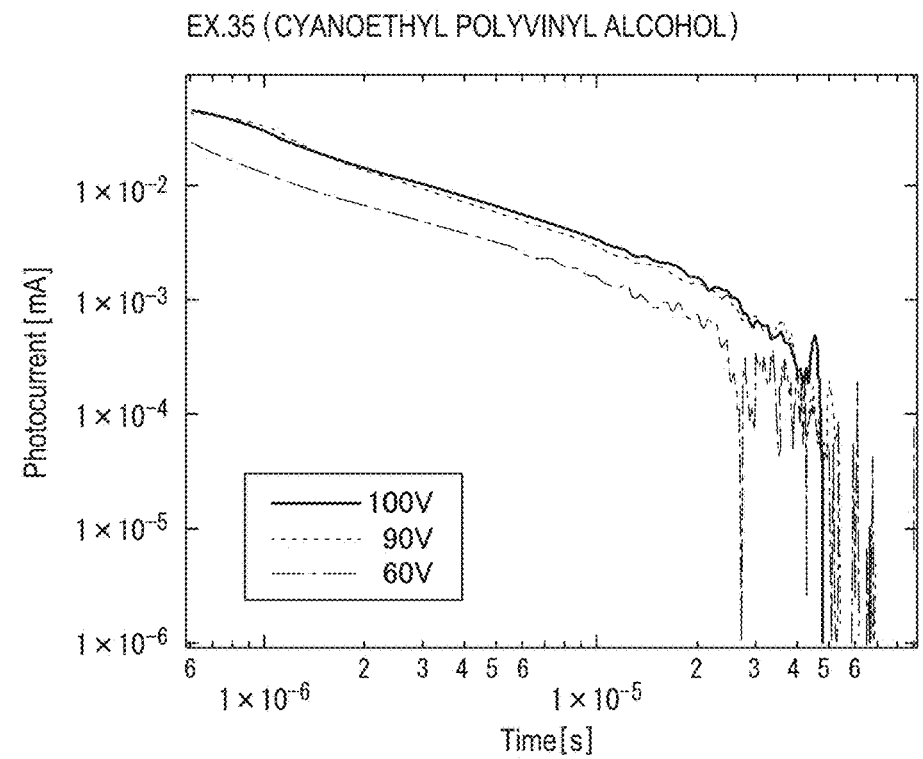
FIG. 16 illustrates the measurement of traveling time (Tr) using the device of Example 35.
Figure 17:
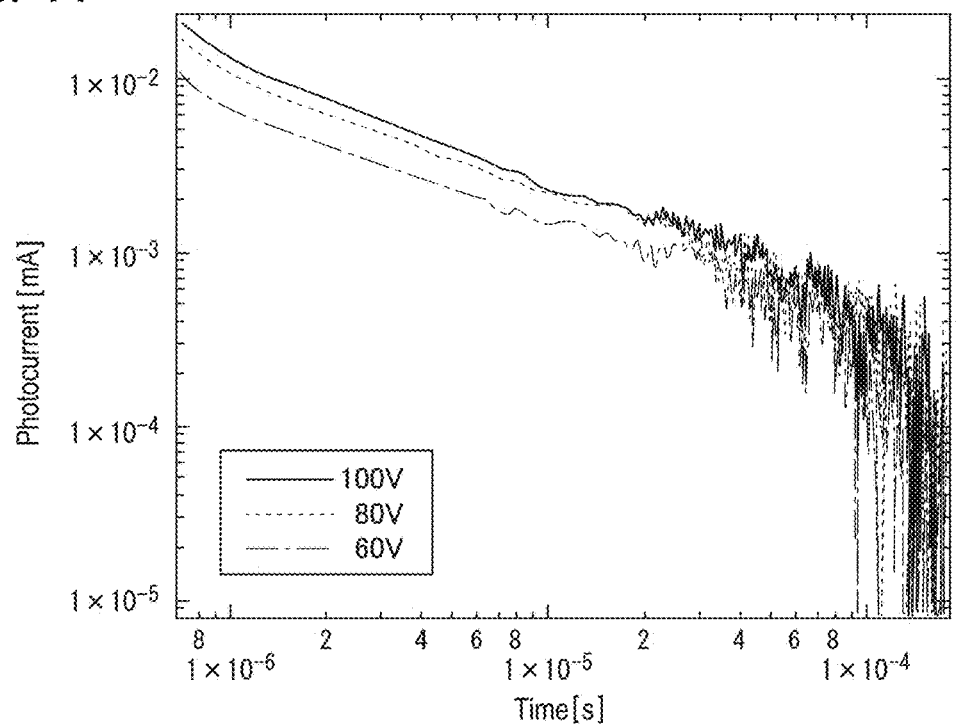
FIG. 17 illustrates the measurement of traveling time (Tr) using the device of Example 36.
Figure 18:
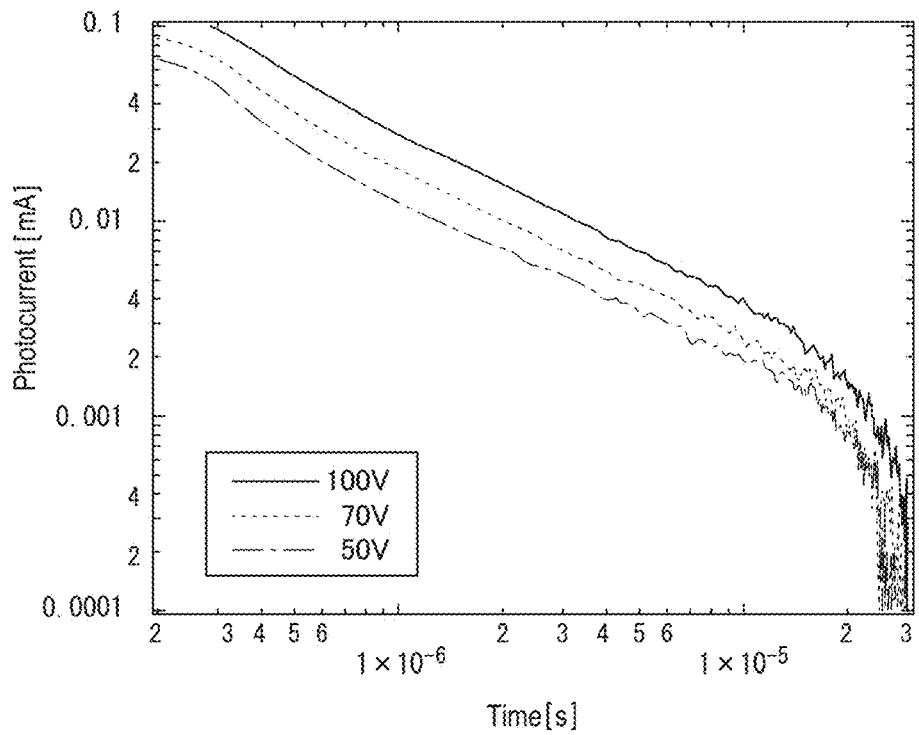
FIG. 18 illustrates the measurement of traveling time (Tr) using the device of Example 37.
Figure 19:
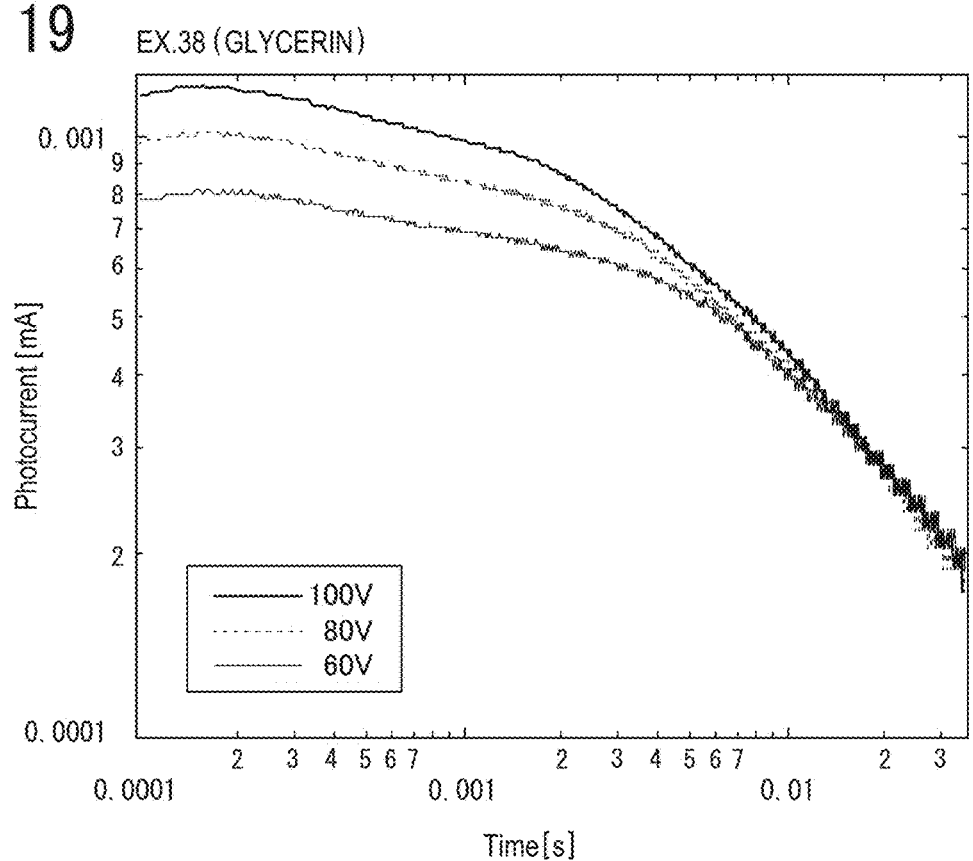
FIG. 19 illustrates the measurement of traveling time (Tr) using the device of Example 38.
Figure 20:
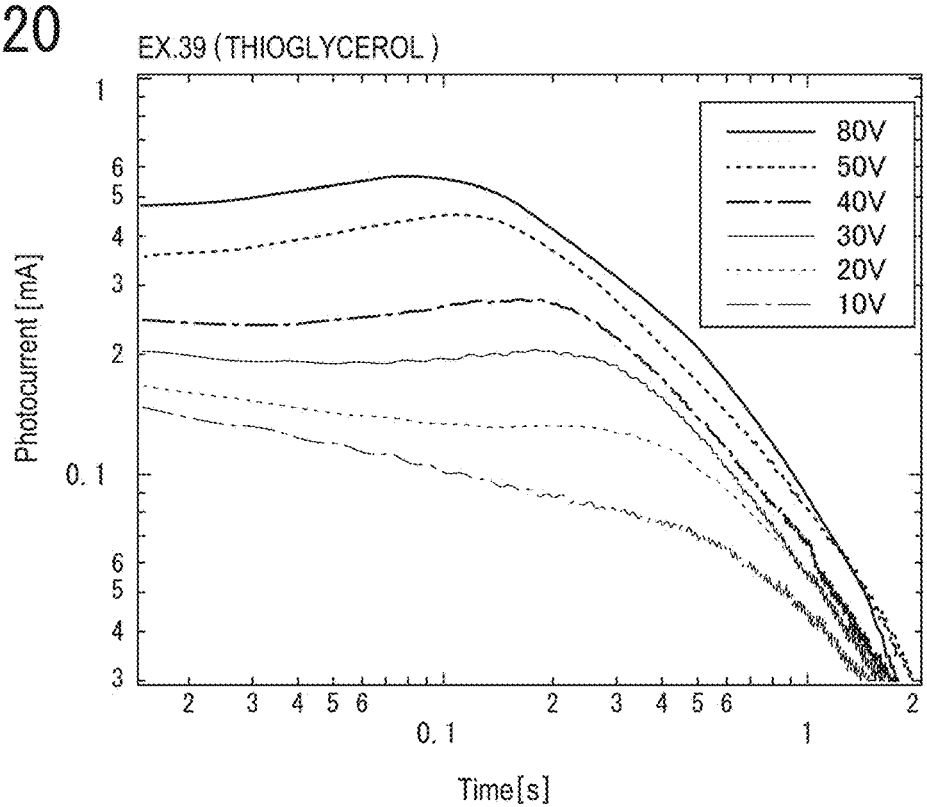
FIG. 20 illustrates the measurement of traveling time (Tr) using the device of Example 39.

The device of Example 31 and the device of Comparative Example 7 were pinched with the jig of FIG. 7, and AC impedance thereof was measured at the voltage of 1 V while irradiating them with light (1SUN). FIG. 14 illustrates cole-cole plot. FIG. 14B illustrates a part (part A) of FIG. 14A that is enlarged. In FIGS. 14A and 14B, the horizontal axis represents the impedance (Z') of real number and the vertical axis represents the impedance (Z") of imaginary number. It was found from the result of FIG. 14 that, while the device of Example 31 ($TiO_2$ composite) had resistance of $8.9 \times 10^2 \Omega$, the device of Comparative Example 7 ($TiO_2$) had resistance of $8.2 \times 10^4 \Omega$. It was found that the composite layer containing the dielectric decreased resistance as compared with a titanium oxide layer.

<Simulation>

Using titanium oxide as semiconductor, analysis was made by simulation of an electron state when the dielectric constant of surrounding dielectric is changed. The analysis was made using a cluster model, and molecular orbital was calculated using Gaussian09 under the presence of solvent having various values of dielectric constant. For preparation of a cluster model for titanium oxide, data on anatase crystal of a CIF (Crystallographic Interchange FILE) form was used, and a cluster model including three anatase unit lattices in a-axis direction, three unit lattices in b-axis direction and one unit lattice in c-axis direction was used for the calculation. Electron states under the presence of solvent having various values of dielectric constant were examined by PCM (polarizable continuum models) with designated various types of solvent and by single point energy calculation using a RHF/3-21G method. For these results of calculation, density of states (DOS) spectrum was calculated by Mulliken density analysis.

FIG. 23 and FIG. 24 illustrate the result. FIG. 23A is a graph illustrating the density of states when dielectric having relative permittivity of 1 is present around titanium oxides, where the horizontal axis represents energy (eV), and the vertical axis represents the density of states (DOS). FIG. 23B illustrates the state of HOMO in titanium oxide crystals under the environment having relative permittivity of 1, and FIG. 23C illustrates the state of LUMO in titanium oxide crystals under the environment having relative permittivity of 1. FIG. 24A is a graph illustrating the density of states when dielectric having relative permittivity of 25.6 is present around titanium oxides, where the horizontal axis represents energy (eV), and the vertical axis represents the density of states. FIG. 24B illustrates the state of HOMO in titanium oxide crystals under the environment having relative permittivity of 25.6, and FIG. 24C illustrates the state of LUMO in titanium oxide crystals under the environment having relative permittivity of 25.6.

Figure 25:
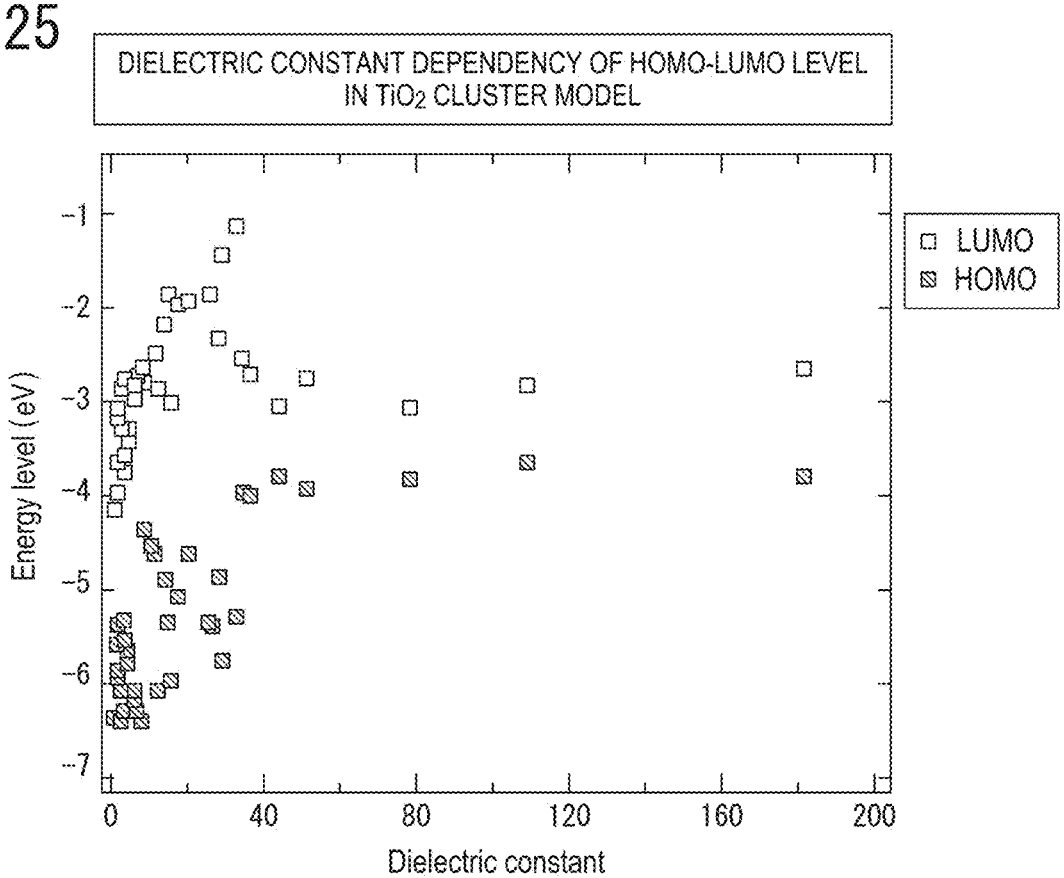
FIG. 25 illustrates the dielectric constant dependency of energy level of HOMO-LUMO.

FIG. 25 is a graph illustrating the energy level of HOMO-LUMO versus dielectric constant. In FIG. 25, the horizontal axis represents relative permittivity and the vertical axis represents energy level. While the energy level of LUMO is discrete in FIG. 23A, the energy level of LUMO is concentrated in FIG. 24A. This means that electrons easily move in the case of the dielectric having relative permittivity of 25.6. It was further found from FIG. 25 that the band gap becomes wider when the relative permittivity is 20 to 30, indicating the energy level closer to titanium oxide and a stable state.

<ESR Measurement>

ESR was measured using E-500 (produced by Buruker Corporation). The temperature for measurement was 108K for silicon and 100K for titanium oxides.

Figure 26:
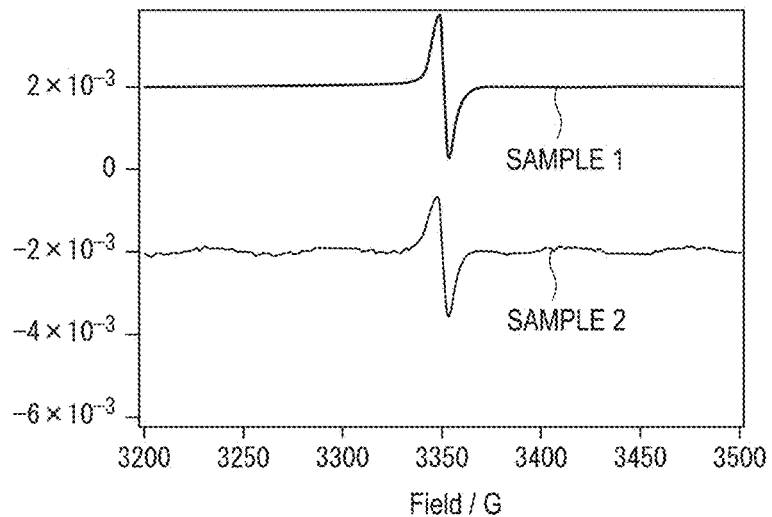
FIG. 26 illustrates the ESR measurement result of Samples 1 and 2.

The following describes a silicon-based sample. Silicon particles were prepared by pulverizing a p-type silicon wafer (3 Ω/cm) in ethanol solvent in a mortar. The thus prepared liquid was stirred, and was filtered with a nylon mesh with openings of 37 μm while removing large particles sank early, whereby silicon particles (residue after filtering) of 37 μm or more and 150 μm or less were obtained. These silicon particles were heated at 150° C. for 2 minutes to remove ethanol. This was Sample 1. Next, these silicon particles were mixed with glycerin/ethanol mixture solution (weight ratio 1/4). Next, the liquid with silicon particles mixed was dried at 150° C. for 2 minutes to vaporize ethanol, whereby mixture of silicon and glycerin (dielectric) was prepared. This was Sample 2. FIG. 26 illustrates the ESR result of Sample 1 and Sample 2. In FIG. 26, the horizontal axis represents the intensity (G) of electromagnetic waves, and the vertical axis represents the signal intensity.

The measurement result of FIG. 26 was converted with the amount of the sample measured, from which the amount of silicon radicals was calculated from the double integral of the peak in FIG. 26. It was confirmed from the result of this calculation that, assuming that the amount of radicals in Sample 1 is 1, the amount of radicals in Sample 2 is 0.86, and so the dielectric mixed leads to a decrease in the amount of defects.

Figure 27:
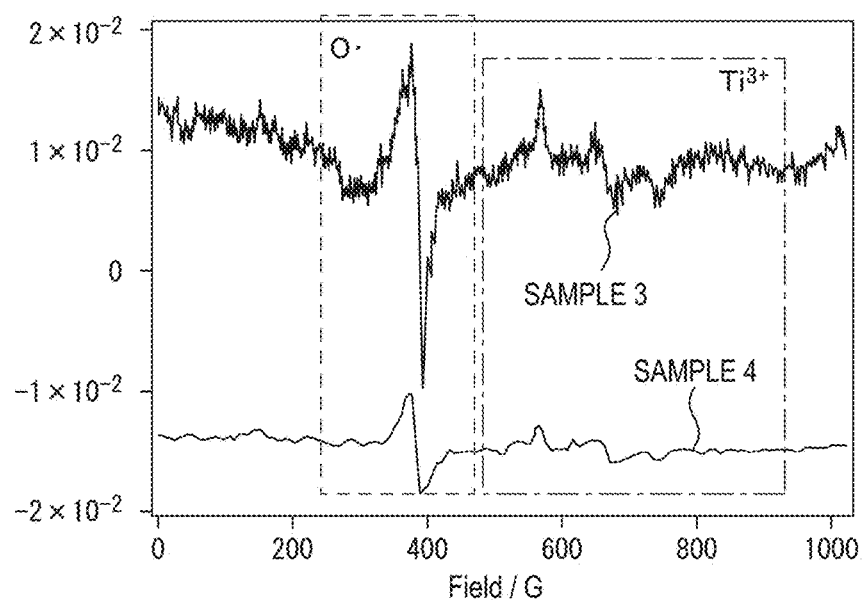
FIG. 27 illustrates the ESR measurement result of Samples 3 and 4.

The following describes a titanium oxide-based sample. Titanium oxide (AMT400, produced by Tayca Corporation) was dispersed in 2methoxyethanol, and a film was formed on a quartz substrate by casting. This was Sample 3. Next, cyanoethyl saccharose solution (dielectric) was dissolved in 2methoxyethanol to prepare solution of 20 mass %, which was mixed with 2methoxyethanol of titanium oxide (the mixing ratio of cyanoethyl saccharose and titanium oxide was 49:51 in weight ratio). A film was formed using this mixture liquid on a quartz substrate by casting. This was Sample 4. FIG. 27 illustrates the ESR result of Sample 3 and Sample 4. In FIG. 27, the horizontal axis represents the intensity (G) of electromagnetic waves, and the vertical axis represents the signal intensity.

The measurement result of FIG. 27 was converted with the amount of the sample measured, from which the amount of titanium and oxygen radicals was calculated from the double integral of the peak in FIG. 27. It was confirmed from the result of this calculation that, assuming that the amount of radicals in Sample 3 is 1, the amount of radicals in Sample 4 is 0.35 for Ti' and is 0.34 for oxygen, and so the dielectric mixed leads to a decrease in the amount of defects to about 30%. It was found from this result that this technique was effective for semiconductor devices to reduce defects of semiconductor particles. Reducing of defects is a technical challenge common to all of the devices including transistors, solar cell devices and diode devices, and it was demonstrated that the present technique can reduce such defects.

<Current-Voltage Characteristics in the Dark>

Figure 28A:
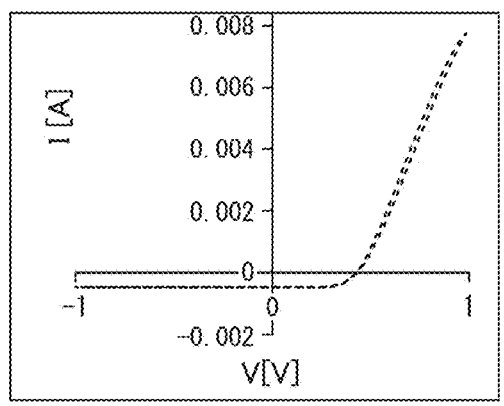
FIGS. 28A and 28B illustrate the measurement result of current-voltage characteristics.
Figure 28B:
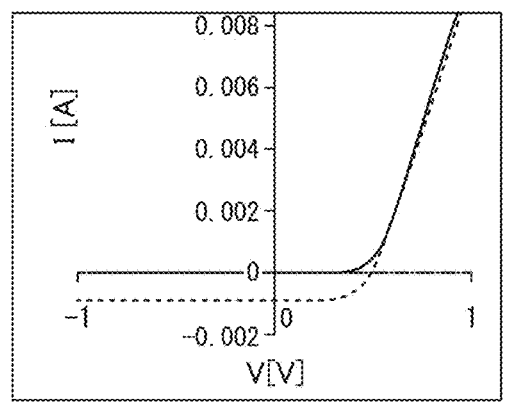

Using the simplified solar cell evaluation device, current-voltage characteristics before light irradiation were evaluated. FIG. 28 illustrates the measurement result. FIG. 28A illustrates the measurement result of the device made of 1) silicon/titanium oxide. FIG. 28B illustrates the measurement result of the device made of 2) silicon/titanium oxide+ dielectric (Example 6). The device 1) was manufactured by the same method other than that titanium oxide dispersion liquid (AMT600, produced by Tayca Corporation) was used instead of the mixture solution E of Example 6.

Current-voltage characteristics of these solar cells were firstly measured (A) without light irradiation, followed by measurement of current-voltage characteristics (B) with light irradiation, and followed by current-voltage characteristics (C) without light irradiation. As a result, current did not flow in the device of 1) during (A) and (C) and current flowed during (B) only. On the contrary, current did not flow in the device of 2) during (A) and current flowed during (C). That is, current flowed during (B) only in the device 1), and current flowed during (B) and (C) in the device 2). This is a result suggesting that the composite including dielectric developed conductivity of the titanium oxide layer when it was irradiated with light once.

<FTIR (Fourier Transform Infrared Spectroscopy) Evaluation>

The composite film of titanium oxide and cyanoethyl saccharose was measured using FT/IR-4200 (produced by JASCO Corporation) for evaluation as to whether the organic substance (cyanoethyl saccharose) was decomposed or not. The film was manufactured similarly to Example 5. Measurement was performed for three points before irradiation with pseudo solar light, after irradiation for 30 minutes, and after irradiation for 90 minutes. As a result, it was found that no change occurred in the peak on the IR, resulting from an organic substrate after irradiation with light for 30 minutes and 90 minutes. Therefore, it was confirmed that the organic substance was not decomposed by light.

<Others>

The present invention is not limited to the first embodiment and the second embodiment, and Examples 1 to 40 as described above. Modifications of designs or the like may be added to the first embodiment and the second embodiment, and Examples 1 to 40 based on the knowledge of those skilled in the art, or the first embodiment and the second embodiment, and Examples 1 to 40 may be combined arbitrarily. The present invention covers an embodiment including such modifications as well.

INDUSTRIAL APPLICABILITY

The present invention can provide a semiconductor device that can be manufactured at low cost by printing, for example, and that has improved mobility. The present invention can provide a solar cell including a semiconductor layer that is favorably used for a solar cell, and so having excellent power generation efficiency. The present invention further can provide a solar cell having excellent power generation efficiency and at low cost.

REFERENCE SIGNS LIST 5 metal jig
2 quartz plate
3 silicon rubber sheet
9 screw
4, 100, 200, 300 solar cell
11 DC power supply
12 digital oscilloscope
13 voltage amplifier
51, 56 metal oxide particles
52 compound having relative permittivity of 2 or more (dielectric)
110, 210, 310 substrate
120, 220, 320 anode layer
130, 230 second semiconductor layer
140, 240 first semiconductor layer
150, 250, 350 cathode layer
260 junction interface layer
330 p-type semiconductor layer
340 n-type semiconductor layer
400 semiconductor device
410 substrate
420 gate electrode
430 insulator layer
440 source electrode
450 drain electrode
460 semiconductor layer

The invention claimed is:

1. A solar cell, comprising at least a first semiconductor layer and a second semiconductor layer, wherein
   the first semiconductor layer includes metal oxide particles of 1 nm or more and 500 nm or less in average particle size and a compound having relative permittivity of 5 or more, and
   the compound includes at least one of a fluorine resin organic compound and a cyano group contained organic compound.

2. A solar cell, comprising at least a first semiconductor layer and a second semiconductor layer, wherein
   the first semiconductor layer includes metal oxide particles of 1 nm or more and 500 nm or less in average particle size and an organic compound having relative permittivity of 5 or more and 1,000 or less,
   content of the organic compound in the first semiconductor layer is 10 mass % or more and 90 mass % or less, and
   wherein the compound includes at least one of a fluorine resin organic compound and a cyano group contained organic compound.

3. A solar cell, comprising at least a first semiconductor layer and a second semiconductor layer, wherein
   the first semiconductor layer includes metal oxide particles of 1 nm or more and 500 nm or less in average particle size and an organic compound having relative permittivity of 10 or more and 200 or less,
   content of the organic compound in the first semiconductor layer is 20 mass % or more and 70 mass % or less, and
   wherein the compound includes at least one of a fluorine resin organic compound and a cyano group contained organic compound.

4. The solar cell according to claim 1, wherein the metal oxide particles have a particle size of 1 nm or more and 100 nm or less.

5. The solar cell according to claim 1, wherein the second semiconductor layer includes silicon.

6. The solar cell according to claim 1, wherein the metal oxide particles include titanium oxide particles or zinc oxide particles.

7. The solar cell according to claim 1, further comprising a junction interface layer that is located between the first semiconductor layer and the second semiconductor layer, wherein the junction interface layer includes a compound having relative permittivity of 2 or more.

8. The solar cell according to claim 1, wherein
   the metal oxide particles include titanium oxide particles, and in an X-ray diffraction spectrum of the titanium oxide particles, a half width is 0.2 degrees or more and 5.0 degrees or less, the half width being obtained from a diffraction peak that appears at a diffraction angle 2θ of 24 degrees or more and 26 degrees or less when the titanium oxide particles are anatase-type and from a diffraction peak that appears at a diffraction angle 2θ of 26 degrees or more and 28 degrees or less when the titanium oxide particles are rutile-type.

9. The solar cell according to claim 8, wherein the titanium oxide particles are anatase type.

10. The solar cell according to claim 1, wherein the second semiconductor layer includes a silicon oxide film of 1 nm or more in thickness on a surface opposite to a surface facing the first semiconductor layer.

11. A method for manufacturing the solar cell according to claim 1, comprising:
preparing application liquid including inorganic particles, a compound having relative permittivity of 2 or more, and one type or more of dispersant, wherein the inorganic particles include metal oxide particles or silicon particles, content of the inorganic particles in the application liquid is 0.1 mass % or more and 49.9 mass % or less, content of the compound in the application liquid is 0.1 mass % or more and 49.9 mass % or less, and content of the dispersant in the application liquid is 0.2 mass % or more and 99.8 mass % or less;
applying the prepared application liquid on a semiconductor layer or a substrate having an electrode; and
drying the applied application liquid and removing at least a part of the dispersant from the application liquid,
wherein the application liquid is dried at a temperature of 20° C. or more and 150° or less.

12. The solar cell according to claim 1, wherein the first semiconductor layer includes the compound having relative permittivity of 5 or more and 200 or less.

13. The solar cell according to claim 12, wherein the first semiconductor layer includes the compound having relative permittivity of 5 or more and 100 or less.

14. The solar cell according to claim 2, wherein the first semiconductor layer includes the compound having relative permittivity of 5 or more and 200 or less.

15. The solar cell according to claim 14, wherein the first semiconductor layer includes the compound having relative permittivity of 5 or more and 100 or less.

16. The solar cell according to claim 1, wherein the first semiconductor layer includes the compound having relative permittivity of 10 or more and 200 or less.

17. The solar cell according to claim 16, wherein the first semiconductor layer includes the compound having relative permittivity of 10 or more and 100 or less.

18. The solar cell according to claim 2, wherein the first semiconductor layer includes the compound having relative permittivity of 10 or more and 200 or less.

19. The solar cell according to claim 18, wherein the first semiconductor layer includes the compound having relative permittivity of 10 or more and 100 or less.

20. The solar cell according to claim 3, wherein the first semiconductor layer includes the compound having relative permittivity of 10 or more and 100 or less.

* * * * *